US012649668B2

(12) United States Patent
Jo et al.

(10) Patent No.: US 12,649,668 B2
(45) Date of Patent: Jun. 9, 2026

(54) METAL OXIDE NANOPARTICLE, NANOCOMPOSITE INCLUDING THE METAL OXIDE NANOPARTICLE, AND INK COMPOSITION, LIGHT-EMITTING DEVICE, ELECTRONIC APPARATUS, AND ELECTRONIC EQUIPMENT INCLUDING THE NANOCOMPOSITE

(71) Applicant: Samsung Display Co., Ltd., Yongin-si (KR)

(72) Inventors: Jungho Jo, Yongin-si (KR); Yunku Jung, Yongin-si (KR); Chulsoon Park, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 385 days.

(21) Appl. No.: 18/512,784

(22) Filed: Nov. 17, 2023

(65) Prior Publication Data

US 2024/0317599 A1 Sep. 26, 2024

(30) Foreign Application Priority Data

Mar. 24, 2023 (KR) ........................ 10-2023-0039141
May 4, 2023 (KR) ........................ 10-2023-0058495

(51) Int. Cl.
*C01G 9/02* (2006.01)
*B82Y 20/00* (2011.01)
(Continued)

(52) U.S. Cl.
CPC ................ *C01G 9/02* (2013.01); *B82Y 20/00* (2013.01); *B82Y 30/00* (2013.01); *C09D 11/30* (2013.01);
(Continued)

(58) Field of Classification Search
CPC ........ C01G 9/02; H10K 50/115; H10K 50/15; H10K 50/16; H10K 85/381; C09K 11/54;
(Continued)

(56) References Cited

U.S. PATENT DOCUMENTS 10,311,994 B2 * 6/2019 He ....................... H10K 85/636
10,651,339 B2 * 5/2020 Kim ..................... H10H 20/822
(Continued)

FOREIGN PATENT DOCUMENTS

CN 110838560 B 6/2021
KR 10-2016-0033520 A 3/2016
(Continued)

OTHER PUBLICATIONS

Taehyung Kim et al., "Efficient and stable blue quantum dot light-emitting diode", Nature, Oct. 14, 2020, pp. 385-389, vol. 586, Springer Nature.

(Continued)

*Primary Examiner* — Bac H Au
(74) *Attorney, Agent, or Firm* — Womble Bond Dickinson (US) LLP

(57) ABSTRACT

A nanocomposite including a metal oxide nanoparticle and a hydrophilic ligand is provided. The nanocomposite is a component of an ink composition, a light-emitting device, an electronic apparatus, and electronic equipment.

20 Claims, 7 Drawing Sheets

(51) Int. Cl.

| | |
|---|---|
| ***B82Y 30/00*** | (2011.01) |
| ***C09D 11/30*** | (2014.01) |
| ***C09K 11/54*** | (2006.01) |
| ***H10K 50/115*** | (2023.01) |
| ***H10K 50/15*** | (2023.01) |
| ***H10K 50/16*** | (2023.01) |
| ***H10K 85/30*** | (2023.01) |

(52) U.S. Cl.
CPC ............ *C09K 11/54* (2013.01); *H10K 50/115* (2023.02); *H10K 50/15* (2023.02); *H10K 50/16* (2023.02); *H10K 85/381* (2023.02)

(58) Field of Classification Search
CPC ......... C09K 11/55; C09K 11/57; C09K 11/58; C09K 11/60; C09K 11/64; C09K 11/68
See application file for complete search history.

(56) References Cited

U.S. PATENT DOCUMENTS

| | | | | |
|---|---|---|---|---|
| 10,995,267 | B2 * | 5/2021 | Bootman | C09K 11/883 |
| 11,239,438 | B2 * | 2/2022 | Jang | H10K 59/38 |
| 12,509,627 | B2 * | 12/2025 | Jung | C09K 11/025 |
| 2020/0308017 | A1 * | 10/2020 | Cheng | C01G 23/00 |
| 2020/0321490 | A1 | 10/2020 | Yang et al. | |
| 2021/0066544 | A1 * | 3/2021 | Won | H10H 20/822 |
| 2021/0066634 | A1 | 3/2021 | Park et al. | |
| 2021/0098202 | A1 * | 4/2021 | Noh | H10K 71/15 |
| 2022/0006036 | A1 | 1/2022 | Seo et al. | |
| 2022/0204837 | A1 * | 6/2022 | Jung | C09K 11/025 |
| 2024/0224572 | A1 * | 7/2024 | Utsumi | C09K 11/54 |

FOREIGN PATENT DOCUMENTS

| | | | |
|---|---|---|---|
| KR | 10-2020-0118728 | A | 10/2020 |
| KR | 10-2021-0027210 | A | 3/2021 |
| KR | 10-2022-0003356 | A | 1/2022 |

OTHER PUBLICATIONS

Kyeongchan Noh et al., "Effect of ethanolamine passivation of ZnO nanoparticles in quantum dot light emitting diode structure", *Current Applied Physics*, May 31, 2019, pp. 998-1005, vol. 19, Elsevier B.V.

M. Soylu et al., "Study of optical and electrical assessments of the quaternary MgZnSnO system containing different Mg content", *Journal of Material Science: Mater Electron*, Jul. 15, 2014, pp. 4235-4245, vol. 25, Springer Nature.

Min Gao, et al., "Alleviating Electron Over-Injection for Efficient Dadmium-Free Quantum Dot Light-Emitting Diodes toward Deep-Blue Emission", *ACS Photonics*, https://doi.org/10.1021/acsphotonics.2c00155, 9 pages.

* cited by examiner

Fig. 1 Hole effective mass and relative BPE (=[BPE−$E_{VBM}$]/$E_g$) of archetypal p-type and n-type oxides. The electrical properties of $Ba_2BiTaO_6$[18] and $SnNb_2O_6$ [22] were reported recently.

METAL OXIDE NANOPARTICLE, NANOCOMPOSITE INCLUDING THE METAL OXIDE NANOPARTICLE, AND INK COMPOSITION, LIGHT-EMITTING DEVICE, ELECTRONIC APPARATUS, AND ELECTRONIC EQUIPMENT INCLUDING THE NANOCOMPOSITE

CROSS-REFERENCE TO RELATED APPLICATIONS

This application claims priority to and the benefit of Korean Patent Application Nos. 10-2023-0039141, filed on Mar. 24, 2023, and 10-2023-0058495, filed on May 4, 2023, in the Korean Intellectual Property Office, the content of each of which is incorporated by reference herein in its entirety.

BACKGROUND

1. Field

One or more aspects of embodiments the present disclosure relate to a metal oxide nanoparticle, a nanocomposite including the metal oxide nanoparticle, and an ink composition, a light-emitting device, an electronic apparatus, and electronic equipment that include the nanocomposite.

2. Description of the Related Art

From among light-emitting devices, self-emissive devices have relatively wide viewing angles, relatively high contrast ratios, relatively short response times, and excellent or suitable characteristics in terms of luminance, driving voltage, and response speed.

In a light-emitting device, a first electrode is arranged on a substrate, and a hole transport region, an emission layer, an electron transport region, and a second electrode are sequentially arranged on the first electrode. Holes provided from the first electrode move toward the emission layer through the hole transport region, and electrons provided from the second electrode move toward the emission layer through the electron transport region. Carriers, such as the holes and electrons, recombine in the emission layer to produce excitons. These excitons transition (i.e., relax) from an excited state to a ground state to thereby generate light.

SUMMARY

One or more aspects of embodiments of the present disclosure are directed toward a metal oxide nanoparticle, a nanocomposite including the metal oxide nanoparticle, and an ink composition, a light-emitting device, an electronic apparatus, and electronic equipment that include the nanocomposite.

Additional aspects will be set forth in part in the description which follows and, in part, will be apparent from the description, or may be learned by practice of the presented embodiments of the disclosure.

According to one or more embodiments, provided is a metal oxide nanoparticle represented by Formula 1:

$$(Zn)_x(M_1)_y(M_2)_xO \qquad \text{Formula 1}$$

wherein, in Formula 1, $M_1$ may be Li, Be, Na, Mg, Al, K, Ca, Ti, V, Cr, Mn, Fe, Co, Ni, Cu, Ga, Ge, Rb, Sr, Zr, Nb, Mo, Ru, Rh, Pd, Ag, In, Sn, Sb, Ba, W, Y, or any combination thereof, $M_2$ may be at least one selected from among metal elements of which an $M_2$-O oxide has p-type or kind characteristics (e.g., p-conductive characteristics) and in which a bond dissociation energy value of $M_2$-O is at least 250 KJ/mol, $M_1$ and $M_2$ may be different from each other, the sum of x, y, and z may be 1, x, y, and z may not each be 0, and x may be greater than or equal to z.

According to one or more embodiments, a nanocomposite includes the metal oxide nanoparticle, and at least one ligand bonded to a surface of the metal oxide nanoparticle.

According to one or more embodiments, an ink composition includes the nanocomposite, and at least one ink solvent.

According to one or more embodiments, a method of preparing ink composition includes synthesizing the metal oxide nanoparticle with or by utilizing sol-gel processing, precipitating and separating the metal oxide nanoparticle, mixing the metal oxide nanoparticle with a first solvent including at least one ligand, synthesizing the nanocomposite by reacting the metal oxide nanoparticle with the at least one ligand, precipitating and separating the nanocomposite by mixing a solution including the nanocomposite with a second solvent that is a non-polar solvent, and preparing the ink composition by mixing the nanocomposite with the at least one ink solvent.

According to one or more embodiments, a light-emitting device includes a first electrode, a second electrode facing the first electrode, and an interlayer arranged between the first electrode and the second electrode and including an emission layer, wherein the interlayer may further include an electron transport region arranged between the emission layer and the second electrode, and the electron transport region may include the nanocomposite.

According to one or more embodiments, a method of manufacturing the light-emitting device includes preparing an ink composition including the nanocomposite, and at least one ink solvent, and forming the electron transport region including the nanocomposite by inkjet printing the ink composition.

According to one or more embodiments, an electronic apparatus includes the light-emitting device.

According to one or more embodiments, electronic equipment includes the light-emitting device.

BRIEF DESCRIPTION OF THE DRAWINGS

The accompanying drawings are included to provide a further understanding of the above and other aspects, features, and advantages of certain embodiments of the present disclosure are incorporated in and constitute a part of this specification. The drawings illustrate example embodiments and, together with the following description taken in conjunction with the accompanying drawings, serve to make the principles of the present disclosure more apparent. In the drawings.

DETAILED DESCRIPTION

Figure 1:
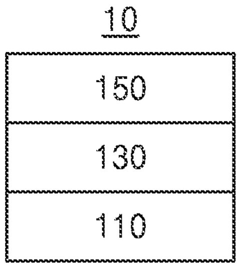
FIG. 1 is a schematic view of a structure of a light-emitting device according to one or more embodiments of the present disclosure.

Reference will now be made in more detail to embodiments, examples of which are illustrated in the accompanying drawings, wherein like reference numerals refer to like elements throughout, and duplicative descriptions thereof may not be provided. In this regard, the present embodiments may have different forms and should not be construed as being limited to the descriptions set forth herein. Accordingly, the embodiments are merely described, by referring to the drawings, to explain aspects of the present description.

As utilized herein, the term "and/or" includes any and all combinations of one or more of the associated listed items. Expressions such as "at least one of," "one of," and "selected from," when preceding a list of elements, modify the entire list of elements and do not modify the individual elements of the list. For example, throughout the disclosure, the expression "at least one of a, b or c" indicates only a, only b, only c, both (e.g., simultaneously) a and b, both (e.g., simultaneously) a and c, both (e.g., simultaneously) b and c, all of a, b, and c, or variations thereof.

The terminology used herein is for the purpose of describing embodiments and is not intended to limit the embodiments described herein. Unless otherwise defined, all chemical names, technical and scientific terms, and terms defined in common dictionaries should be interpreted as having meanings consistent with the context of the related art, and should not be interpreted in an ideal or overly formal sense. It will be understood that, although the terms first, second, etc. may be used herein to describe various elements, these elements should not be limited by these terms. These terms are only used to distinguish one element from another element. Thus, a first element could be termed a second element without departing from the teachings of the present disclosure. Similarly, a second element could be termed a first element.

As used herein, singular forms such as "a," "an," and "the" are intended to include the plural forms as well, unless the context clearly indicates otherwise.

It will be further understood that the terms "comprise," "comprises," "comprising," "has," "have," "having," "include," "includes," and/or "including," when used in this specification, specify the presence of stated features, steps, operations, elements, and/or components, but do not preclude the presence or addition of one or more other features, steps, operations, elements, components, and/or groups thereof.

As used herein, the terms "use," "using," and "used" may be considered synonymous with the terms "utilize," "utilizing," and "utilized," respectively.

As used herein, the term "and/or" includes any, and all, combination(s) of one or more of the associated listed items.

The term "may" will be understood to refer to "one or more embodiments of the present disclosure," some of which include the described element and some of which exclude that element and/or include an alternate element. Similarly, alternative language such as "or" refers to "one or more embodiments of the present disclosure," each including a corresponding listed item.

It will be understood that when an element is referred to as being "on," "connected to," or "on" another element, it may be directly on, connected, or coupled to the other element or one or more intervening elements may also be present. When an element is referred to as being "directly on," "directly connected to," or "directly coupled to" another element, there are no intervening elements present.

Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

Unless otherwise defined, all terms (including technical and scientific terms) used herein have the same meaning as commonly understood by those of ordinary skill in the art to which the present disclosure pertains. It is also to be understood that terms defined in commonly used dictionaries should be interpreted as having meanings consistent with meanings in the context of the related art, unless expressly defined herein, and should not be interpreted in an ideal or overly formal sense.

In this context, "consisting essentially of" means that any additional components will not materially affect the chemical, physical, optical or electrical properties of the semiconductor film.

Further, in this specification, the phrase "on a plane," or "plan view," means viewing a target portion from the top, and the phrase "on a cross-section" means viewing a cross-section formed by vertically cutting a target portion from the side.

An aspect of the disclosure provides a metal oxide nanoparticle represented by Formula 1:

$$(Zn)_x(M_1)_y(M_2)_zO. \quad \text{Formula 1}$$

In Formula 1, $M_1$ may be Li, Be, Na, Mg, Al, K, Ca, Ti, V, Cr, Mn, Fe, Co, Ni, Cu, Ga, Ge, Rb, Sr, Zr, Nb, Mo, Ru, Rh, Pd, Ag, In, Sn, Sb, Ba, W, Y, or any combination thereof, $M_2$ may be at least one selected from among metal elements of which an $M_2$-O oxide has p-type or kind characteristics (e.g., p-conductive characteristics) and in which a bond dissociation energy value of $M_2$-O is at least 250 KJ/mol, $M_1$ and $M_2$ may be different from each other, the sum of x, y, and z may be 1, x, y, and z may not each be 0, and X may be greater than or equal to z.

Figure 7:
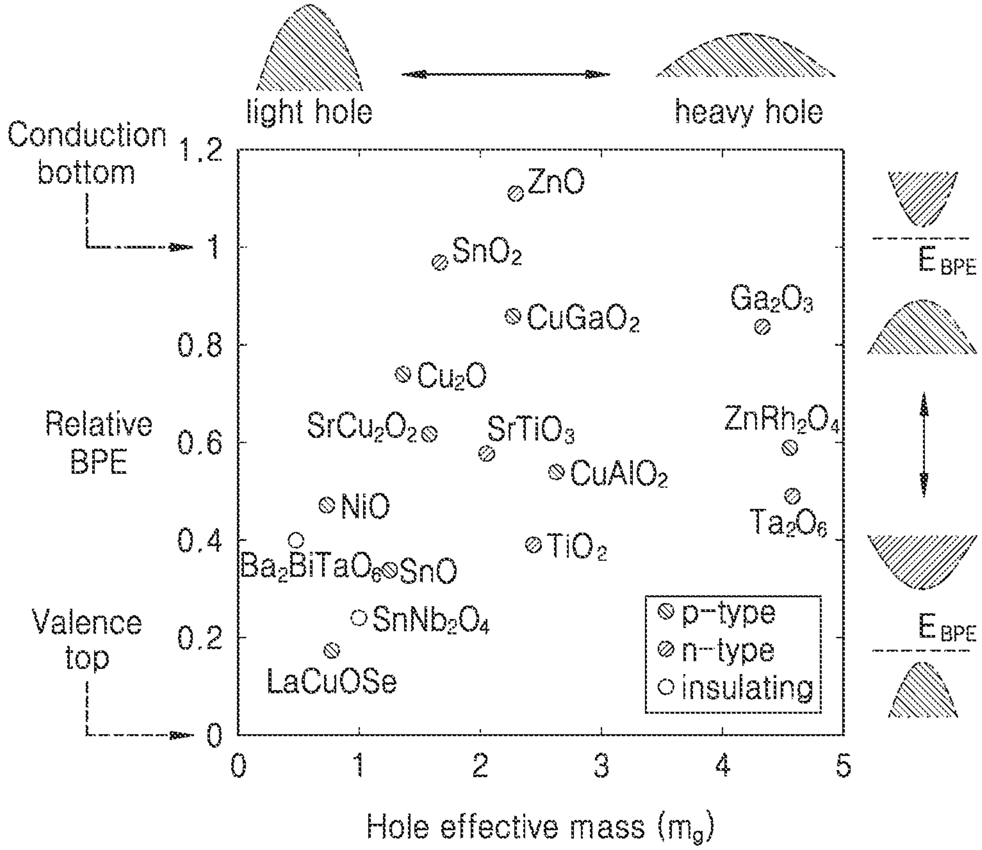
FIG. 7 is a diagram showing $M_2$-O oxides of certain metal elements having p-type (e.g., p-conductive) characteristics.

The term "metal element in which $M_2$-O oxide has p-type or kind characteristics" as utilized herein may refer to metal element $M_2$ having characteristics of suppressing electron injection with respect to "$M_2$-O oxide." For example, in the case of Sn, which is a tetravalent material, a $V_{Sn}$ site is created when Sn—O is intentionally formed, and when electrons are injected into Sn—O, the electrons are trapped by the $V_{Sn}$ site so that electron injection is suppressed or reduced. For example, Sn corresponds to a metal element in which Sn—O oxide has p-type or kind characteristics (e.g., p-conductive characteristics). Types of metal elements in which $M_2$-O oxide has p-type or kind characteristics (e.g., p-conductive characteristics) are shown in FIG. 7.

The term "bond dissociation energy" as utilized herein refers to the energy required for dissociation of chemical bonds through equilibrium decomposition. For example, bond energy of each of Zn—O, Sn—O, Cu—O, and Ni—O is shown in Table 1.

TABLE 1

| Bond | Bond dissociation energy (kJ/mol) |
|---|---|
| Zn—O | <250 |
| Sn—O | 528 |
| Cu—O | 343 |
| Ni—O | 392 |

In one or more embodiments, $M_1$ may be Mg, Ca, Zr, W, Li, Ti, Y, or Al.

In one or more embodiments, $M_1$ may be Mg.

In one or more embodiments, $M_2$ may be Sn, Cu, or Ni.

In one or more embodiments, $M_2$ may be Sn.

In one or more embodiments, the metal oxide nanoparticle may satisfy at least one of Conditions 1 to 3:

$$0.75 \le x \le 0.85 \quad \text{Condition 1}$$

$$0.10 \le y \le 0.20 \quad \text{Condition 2}$$

$$0.00 < z \le 0.10. \quad \text{Condition 3}$$

In one or more embodiments, the metal oxide nanoparticle may satisfy all of Conditions 1 to 3.

In one or more embodiments, the metal oxide nanoparticle may satisfy at least one of Conditions 1a to 3a:

$$0.80 \le x \le 0.83 \quad \text{Condition 1a}$$

$$0.14 \le y \le 0.17 \quad \text{Condition 2a}$$

$$0.01 \le z \le 0.04. \quad \text{Condition 3a}$$

In one or more embodiments, the metal oxide nanoparticle may satisfy all of Conditions 1a to 3a.

In one or more embodiments, the metal oxide nanoparticle may not have a core-shell structure. For example, the metal oxide nanoparticle has an alloy structure consisting of Zn, $M_1$, $M_2$, and O, and does not have a structure in which Zn, $M_1$ (or $M_2$), and O form a core and $M_2$ (or $M_1$) is bonded or distributed on the surface of the core.

Regarding the metal oxide nanoparticle, because $M_2$-O oxide has p-type or kind characteristics (e.g., p-conductive characteristics) and metal element $M_2$ having a bond dissociation energy value of $M_2$-O of at least 250 KJ/mol is utilized to form a quaternary metal oxide nanoparticle, defects in the crystal structure may be reduced. Thus, when the metal oxide nanoparticle is utilized in an electron transport layer, exciton quenching with an emission layer may be suppressed or reduced. As the exciton quenching is suppressed or reduced, a non-emission process occurring between the emission layer and an oxide nanoparticle layer may be suppressed or reduced so that a decrease in luminescence efficiency and heat generation may be suppressed or reduced, thereby greatly improving the lifespan of a device.

In some embodiments, because electron injection is suppressed or reduced due to the p-type or kind characteristics (e.g., p-conductive characteristics) of $M_2$ in the metal oxide nanoparticle, charge balance may be improved. Accordingly, when a light-emitting device is manufactured by utilizing the metal oxide nanoparticle, the luminescence efficiency and lifespan of the device may be increased.

Another aspect of the disclosure provides a nanocomposite including: the metal oxide nanoparticle; and at least one ligand bonded to a surface of the metal oxide nanoparticle.

In one or more embodiments, the ligand may be a ligand having hydrophilic characteristics. For example, the ligand may include alcohol, thiol, organic acid, or any combination thereof.

In one or more embodiments, the ligand may be poly(ethylene glycol)methyletherthiol, poly(ethylene glycol)2-mercaptoethylether acetic acid, thiol-PEG2, thiol-PEG2-acid, 2-(2-methoxyethoxy)acetic acid, (2-methoxyethoxy)acetic acid, methoxyacetic acid, or any combination thereof.

In one or more embodiments, a photoluminescence quantum yield (PLQY) value of the nanocomposite may be at most 10%. For example, the PLQY value of the metal oxide nanoparticles may be in a range of about 0% to about 10%, about 0% to about 7%, about 0% to about 5%, about 0% to about 3%, about 1% to about 10%, about 1% to about 7%, about 1% to about 5%, about 1% to about 3%, about 2% to about 10%, about 2% to about 7%, about 2% to about 5%, or about 2% to about 3%. This may be because, due to the reduction in defects of the metal oxide nanoparticle crystal, luminescence associated with the defects is reduced.

In one or more embodiments, the nanocomposite may have hydrophilic surface characteristics.

In one or more embodiments, a surface organic content (e.g., amount) (e.g., surface ligand content (e.g., amount)) of the nanocomposite may be in a range of about 12 wt % to about 30 wt %. For example, when a ligand bonded to the surface of the nanocomposite has hydrophilic characteristics and the surface organic content (e.g., amount) of the nanocomposite satisfies the above range, the nanocomposite may have hydrophilic surface characteristics.

For example, the surface organic content (e.g., amount) of the nanocomposite may be in a range of about 12 wt % to about 30 wt %, about 13 wt % to about 30 wt %, about 14 wt % to about 30 wt %, about 15 wt % to about 30 wt %, about 16 wt % to about 30 wt %, about 16.1 wt % to about 30 wt %, about 16.2 wt % to about 30 wt %, about 16.3 wt % to about 30 wt %, about 16.4 wt % to about 30 wt %, about 16.5 wt % to about 30 wt %, about 16.6 wt % to about 30 wt %, about 16.7 wt % to about 30 wt %, about 16.8 wt % to about 30 wt %, about 16.9 wt % to about 30 wt %, about 17 wt % to about 30 wt %, about 17.1 wt % to about 30 wt %, about 17.2 wt % to about 30 wt %, about 17.3 wt % to about 30 wt %, about 17.4 wt % to about 30 wt %, about 17.5 wt % to about 30 wt %, about 17.6 wt % to about 30 wt %, about 17.7 wt % to about 30 wt %, about 17.8 wt % to about 30 wt %, about 17.9 wt % to about 30 wt %, about 18 wt % to about 30 wt %, about 18.1 wt % to about 30 wt %, about 18.2 wt % to about 30 wt %, about 18.3 wt % to about 30 wt %, about 18.4 wt % to about 30 wt %, about 18.5 wt % to about 30 wt %, about 18.6 wt % to about 30 wt %, about 18.7 wt % to about 30 wt %, about 12 wt % to about 25 wt %, about 13 wt % to about 25 wt %, about 14 wt % to about 25 wt %, about 15 wt % to about 25 wt %, about 16 wt % to about 25 wt %, about 16.1 wt % to about 25 wt %, about 16.2 wt % to about 25 wt %, about 16.3 wt % to about 25 wt %, about 16.4 wt % to about 25 wt %, about 16.5 wt % to about 25 wt %, about 16.6 wt % to about 25 wt %, about 16.7 wt % to about 25 wt %, about 16.8 wt % to about 25 wt %, about 16.9 wt % to about 25 wt %, about 17 wt % to about 25 wt %, about 17.1 wt % to about 25 wt %, about 17.2 wt % to about 25 wt %, about 17.3 wt % to about 25 wt %, about 17.4 wt % to about 25 wt %, about 17.5 wt % to about 25 wt %, about 17.6 wt % to about 25 wt %, about 17.7 wt % to about 25 wt %, about 17.8 wt % to about 25 wt %, about 17.9 wt % to about 25 wt %, about 18 wt % to about 25 wt %, about 18.1 wt % to about 25 wt %, about 18.2 wt % to about 25 wt %, about 18.3 wt % to about 25 wt %, about 18.4 wt % to about 25 wt %, about 18.5 wt % to about 25 wt %, about 18.6 wt % to about 25 wt %, about 18.7 wt % to about 25 wt %, about 12 wt % to about 20 wt %, about 13 wt % to about 20 wt %, about 14 wt % to about 20 wt %, about 15 wt % to about 20 wt %, about 16 wt % to about 20 wt %, about 16.1 wt % to about 20 wt %, about 16.2 wt % to about 20 wt %, about 16.3 wt % to about 20 wt %, about 16.4 wt % to about 20 wt %, about 16.5 wt % to about 20 wt %, about 16.6 wt % to about 20 wt %, about 16.7 wt % to about 20 wt %, about 16.8 wt % to about 20 wt %, about 16.9 wt % to about 20 wt %, about 17 wt % to about 20 wt %, about 17.1 wt % to about 20 wt %, about 17.2 wt % to about 20 wt %, about 17.3 wt % to about 20 wt %, about 17.4 wt % to about 20 wt %, about 17.5 wt % to about 20 wt %, about 17.6 wt % to about 20 wt %, about 17.7 wt % to about 20 wt %, about 17.8 wt % to about 20 wt %, about 17.9 wt % to about 20 wt %, about 18 wt % to about 20 wt %, about 18.1 wt % to about 20 wt %, about 18.2 wt % to about 20 wt %, about 18.3 wt % to about 20 wt %, about 18.4 wt % to about 20 wt %, about 18.5 wt % to about 20 wt %, about 18.6 wt % to about 20 wt %, or about 18.7 wt % to about 20 wt %.

In one or more embodiments, the nanocomposite may be dispersed in an ink solvent having hydrophilic characteristics. Accordingly, intermixing with an emission layer that is dispersed in a non-aqueous solvent and inkjet-printed may not occur. To this end, the nanocomposite needs to have hydrophilic surface characteristics.

In one or more embodiments, a particle size of the nanocomposite may be in a range of about 10 nanometer (nm) to about 15 nm, based on particle size analysis according to dynamic light scattering (DLS), and the particle size may be maintained in a margin of about 5 nm for at least 21 days. For example, gelation of the nanocomposite may be prevented or reduced due to the ligand bonded to the surface of the metal oxide nanoparticle, and thus, the size of the nanocomposite may be maintained constant. The particle size analysis according to DLS may be performed by utilizing a suitable method in the art. For example, the particle size analysis according to DLS may be performed by utilizing Nano-ZS90 from Malvern Panalytical Ltd.

Another aspect of the disclosure provides, an ink composition including: the nanocomposite; and at least one ink solvent.

In one or more embodiments, the ink solvent may have hydrophilic characteristics.

In one or more embodiments, the ink solvent may be an alcohol-based solvent having two or more carbon atoms, an ether-based solvent, an aromatic solvent, or any combination thereof.

For example, the ink solvent may include cyclohexylbenzene, 1,3-dipropoxybenzene, 4-methoxybenzaldehyde-dimethyl-acetal, 4,4'-difluorodiphenylmethane, diphenylether, 1,2-dimethoxy-4-(1-propenyl)benzene, 2-phenoxytoluene (MDPE), diphenylmethane, 2-phenylpyridine, dimethyl benzyl ether (DMDPE), 3-phenoxytoluene, 3-phenylpyridine, 2-phenylanisole, 2-phenoxytetrahydropuran, 1-propyl-4-phenyl benzene (NPBP), 2-phenoxy-1,4-dimethyl benzene (25DMDPE; boiling point of 280° C.), ethyl-2-naphtyl-ether, dodecylbenzene, 2,2,5-tri-methy diphenyl ether (225TMDPE), dibenzyl-ether, 2,3,5-tri-methy diphenyl ether (235TMDPE), N-methyldiphenylamine, 4-isopropylbiphenyl, α,α-dichlorodiphenylmethane, 4-(3-phenylpropyl)pyridine, benzyl-benzoate, 1,1-bis(3,4-dimethylphenyl) ethane, diethylene glycol butyl methyl ether (DEGBME), diethylene glycol monomethyl ether (DEGME), diethylene glycol ethyl methyl ether (DEGEME), diethylene glycol dibutyl ether (DEGDBE), propylene glycol methyl ether acetate (PGMEA), triethylene glycol monomethyl ether (TGME), diethylene glycol monobutyl ether (DGBE), tripropylene glycol butyl ether (TPGBE), or any combination thereof.

In one or more embodiments, the ink composition may further include a dispersant. The dispersant may include suitable anionic, cationic, and nonionic polymeric materials.

In one or more embodiments, an amount of the nanocomposite may be 20 wt % or less based on the total weight of the ink composition. For example, the amount of the nanocomposite may be less than 20 wt % based on the total weight of the ink composition.

For example, the amount of the nanocomposite may be in a range of about 0.01 wt % to about 20 wt % based on the total weight of the ink composition. For example, the amount of the nanocomposite may be in a range of about 0.05 wt % to about 20 wt % based on the total weight of the ink composition. For example, the amount of the nanocomposite may be in a range of about 0.1 wt % to about 20 wt % based on the total weight of the ink composition.

The ink composition may have excellent or suitable inkjet ejection stability, and thus may be applied to an inkjet printing process. Accordingly, by inkjet printing the ink composition, a layer including the nanocomposite may be formed. For example, by inkjet printing the ink composition, a light-emitting device in which an electron transport region (particularly, an electron transport layer) includes the nanocomposite may be manufactured.

Another aspect of the disclosure provides a method of preparing the ink composition.

The method of preparing the ink composition may include:

synthesizing the metal oxide nanoparticle with, or by utilizing, sol-gel processing;

precipitating and separating the metal oxide nanoparticle;

mixing the metal oxide nanoparticle with a first solvent including at least one ligand;

synthesizing the nanocomposite by reacting the metal oxide nanoparticle with the ligand;

precipitating and separating the nanocomposite by mixing a solution including the nanocomposite with a second solvent that is a non-polar solvent; and preparing the ink composition by mixing the nanocomposite with the ink solvent.

The sol-gel method may be a suitable method in the art, and may be clearly understood through Examples provided herein.

Details on the ink solvent may be the same as described herein.

In one or more embodiments, the first solvent may include the ligand and alcohol.

In one or more embodiments, the alcohol may be methanol, ethanol, propanol, butanol, or pentanol. For example, the alcohol may be ethanol.

In one or more embodiments, the second solvent may be a solvent having a relative polarity of 0.3 or less when the polarity of water is 1.

In one or more embodiments, the second solvent may be n-octane, n-hexane, n-pentane, n-heptane, n-nonane, n-decane, n-undecane, n-dodecane, n-tridecane, n-tetradecane, n-pentadecane, n-hexadecane, 2-methylheptane, 3-methylheptane, 4-methylheptane, 2,2-dimethylhexane, 2,3-dimethylhexane, 2,4-dimethylhexane, 2,5-dimethylhexane, 3,3-dimethylhexane, 3-ethylhexane, 2,2,4-trimethylpentane, 2-methyloctane, 2-methylnonane, 2-methyldecane, 2-methylundecane, 2-methyldodecane, 2-methyltridecane, cyclohexane, methylcyclohexane, ethylcyclohexane, 1,1-dimethylcyclohexane, 1,2-dimethylcyclohexane, cycloheptane, methylcycloheptane, bicyclohexyl, decalin, toluene, xylene, ethylbenzene, diethylbenzene, mesitylene, propylbenzene, cyclohexylbenzene, dimethoxybenzene, anisole, ethoxytoluene, phenoxytoluene, isopropylbiphenyl, dimethylanisole, propylanisole, 1-ethylnaphthalene, 2-ethylnaphthalene, 2-ethylbiphenyl, octylbenzene, diethylamine, chlorobenzene, tetrahydrofuran, ethylacetate, chloroform, or any combination thereof.

Another aspect of the disclosure provides a light-emitting device including the nanocomposite.

The light-emitting device may include:

a first electrode;

a second electrode facing the first electrode; and an interlayer arranged between the first electrode and the second electrode and including an emission layer.

In one or more embodiments, the interlayer may include the metal oxide nanoparticle and/or the nanocomposite.

In one or more embodiments, the interlayer may further include an electron transport region arranged between the emission layer and the second electrode.

In one or more embodiments, the electron transport region may include the metal oxide nanoparticle and/or the nanocomposite.

In one or more embodiments, the hole transport region may include the metal oxide nanoparticle and/or the nanocomposite.

In one or more embodiments, the first electrode may be an anode, the second electrode may be a cathode, the interlayer may further include a hole transport region arranged between the first electrode and the emission layer, the hole transport region may include a hole injection layer, a hole transport layer, an emission auxiliary layer, an electron blocking layer, or any combination thereof, and the electron transport region may include a hole blocking layer, an electron transport layer, an electron injection layer, an electron suppression layer, or any combination thereof.

In one or more embodiments, the electron suppression layer may be a Sn-doped layer included in the electron transport region, and may greatly suppress or reduce electron injection.

In one or more embodiments, the electron transport layer in the electron transport region may include the metal oxide nanoparticle and/or the nanocomposite.

In one or more embodiments, the hole transport layer in the hole transport region may include the metal oxide nanoparticle and/or the nanocomposite.

In one or more embodiments, the emission layer may include quantum dots.

In one or more embodiments, the light-emitting device may further include a capping layer arranged outside the first electrode and/or outside the second electrode.

In one or more embodiments, the light-emitting device may further include at least one selected from among a first capping layer arranged outside the first electrode and a second capping layer arranged outside the second electrode. In one or more embodiments, the metal oxide nanoparticle represented by Formula 1 and/or the nanocomposite including the metal oxide nanoparticle may be included in at least one of the first capping layer and the second capping layer. More details on the first capping layer and/or second capping layer may be the same as described herein.

In one or more embodiments, the light-emitting device may include:

a first capping layer arranged outside (e.g., on) the first electrode and including the metal oxide nanoparticle represented by Formula 1 and/or the nanocomposite including the metal oxide nanoparticle;

a second capping layer arranged outside (e.g., on) the second electrode and including the metal oxide nanoparticle represented by Formula 1 and/or the nanocomposite including the metal oxide nanoparticle; or the first capping layer and the second capping layer.

The expression "(an interlayer and/or a capping layer) includes a metal oxide nanoparticle represented by Formula 1 and/or a nanocomposite including the metal oxide nanoparticle" as utilized herein may include a case in which "(an interlayer and/or a capping layer) includes one kind of metal oxide nanoparticle represented by Formula and/or a nanocomposite including the metal oxide nanoparticle" and a case in which "(an interlayer and/or a capping layer) includes two or more different kinds of metal oxide nanoparticles, each represented by Formula 1, and/or a nanocomposite including the metal oxide nanoparticles."

For example, the interlayer and/or the capping layer may include, as the metal oxide nanoparticle and/or the nanocomposite including the metal oxide nanoparticle, only a first nanocomposite. In this regard, the first nanocomposite may be present in the electron transport region of the light-emitting device. In one or more embodiments, the interlayer may include, as the metal oxide nanoparticle and/or the nanocomposite including the metal oxide nanoparticle, a first nanocomposite and a second nanocomposite. In this regard, the first nanocomposite and the second nanocomposite may be present in substantially the same layer (e.g., both (e.g., simultaneously) the first nanocomposite and the second nanocomposite may be present in the electron transport region), or may be present in different layers (e.g., the first nanocomposite may be present in the electron transport region, and the second nanocomposite may be present in the hole transport region).

The term "interlayer" as utilized herein refers to a single layer and/or all of a plurality of layers arranged between the first electrode and the second electrode of the light-emitting device.

More details on the light-emitting device may be the same as described herein.

Another aspect of the disclosure provides a method of manufacturing the light-emitting device.

The method of manufacturing the light-emitting device may include:

preparing an ink composition including: the nanocomposite; and at least one ink solvent; and forming the electron transport region including the nanocomposite by inkjet printing the ink composition.

Details on the ink solvent may be the same as described herein.

As an inkjet printer utilized in the inkjet printing method, a suitable inkjet printer may be utilized.

For example, the inkjet printing method may utilize an inkjet printer having an inkjet head mounted with a piezo-type or kind nozzle that applies pressure according to a voltage. In this regard, the ink composition may be ejected from the nozzle of the inkjet head onto a substrate.

In some embodiments, an ejection amount of the ink composition may be, for example, in a range of about 1 picoliter per time (pL/time) to about 50 pL/time, about 1 pL/time to about 30 pL/time, or about 1 pL/time to about 20 pL/time, but embodiments are not limited thereto.

An aperture diameter of the inkjet head may be, for example, in a range of about 5 micrometer (μm) to about 50 μm or about 10 μm to about 30 μm, to minimize or reduce clogging of the nozzle and improve the degree of precision of ejection, but embodiments are not limited thereto.

An ejection pressure of the inkjet head may be, for example, in a range of about 1,000 inverse second (i.e., per second) ($s^{-1}$) to about 10,000 $s^{-1}$ based on the shear rate, but embodiments are not limited thereto.

A temperature at the time of forming a coating film may be, but is not particularly limited to, for example, in a range of about 10° C. to about 50° C., about 15° C. to about 40° C., about 15° C. to about 30° C., or about 20° C. to about 50° C., in terms of suppressing crystallization of a material included in the ink composition, but embodiments are not limited thereto.

Because at least one layer of the hole transport region, the emission layer, and the electron transport region included in the light-emitting device is formed by utilizing the ink composition via inkjet printing, a high-quality, large-area light-emitting device including the metal oxide nanoparticle and/or the nanocomposite may be efficiently manufactured.

Another aspect of the disclosure provides an electronic apparatus including the light-emitting device. The electronic apparatus may further include a thin-film transistor. For example, the electronic apparatus may further include a thin-film transistor including a source electrode and a drain electrode. In one or more embodiments, the first electrode of the light-emitting device may be electrically connected to the source electrode of the thin-film transistor or the drain electrode of the thin-film transistor. In one or more embodiments, the electronic apparatus may further include a color filter, a color conversion layer, a touch screen layer, a polarizing layer, or any combination thereof.

More details on the electronic apparatus may be the same as described herein.

Another aspect of the disclosure provides electronic equipment including the light-emitting device.

For example, the electronic equipment may be at least one selected from among a flat panel display, a curved display, a computer monitor, a medical monitor, a television, a billboard, an indoor or outdoor light and/or light for signal, a head-up display, a fully or partially transparent display, a flexible display, a rollable display, a foldable display, a stretchable display, a laser printer, a telephone, a portable phone, a tablet personal computer, a phablet, a personal digital assistant (PDA), a wearable device, a laptop computer, a digital camera, a camcorder, a viewfinder, a micro display, a three-dimensional (3D) display, a virtual reality or augmented reality display, a vehicle, a video wall with multiple displays tiled together, a theater or stadium screen, a phototherapy device, a signboard, and combinations thereof.

More details on the electronic equipment may be the same as described herein.

Description of FIG. 1

FIG. 1 is a schematic cross-sectional view of a light-emitting device 10 according to one or more embodiments. The light-emitting device 10 includes a first electrode 110, an interlayer 130, and a second electrode 150.

Hereinafter, the structure of the light-emitting device 10 according to one or more embodiments and a method of manufacturing the light-emitting device 10 will be described with reference to FIG. 1.

First Electrode 110

In FIG. 1, a substrate may be additionally arranged under the first electrode 110 or on the second electrode 150. In one or more embodiments, as the substrate, a glass substrate or a plastic substrate may be utilized. In one or more embodiments, the substrate may be a flexible substrate, and may include plastics with excellent or suitable heat resistance and durability, such as polyimide, polyethylene terephthalate (PET), polycarbonate, polyethylene napthalate, polyarylate (PAR), polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high work-function material that facilitates injection of holes. The "term "high work-function material" as utilized herein refers to a substance (e.g., a metal or metal alloy) that requires a relatively high amount of energy to emit electrons from its surface.

The first electrode 110 may be a reflective electrode, a semi-transmissive electrode, or a transmissive electrode. In one or more embodiments, when the first electrode 110 is a transmissive electrode, a material for forming the first electrode 110 may include indium tin oxide (ITO), indium zinc oxide (IZO), tin oxide ($SnO_2$), zinc oxide (ZnO), or any combination thereof. In one or more embodiments, when the first electrode 110 is a semi-transmissive electrode or a reflective electrode, a material for forming the first electrode 110 may include magnesium (Mg), silver (Ag), aluminum (Al), aluminum-lithium (Al—Li), calcium (Ca), magnesium-indium (Mg—In), magnesium-silver (Mg—Ag), or any combination thereof.

The first electrode 110 may have a single-layer structure consisting of a single layer or a multi-layer structure including multiple layers. For example, the first electrode 110 may have a three-layer structure of ITO/Ag/ITO.

Interlayer 130

The interlayer 130 is arranged on the first electrode 110. The interlayer 130 may include an emission layer.

The interlayer 130 may further include a hole transport region arranged between the first electrode 110 and the emission layer, and an electron transport region arranged between the emission layer and the second electrode 150.

The interlayer 130 may further include, in addition to one or more suitable organic materials, a metal-containing compound, an inorganic material such as a quantum dot, and/or the like.

In one or more embodiments, the interlayer 130 may include, i) two or more emitting units sequentially stacked between the first electrode 110 and the second electrode 150, and ii) a charge generation layer between the two or more emitting units. When the interlayer 130 includes the two or more emitting units and the charge generation layer, the light-emitting device 10 may be a tandem light-emitting device.

Hole Transport Region in Interlayer 130

The hole transport region may include the metal oxide nanoparticle represented by Formula 1 and/or the nanocomposite including the metal oxide nanoparticle.

The hole transport region may have: i) a single-layer structure including (e.g., consisting of) a single layer including (e.g., consisting of) a single material, ii) a single-layer structure including (e.g., consisting of) a single layer including (e.g., consisting of) multiple materials that are different from each other, or iii) a multi-layer structure including multiple layers including multiple materials that are different from each other.

The hole transport region may include a hole injection layer, a hole transport layer, an emission auxiliary layer, an electron blocking layer, or any combination thereof.

For example, the hole transport region may have a multi-layer structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure. In one or more embodiments, the constituent layers of each structure are stacked sequentially from the first electrode 110.

The hole transport region may include a compound represented by Formula 201, a compound represented by Formula 202, or any combination thereof:

Formula 201

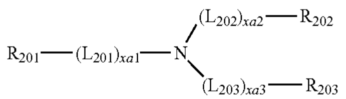

Formula 202

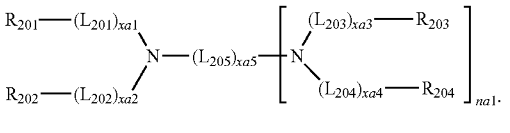

In Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group (e.g., a carbazole group, and/or the like) unsubstituted or substituted with at least one $R_{10a}$ (e.g., see Compound HT16), $R_{203}$ and $R_{204}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group unsubstituted or substituted with at least one $R_{10a}$, and na1 may be an integer from 1 to 4.

For example, each of Formulae 201 and 202 may include at least one selected from among groups represented by Formulae CY201 to CY217:

CY201

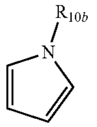

CY202

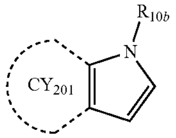

CY203

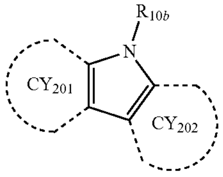

CY204

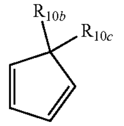

CY205

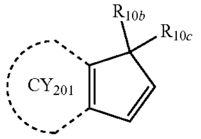

CY206

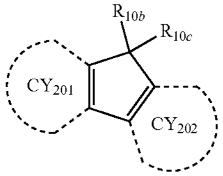

-continued

CY207

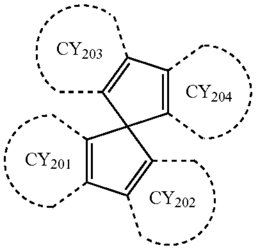

CY208

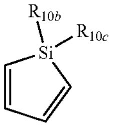

CY209

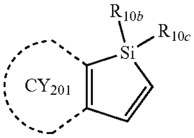

CY210

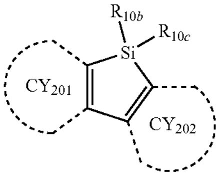

CY211

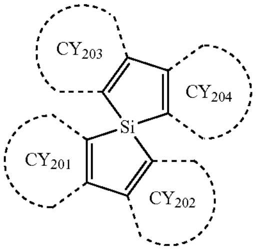

CY212

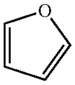

CY213

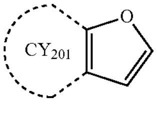

CY214

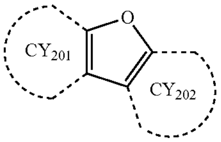

CY215

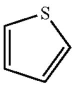

-continued

CY216

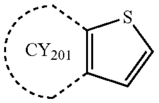

CY217

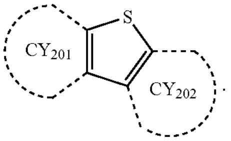

In Formulae CY201 to CY217, $R_{10b}$ and $R_{10c}$ may each be as described in connection with $R_{10a}$, ring CY201 to ring CY204 may each independently be a $C_3$-$C_{20}$ carbocyclic group or a $C_1$-$C_{20}$ heterocyclic group, and at least one hydrogen in Formulae CY201 to CY217 may be unsubstituted or substituted (e.g., replaced) with $R_{10a}$.

In one or more embodiments, ring CY201 to ring CY204 in Formulae CY201 to CY217 may each independently be a benzene group, a naphthalene group, a phenanthrene group, or an anthracene group.

In one or more embodiments, each of Formulae 201 and 202 may include at least one selected from among the groups represented by Formulae CY201 to CY203.

In one or more embodiments, Formula 201 may include at least one selected from among the groups represented by Formulae CY201 to CY203 and at least one of the groups represented by Formulae CY204 to CY217.

In one or more embodiments, in Formula 201, xa1 may be 1, $R_{201}$ may be one selected from among the groups represented by Formulae CY201 to CY203, xa2 may be 0, and $R_{202}$ may be one selected from among the groups represented by Formulae CY204 to CY207.

In one or more embodiments, each of Formulae 201 and 202 may not include (e.g., may exclude) the groups represented by Formulae CY201 to CY203.

In one or more embodiments, each of Formulae 201 and 202 may not include (e.g., may exclude) the groups represented by Formulae CY201 to CY203, and may include at least one selected from among the groups represented by Formulae CY204 to CY217.

In one or more embodiments, each of Formulae 201 and 202 may not include (e.g., may exclude) the groups represented by Formulae CY201 to CY217.

For example, the hole transport region may include: at least one selected from among Compounds HT1 to HT46; m-MTDATA; TDATA; 2-TNATA; NPB(NPD); β-NPB; TPD; spiro-TPD; spiro-NPB; methylated NPB; TAPC; HMTPD; 4,4',4"-tris(N-carbazolyl)triphenylamine (TCTA); polyaniline/dodecylbenzenesulfonic acid (PANI/DBSA); poly(3,4-ethylenedioxythiophene)/poly(4-styrenesulfonate) (PEDOT/PSS); polyaniline/camphor sulfonic acid (PANI/CSA); polyaniline/poly(4-styrenesulfonate) (PANI/PSS); and/or any combination thereof:

HT1
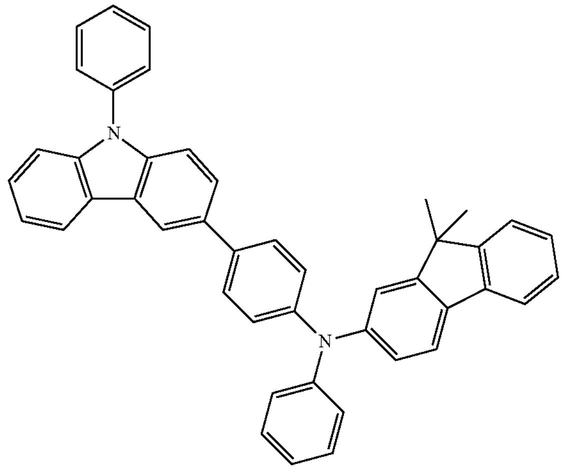
HT2
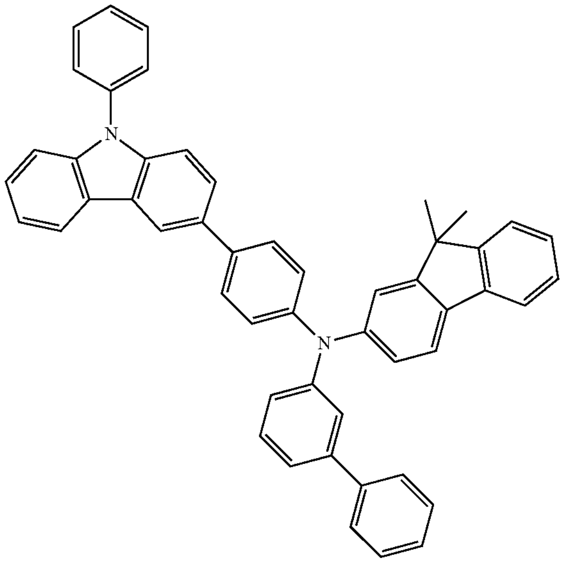
HT3
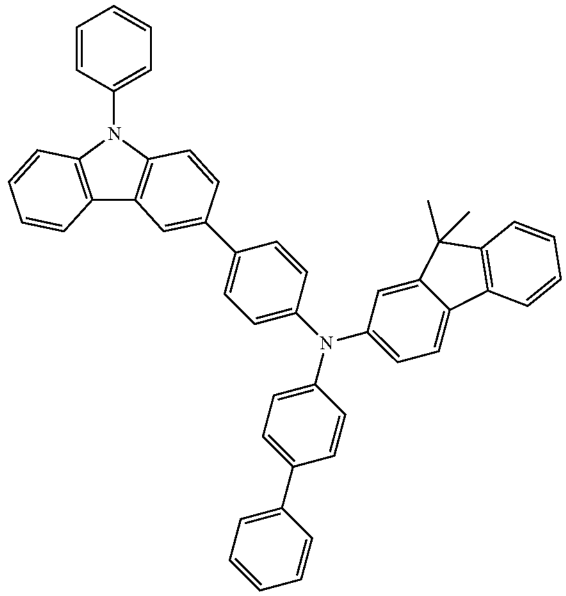
HT4
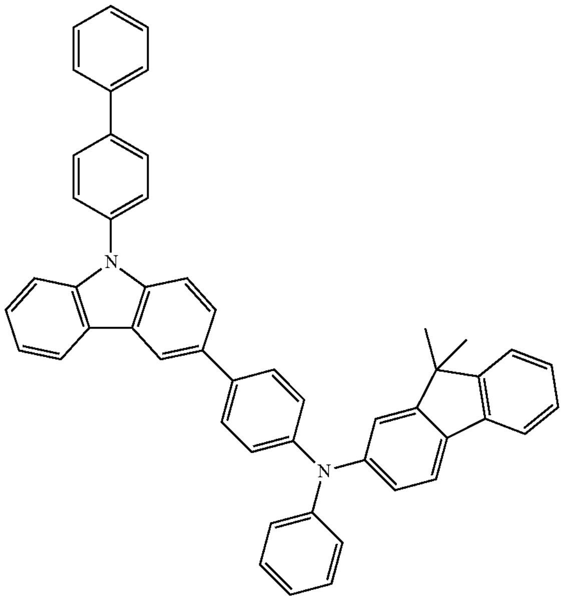

-continued
HT5
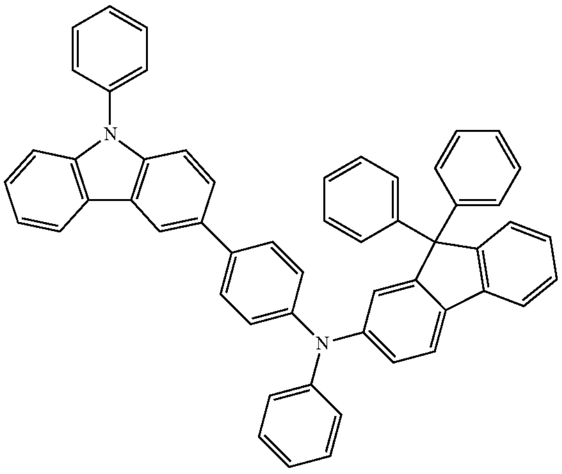
HT6
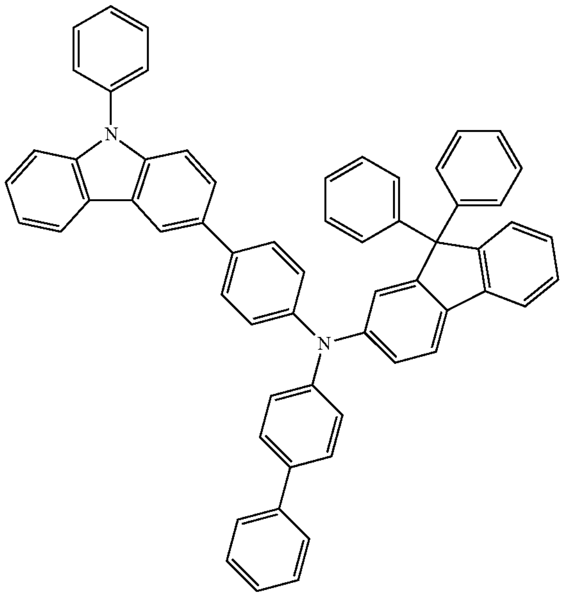
HT7
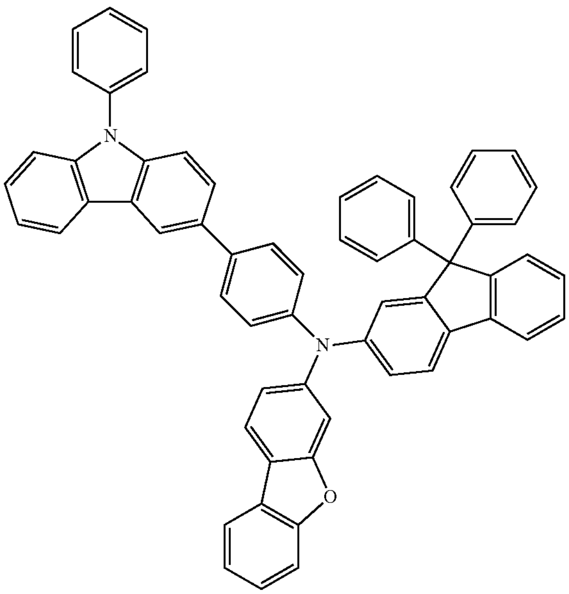
HT8
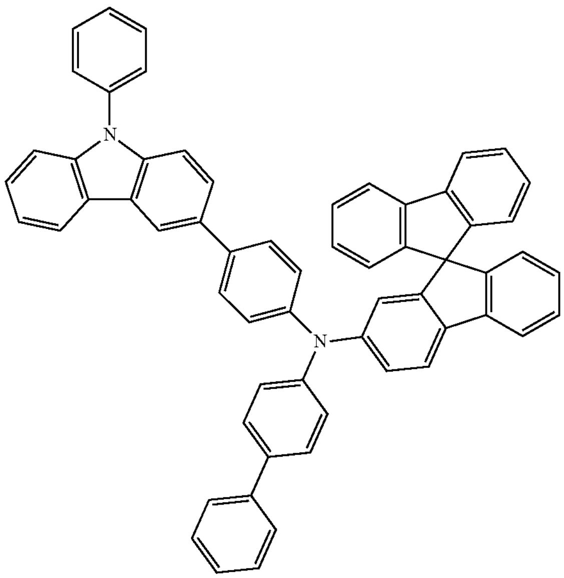

-continued
HT9
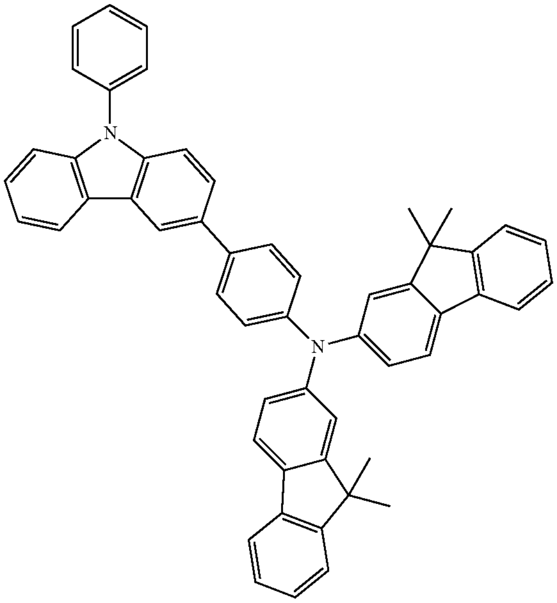
HT10
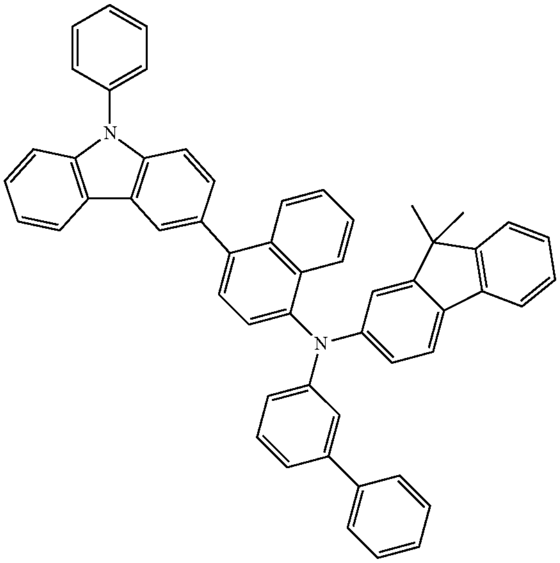
HT11
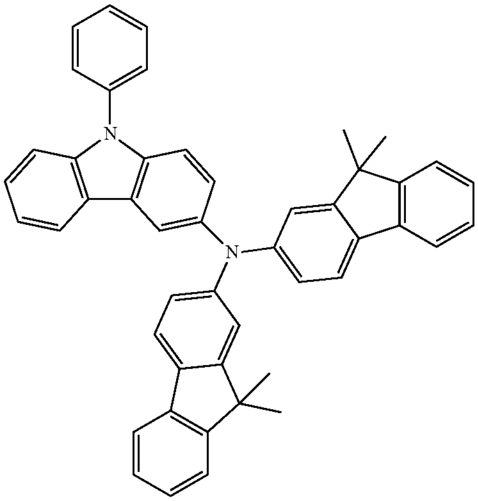
HT12
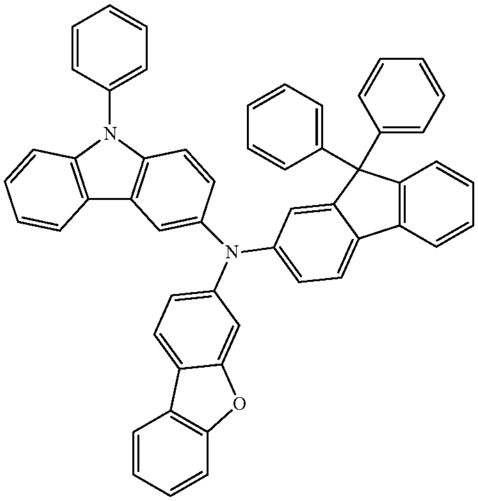

-continued
HT13
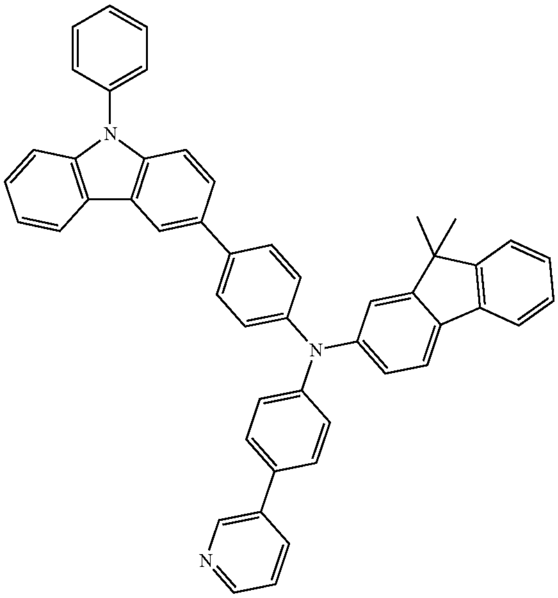
HT14
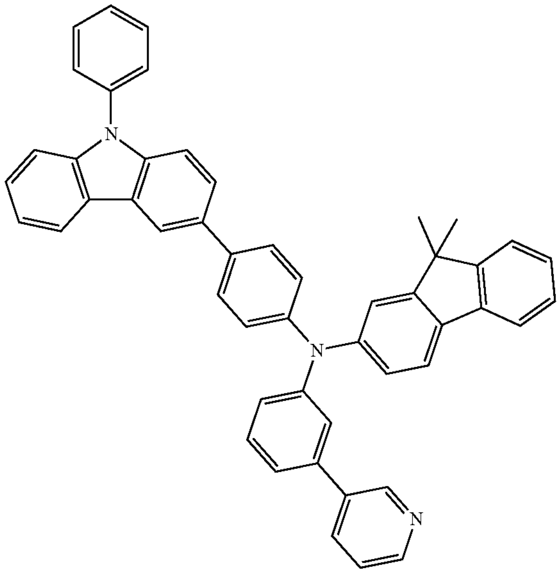
HT15
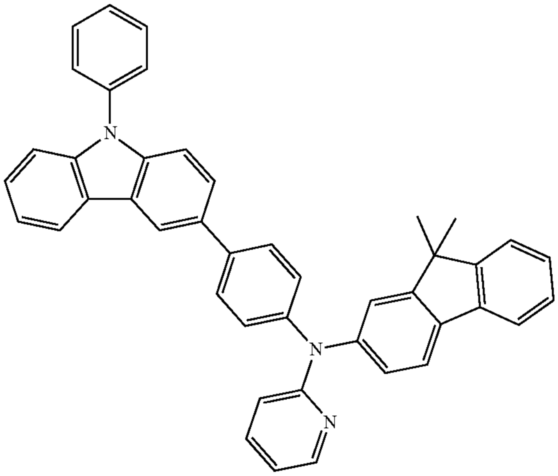
HT16
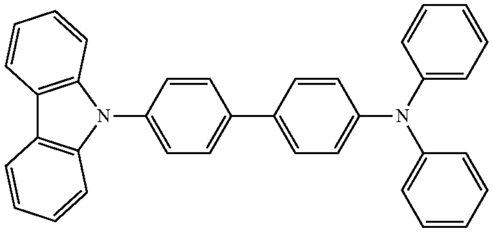
HT17
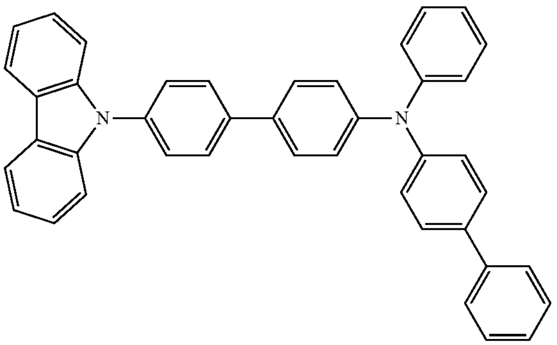
HT18
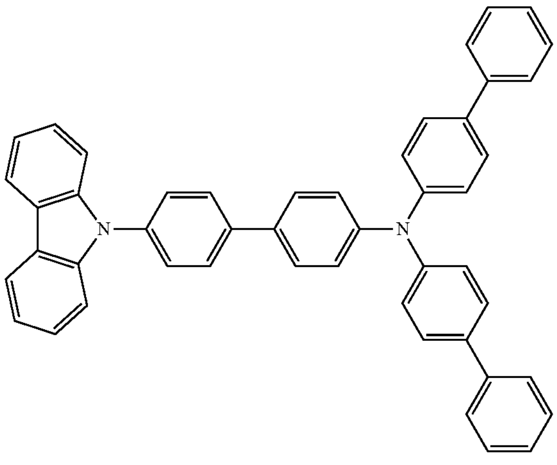

-continued
HT19
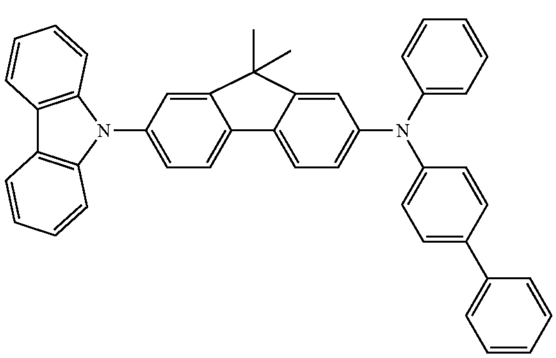
HT20
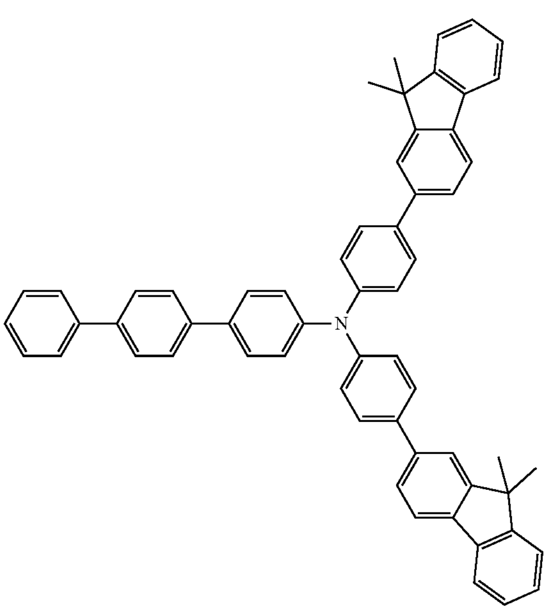
HT21
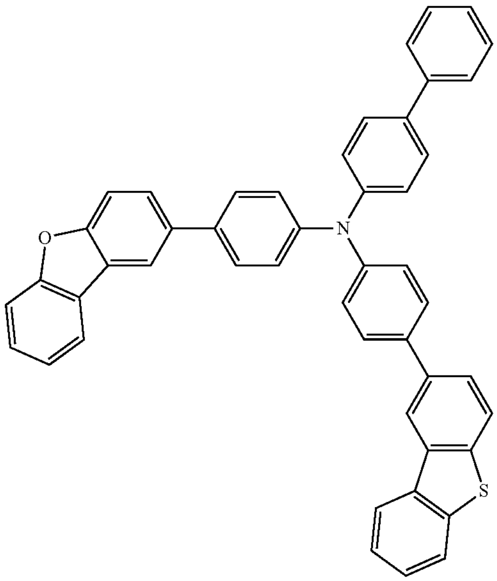
HT22
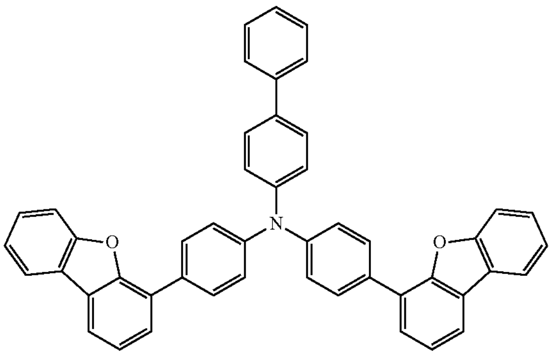

-continued
HT23
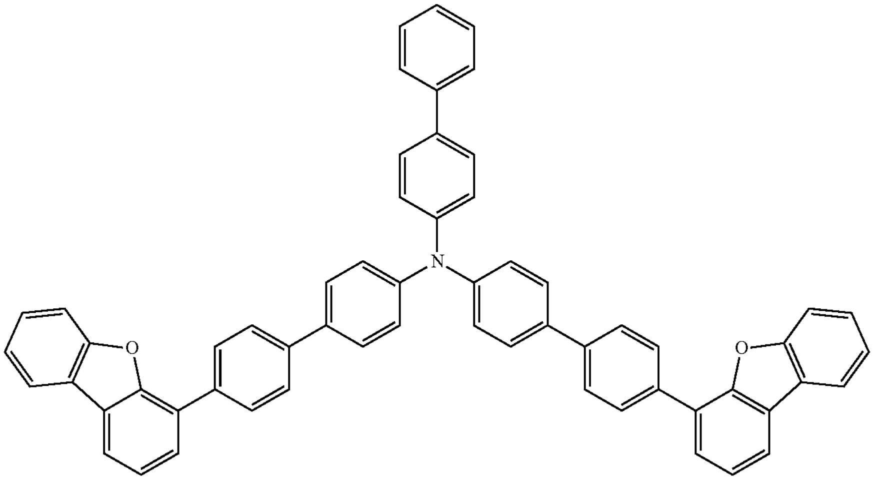
HT24
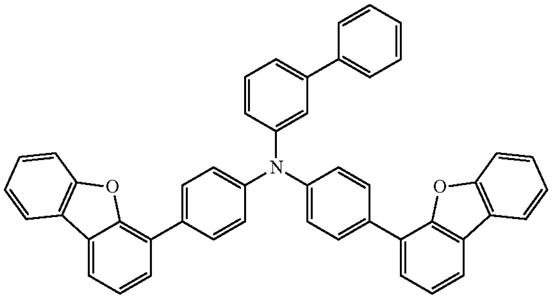
HT25
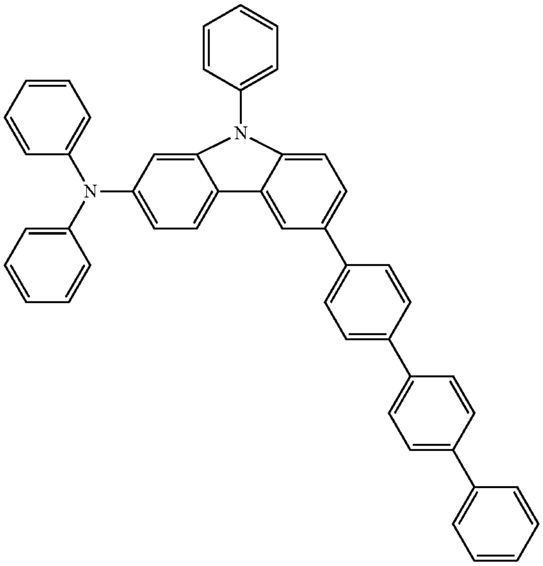
HT26
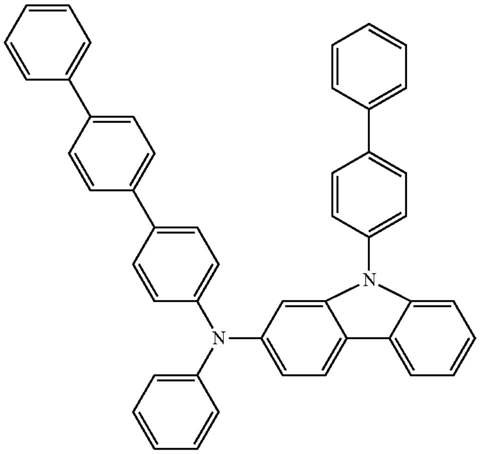
HT27
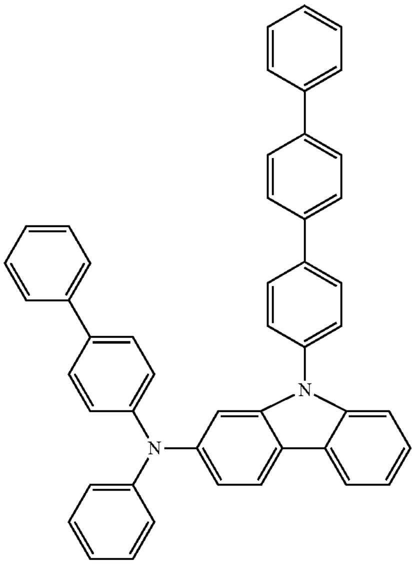

-continued
HT28
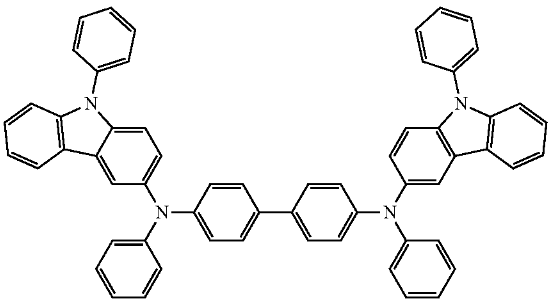
HT29
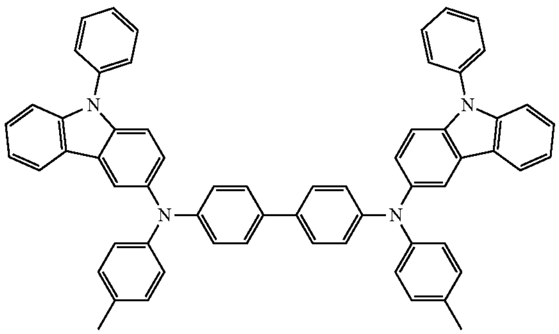
HT30
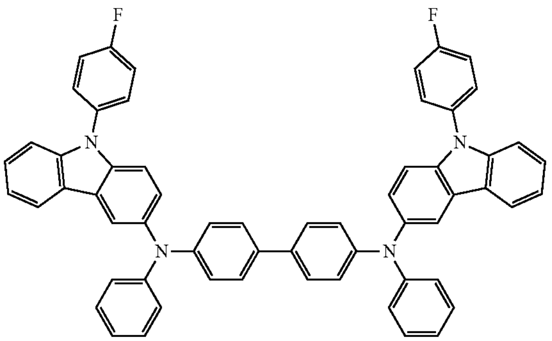
HT31
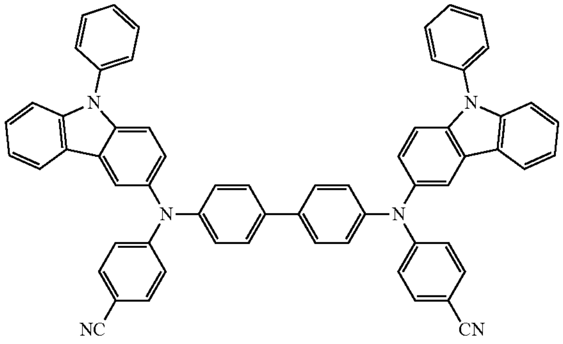
HT32
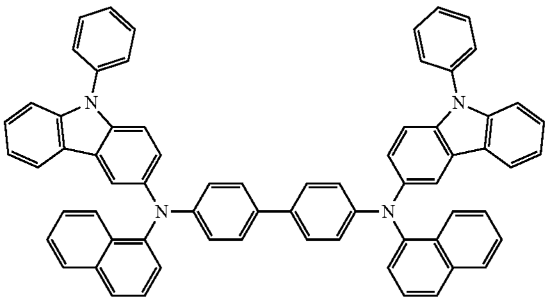
HT33
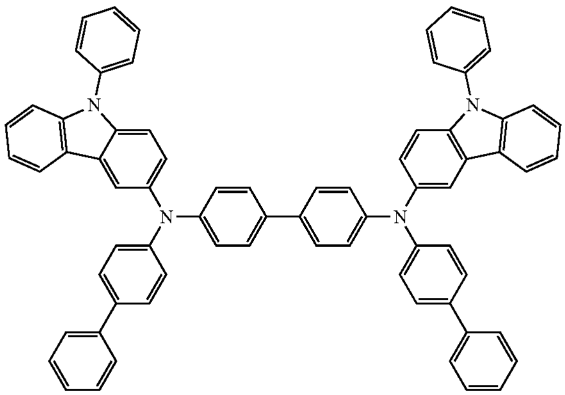
HT34
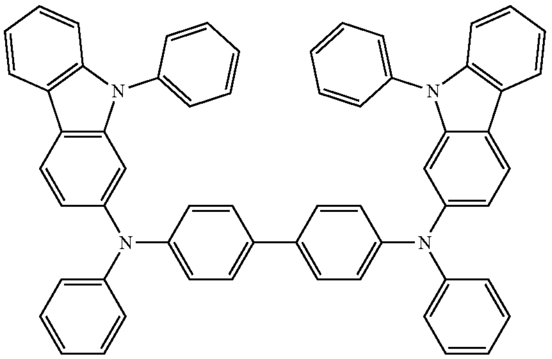
HT35
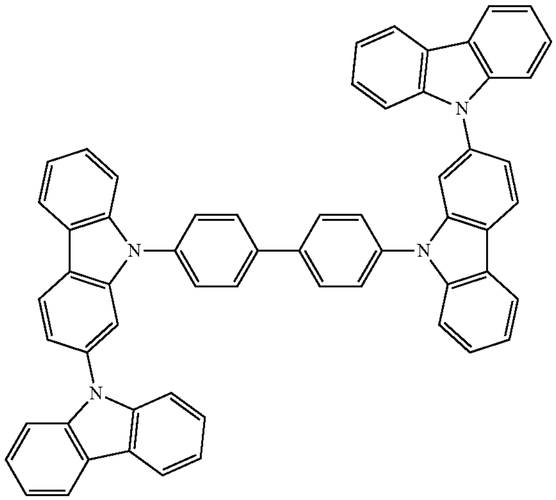

-continued
HT36
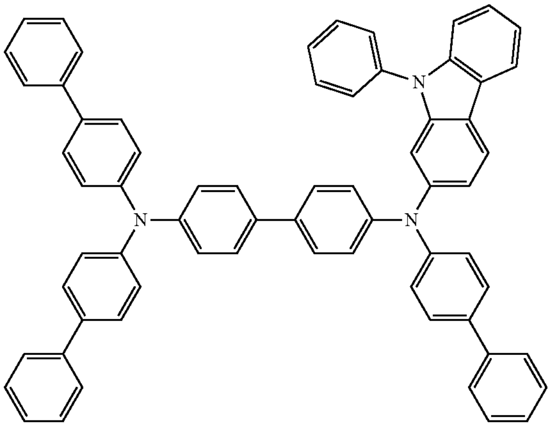
HT37
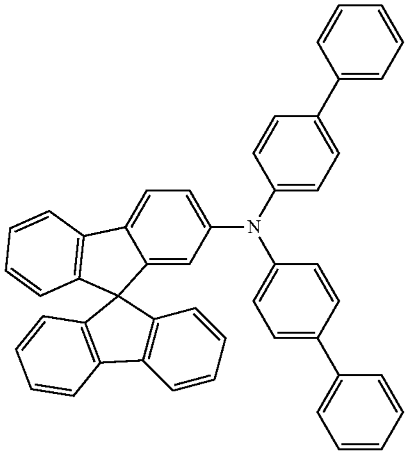
HT38
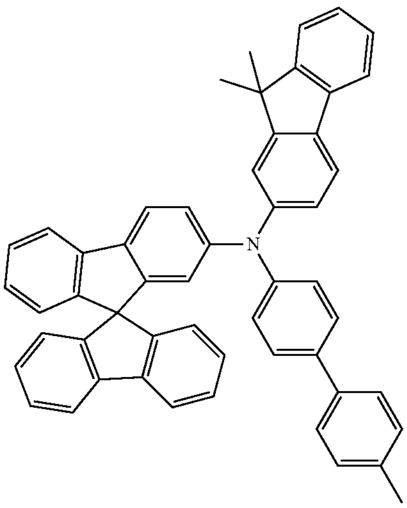
HT39
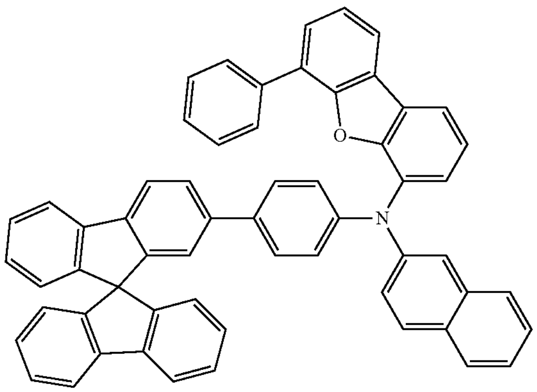
HT40
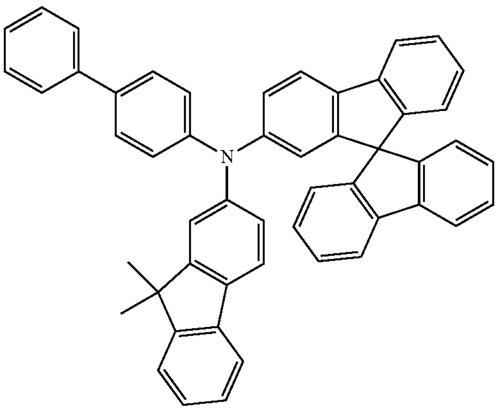
HT41
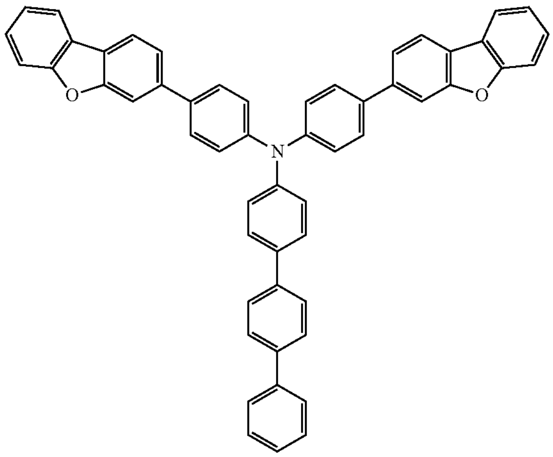

-continued
HT42
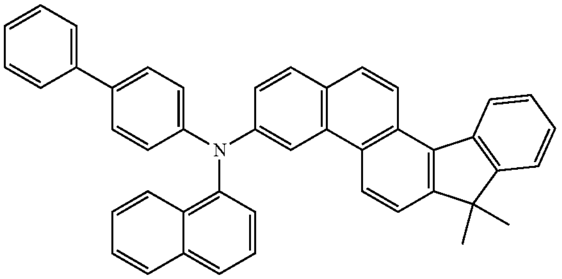
HT43
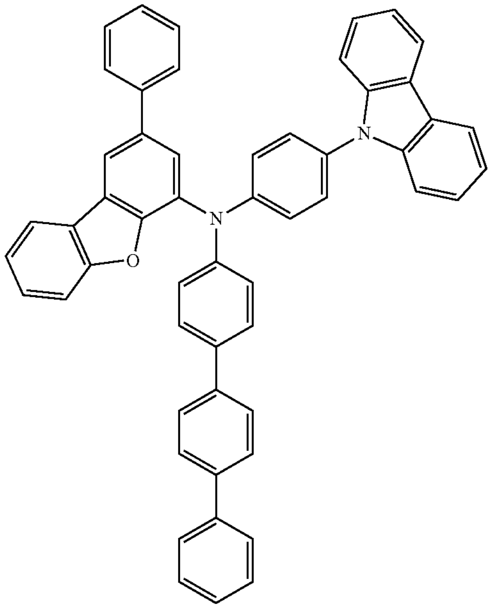
HT44
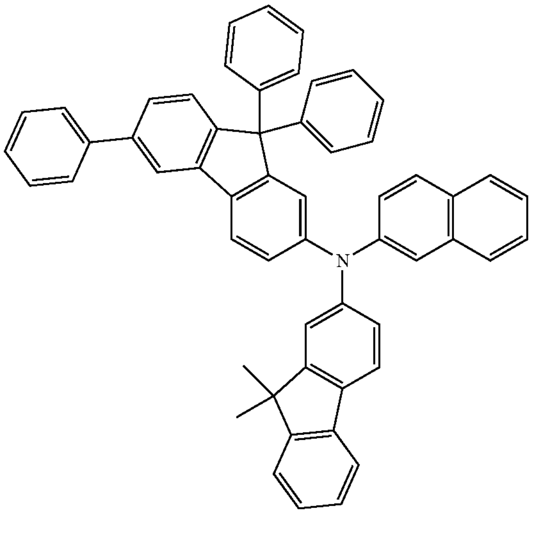
HT45
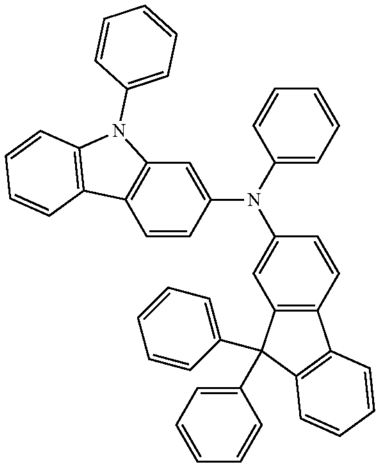
HT46
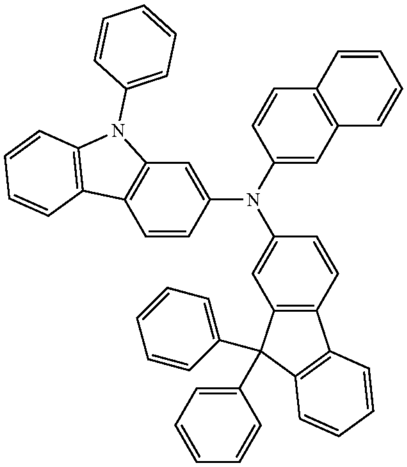

-continued
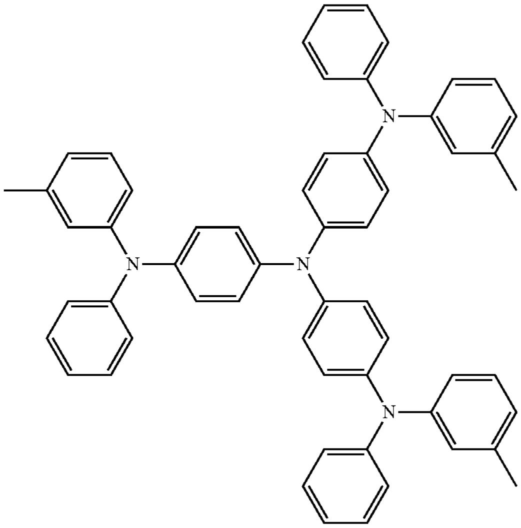
m-MTDATA
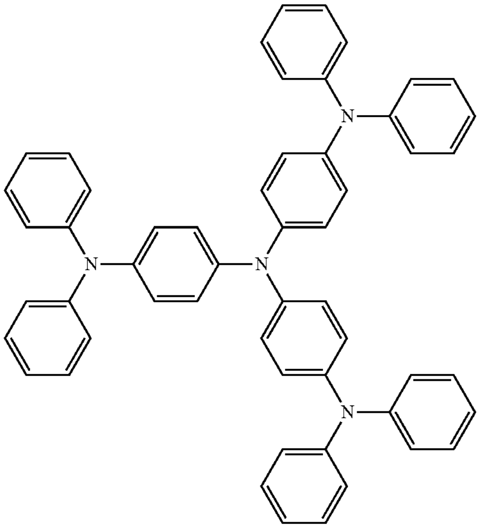
TDATA
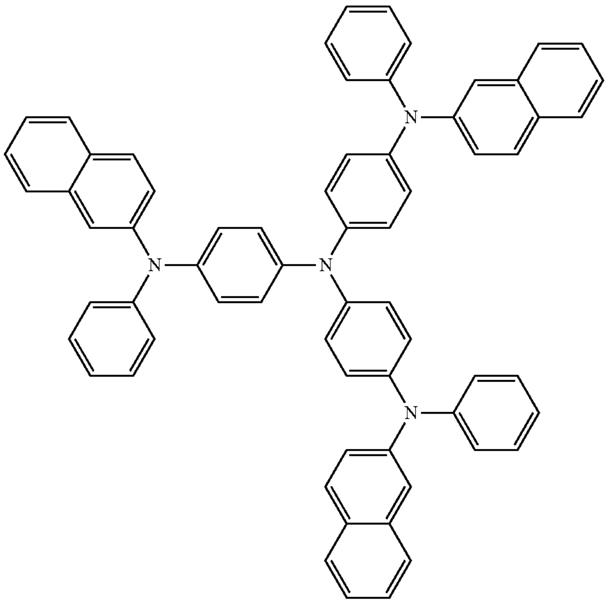
2-TNATA
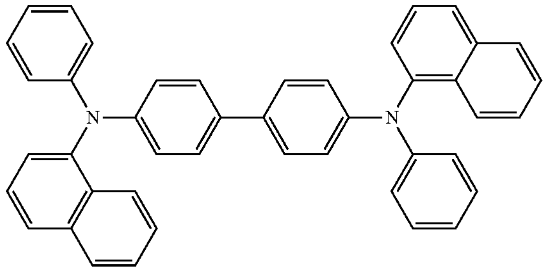
NPB
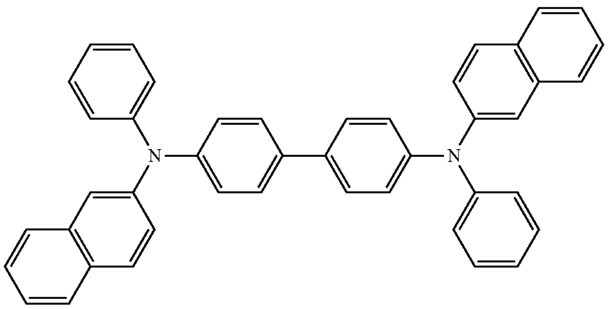
β-NPB
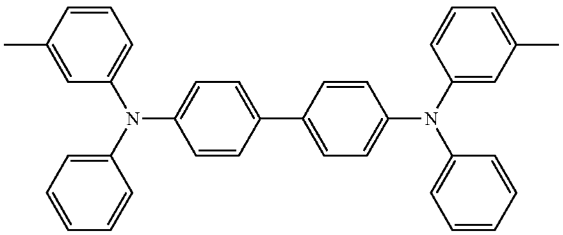
TPD -continued

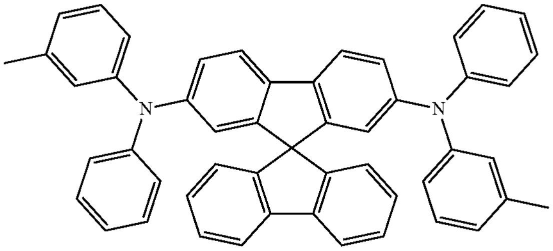

Spiro-TPD

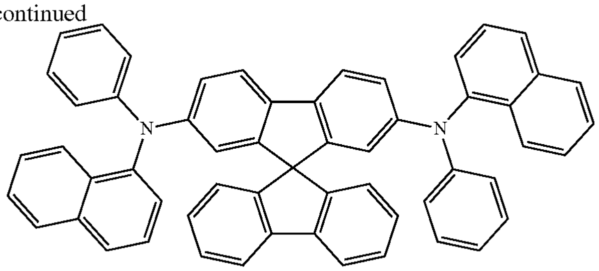

Spiro-NPB

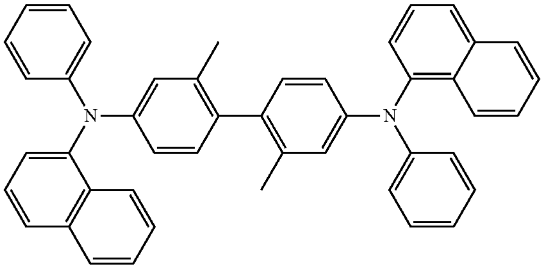

methylated NPB

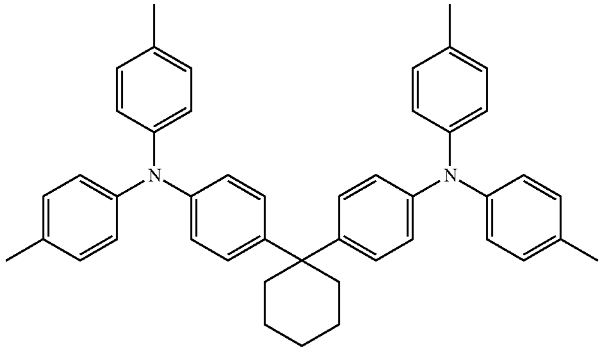

TAPC

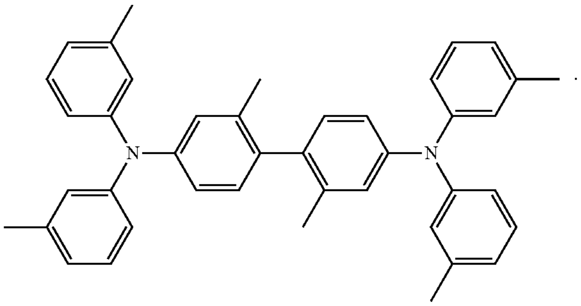

HMTPD

A thickness of the hole transport region may be in a range of about 50 angstrom (Å) to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The emission auxiliary layer may increase light-emission efficiency by compensating for an optical resonance distance according to the wavelength of light emitted by the emission layer, and the electron blocking layer may block or reduce the leakage of electrons from the emission layer to the hole transport region. Materials that may be included in the hole transport region may be included in the emission auxiliary layer and the electron blocking layer.

p-Dopant

The hole transport region may further include, in addition to these materials, a charge-generation material for the improvement of conductive properties. The charge-generation material may be uniformly or non-uniformly dispersed in the hole transport region (e.g., in the form of a single layer consisting of a charge-generation material).

The charge-generation material may be, for example, a p-dopant.

For example, the p-dopant may have a lowest unoccupied molecular orbital (LUMO) energy level of less than or equal to about −3.5 electron volt (eV).

In one or more embodiments, the p-dopant may include a quinone derivative, a cyano group-containing compound, a compound including element EL1 and element EL2, or any combination thereof.

Examples of the quinone derivative are TCNQ, F4-TCNQ, and/or the like.

Examples of the cyano group-containing compound are HAT-CN, a compound represented by Formula 221, and/or the like:

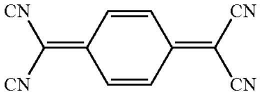

TCNQ

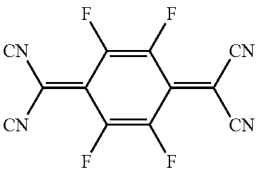

F4-TCNQ

-continued

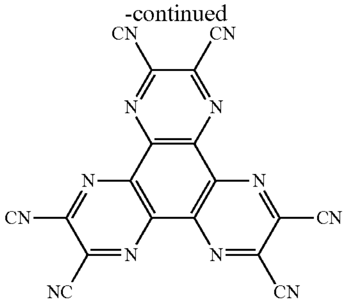

HAT-CN

Formula 221

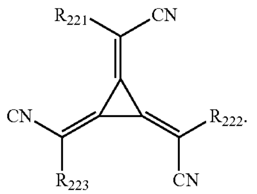

In Formula 221, $R_{221}$ to $R_{223}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, and at least one selected from among $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or any combination thereof; or any combination thereof.

In the compound including element EL1 and element EL2, element EL1 may be metal, metalloid, or any combination thereof, and element EL2 may be non-metal, metalloid, or any combination thereof.

Examples of the metal are: alkali metal (e.g., lithium (Li), sodium (Na), potassium (K), rubidium (Rb), cesium (Cs), and/or the like); alkaline earth metal (e.g., beryllium (Be), magnesium (Mg), calcium (Ca), strontium (Sr), barium (Ba), and/or the like); transition metal (e.g., titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), and/or the like); post-transition metal (e.g., zinc (Zn), indium (In), tin (Sn), and/or the like); lanthanide metal (e.g., lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), and/or the like); and/or the like.

Examples of the metalloid are silicon (Si), antimony (Sb), tellurium (Te), and/or the like.

Examples of the non-metal are oxygen (O), halogen (e.g., F, Cl, Br, I, and/or the like), and/or the like.

Examples of the compound including element EL1 and element EL2 are metal oxide, metal halide (e.g., metal fluoride, metal chloride, metal bromide, metal iodide, and/or the like), metalloid halide (e.g., metalloid fluoride, metalloid chloride, metalloid bromide, metalloid iodide, and/or the like), metal telluride, or any combination thereof.

Examples of the metal oxide are tungsten oxide (e.g., WO, $W_2O_3$, $WO_2$, $WO_3$, $W_2O_5$, and/or the like), vanadium oxide (e.g., VO, $V_2O_3$, $VO_2$, $V_2O_5$, and/or the like), molybdenum oxide (e.g., MoO, $Mo_2O_3$, $MoO_2$, $MoO_3$, $Mo_2O_5$, and/or the like), rhenium oxide (e.g., $ReO_3$, and/or the like), and/or the like.

Examples of the metal halide are alkali metal halide, alkaline earth metal halide, transition metal halide, post-transition metal halide, lanthanide metal halide, and/or the like.

Examples of the alkali metal halide are LiF, NaF, KF, RbF, CsF, LiCl, NaCl, KCl, RbCl, CsCl, LiBr, NaBr, KBr, RbBr, CsBr, LiI, NaI, KI, RbI, CsI, and/or the like.

Examples of the alkaline earth metal halide are $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, $BaI_2$, and/or the like.

Examples of the transition metal halide are titanium halide (e.g., $TiF_4$, $TiCl_4$, $TiBr_4$, $TiI_4$, and/or the like), zirconium halide (e.g., $ZrF_4$, $ZrCl_4$, $ZrBr_4$, $ZrI_4$, and/or the like), hafnium halide (e.g., $HfF_4$, $HfCl_4$, $HfBr_4$, $HfI_4$, and/or the like), vanadium halide (e.g., $VF_3$, $VCl_3$, $VBr_3$, $VI_3$, and/or the like), niobium halide (e.g., $NbF_3$, $NbCl_3$, $NbBr_3$, $NbI_3$, and/or the like), tantalum halide (e.g., $TaF_3$, $TaCl_3$, $TaBr_3$, $TaI_3$, and/or the like), chromium halide (e.g., $CrF_3$, $CrCl_3$, $CrBr_3$, $CrI_3$, and/or the like), molybdenum halide (e.g., $MoF_3$, $MoCl_3$, $MoBr_3$, $MoI_3$, and/or the like), tungsten halide (e.g., $WF_3$, $WCl_3$, $WBr_3$, $WI_3$, and/or the like), manganese halide (e.g., $MnF_2$, $MnCl_2$, $MnBr_2$, $MnI_2$, and/or the like), technetium halide (e.g., $TcF_2$, $TcCl_2$, $TcBr_2$, $TcI_2$, and/or the like), rhenium halide (e.g., $ReF_2$, $ReCl_2$, $ReBr_2$, $ReI_2$, and/or the like), iron halide (e.g., $FeF_2$, $FeCl_2$, $FeBr_2$, $FeI_2$, and/or the like), ruthenium halide (e.g., $RuF_2$, $RuCl_2$, $RuBr_2$, $RuI_2$, and/or the like), osmium halide (e.g., $OsF_2$, $OsCl_2$, $OsBr_2$, $OsI_2$, and/or the like), cobalt halide (e.g., $CoF_2$, $CoCl_2$, $CoBr_2$, $CoI_2$, and/or the like), rhodium halide (e.g., $RhF_2$, $RhCl_2$, $RhBr_2$, $RhI_2$, and/or the like), iridium halide (e.g., $IrF_2$, $IrCl_2$, $IrBr_2$, $IrI_2$, and/or the like), nickel halide (e.g., $NiF_2$, $NiCl_2$, $NiBr_2$, $NiI_2$, and/or the like), palladium halide (e.g., $PdF_2$, $PdCl_2$, $PdBr_2$, $PdI_2$, and/or the like), platinum halide (e.g., $PtF_2$, $PtCl_2$, $PtBr_2$, $PtI_2$, and/or the like), copper halide (e.g., CuF, CuCl, CuBr, CuI, and/or the like), silver halide (e.g., AgF, AgCl, AgBr, AgI, and/or the like), gold halide (e.g., AuF, AuCl, AuBr, AuI, and/or the like), and/or the like.

Examples of the post-transition metal halide are zinc halide (e.g., $ZnF_2$, $ZnCl_2$, $ZnBr_2$, $ZnI_2$, and/or the like), indium halide (e.g., $InI_3$, and/or the like), tin halide (e.g., $SnI_2$, and/or the like), and/or the like.

Examples of the lanthanide metal halide are YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, $SmI_3$, and/or the like.

Examples of the metalloid halide are antimony halide (e.g., $SbCl_5$, and/or the like) and/or the like.

Examples of the metal telluride are alkali metal telluride (e.g., $Li_2Te$, $Na_2Te$, $K_2Te$, $Rb_2Te$, $Cs_2Te$, and/or the like), alkaline earth metal telluride (e.g., BeTe, MgTe, CaTe, SrTe, BaTe, and/or the like), transition metal telluride (e.g., $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, and/or the like), post-transition metal telluride (e.g., ZnTe, and/or the like), lanthanide metal telluride (e.g., LaTe, CeTe, PrTe, NdTe, PmTe, EuTe, GdTe, TbTe, DyTe, HoTe, ErTe, TmTe, YbTe, LuTe, and/or the like), and/or the like.

Emission Layer in Interlayer 130

When the light-emitting device 10 is a full-color light-emitting device, the emission layer may be patterned into a red emission layer, a green emission layer, and/or a blue emission layer, according to a sub-pixel. In one or more embodiments, the emission layer may have a stacked structure of two or more layers of a red emission layer, a green emission layer, and a blue emission layer, in which the two or more layers contact each other or are separated from each other, to emit white light. In one or more embodiments, the emission layer may include two or more materials of a red light-emitting material, a green light-emitting material, and a blue light-emitting material, in which the two or more materials are mixed with each other in a single layer, to emit white light.

In one or more embodiments, the emission layer may include a host and a dopant (or emitter). In one or more embodiments, the emission layer may further include an auxiliary dopant that promotes energy transfer to a dopant (or emitter), in addition to the host and the dopant (or emitter). When the emission layer includes the dopant (or emitter) and the auxiliary dopant, the dopant (or emitter) and the auxiliary dopant are different from each other.

An amount (weight) of the dopant (or emitter) in the emission layer may be in a range of about 0.01 parts by weight to about 15 parts by weight based on 100 parts by weight of the host.

In one or more embodiments, the emission layer may include quantum dots.

In one or more embodiments, the emission layer may include a delayed fluorescence material. The delayed fluorescence material may act as a host or a dopant in the emission layer.

In Formula 301, $Ar_{301}$ and $L_{301}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $—Si(Q_{301})(Q_{302})(Q_{303})$, $—N(Q_{301})(Q_{302})$, $—B(Q_{301})(Q_{302})$, $—C(=O)(Q_{301})$, $—S(=O)_2(Q_{301})$, or $—P(=O)(Q_{301})(Q_{302})$, xb21 may be an integer from 1 to 5, and $Q_{301}$ to $Q_{303}$ may each be the same as described in connection with $Q_1$.

For example, when xb11 in Formula 301 is 2 or more, two or more of $Ar_{301}$ may be linked to each other via a single bond.

In one or more embodiments, the host may include a compound represented by Formula 301-1, a compound represented by Formula 301-2, or any combination thereof:

Formula 301-1

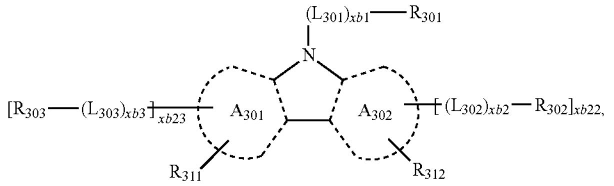

Formula 301-2

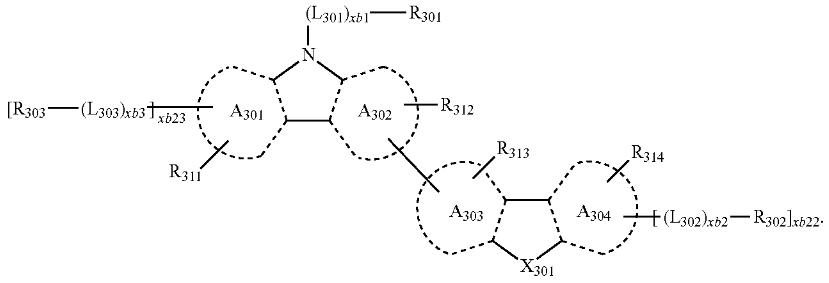

A thickness of the emission layer may be in a range of about 100 Å to about 1,000 Å, for example, about 200 Å to about 600 Å. When the thickness of the emission layer is within these ranges, excellent or suitable luminescence characteristics may be obtained without a substantial increase in driving voltage.

Host

In one or more embodiments, the host may include a compound represented by Formula 301:

$$[Ar_{301}]_{xb11}\text{-}[(L_{301})_{xb1}\text{-}R_{301}]_{xb21}. \qquad \text{Formula 301}$$

In Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-$[(L_{304})_{xb4}$-$R_{304}]$, $C(R_{304})(R_{305})$, or $Si(R_{304})(R_{305})$, xb22 and xb23 may each independently be 0, 1, or 2, $L_{301}$, xb1, and $R_{301}$ may each be the same as described herein, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ may each be the same as described in connection with $R_{301}$.

In one or more embodiments, the host may include an alkali earth metal complex, a post-transition metal complex, or any combination thereof. In one or more embodiments, the host may include a Be complex (e.g., Compound H55), a Mg complex, a Zn complex, or any combination thereof.

In one or more embodiments, the host may include: at least one selected from among Compounds H1 to H128; 9,10-di(2-naphthyl)anthracene (ADN); 2-methyl-9,10-bis (naphthalen-2-yl)anthracene (MADN); 9,10-di(2-naphthyl)-2-t-butyl-anthracene (TBADN); 4,4'-bis(N-carbazolyl)-1,1'-biphenyl (CBP); 1,3-di-9-carbazolylbenzene (mCP); 1,3,5-tri(carbazol-9-yl)benzene (TCP); and/or any combination thereof:

H1

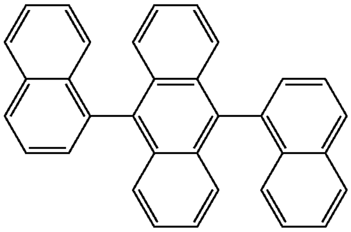

H2

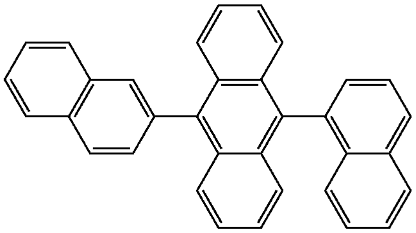

H3

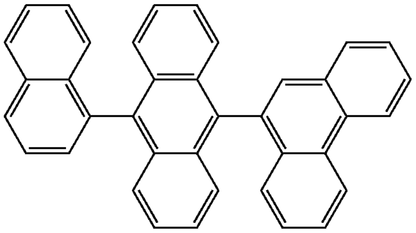

H4

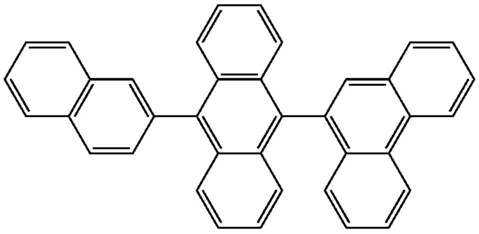

-continued

H5

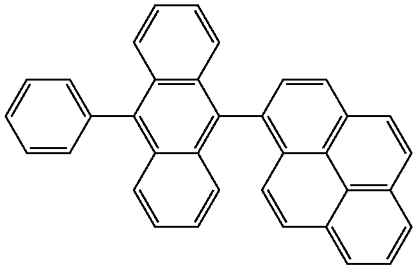

H6

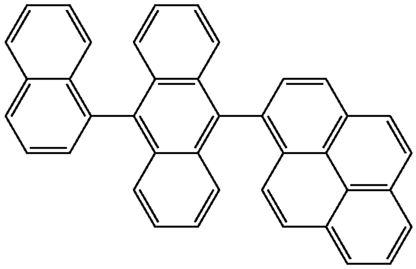

H7

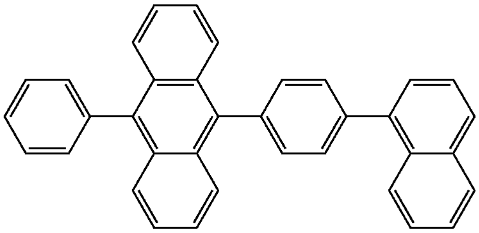

H8

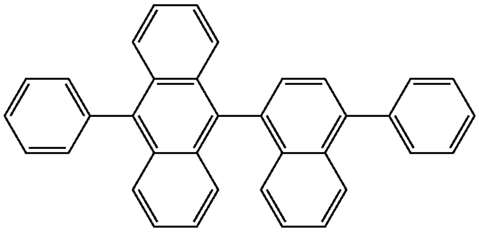

H9

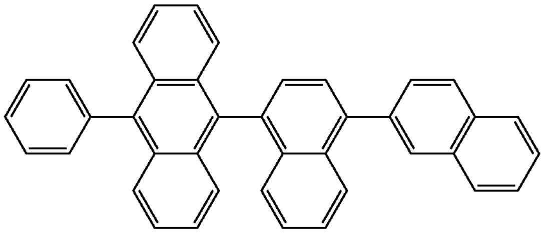

H10

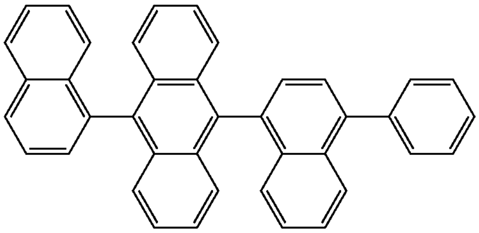

-continued
H11
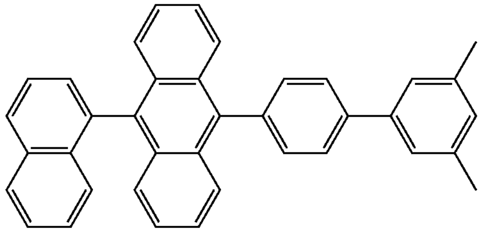
H12
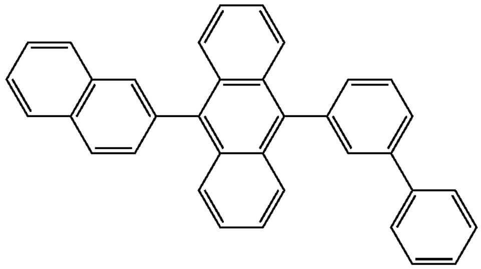
H13
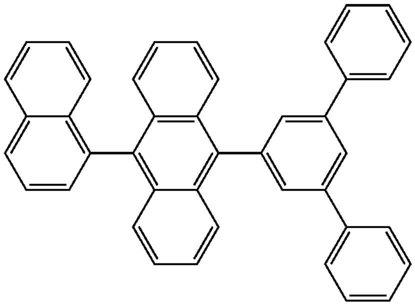
H14
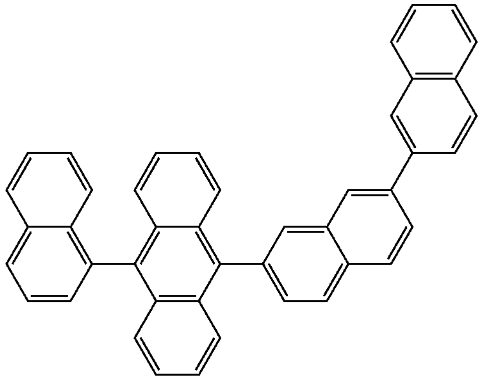
H15
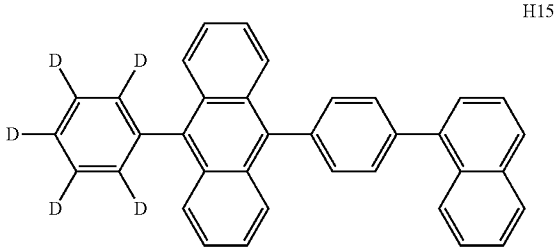
-continued
H16
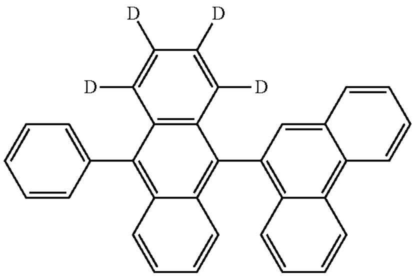
H17
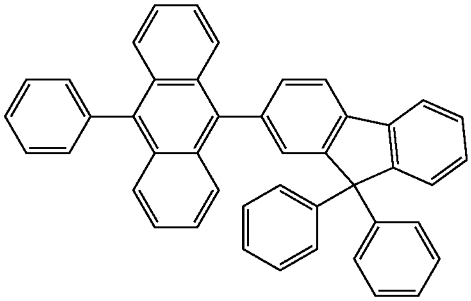
H18
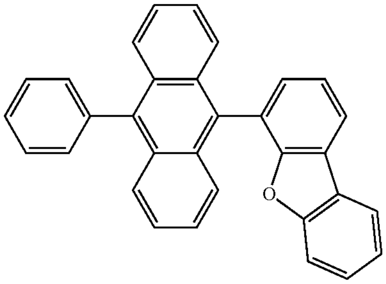
H19
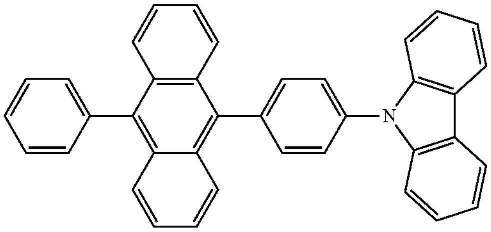
H20
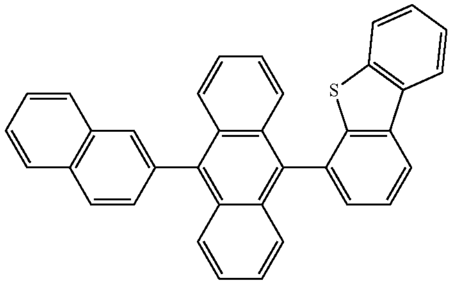

-continued
H21
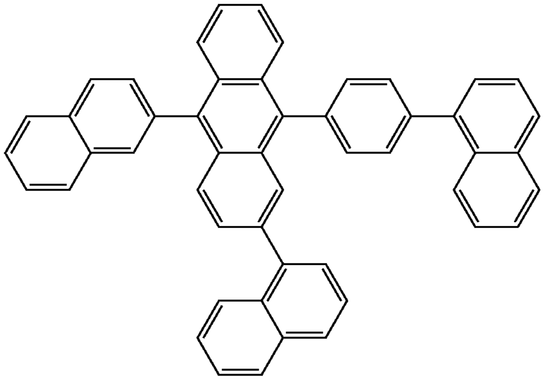
H22
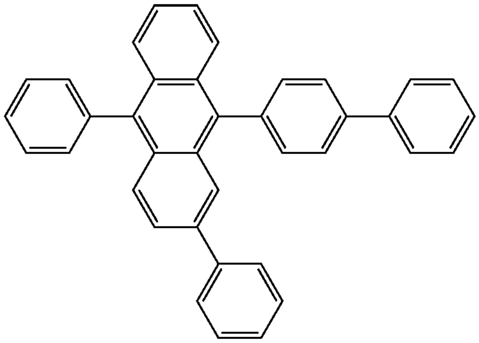
H23
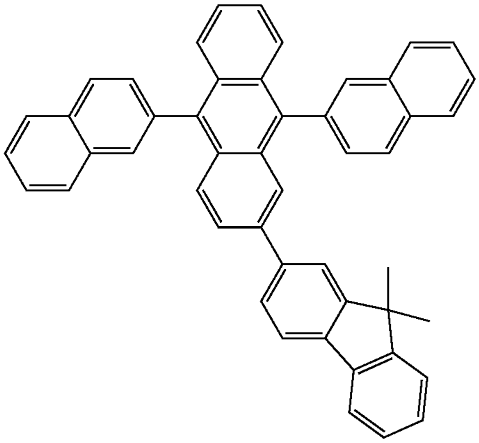
H24
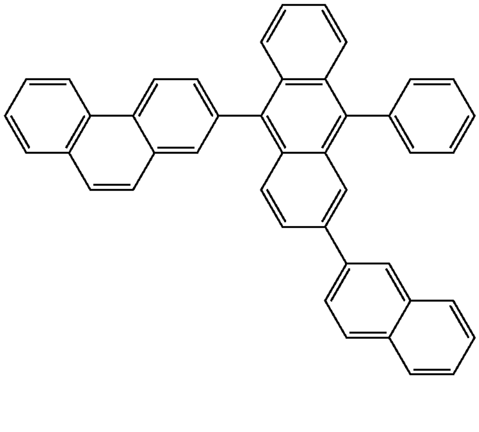
-continued
H25
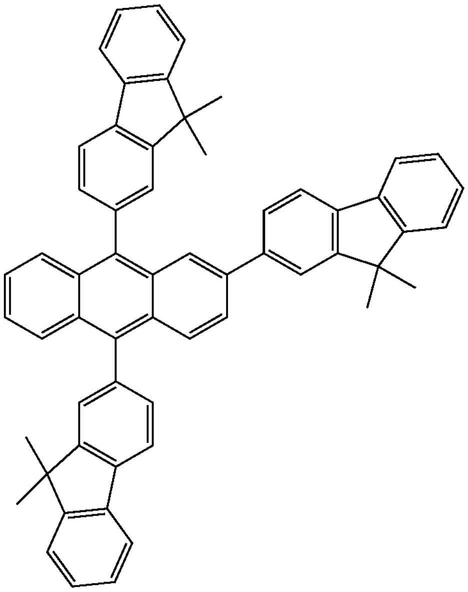
H26
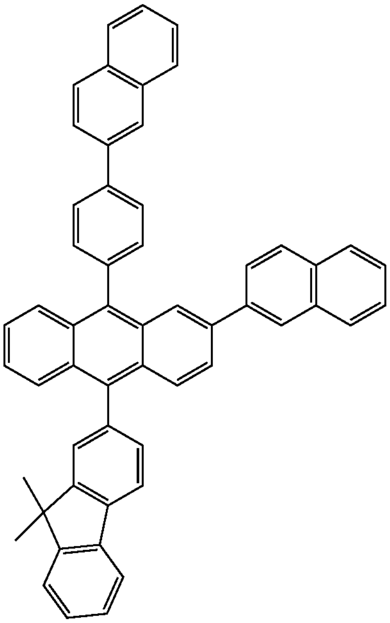

-continued
H27
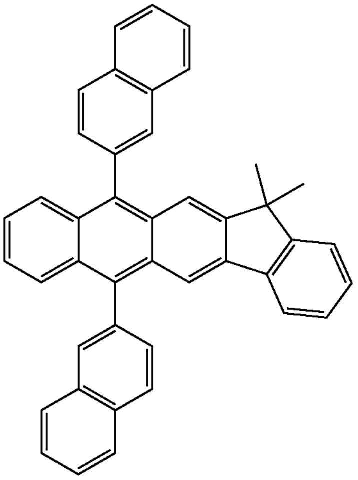
H28
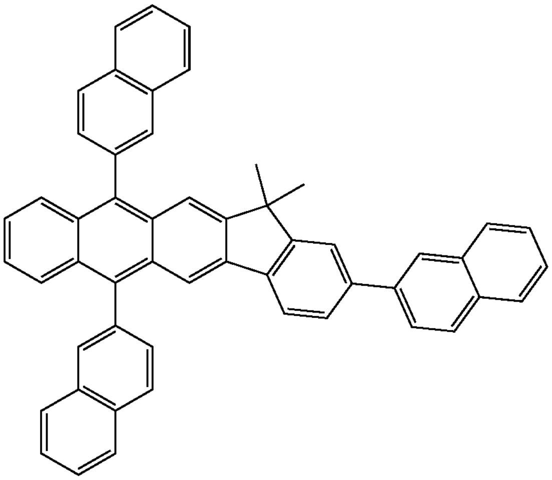
H29
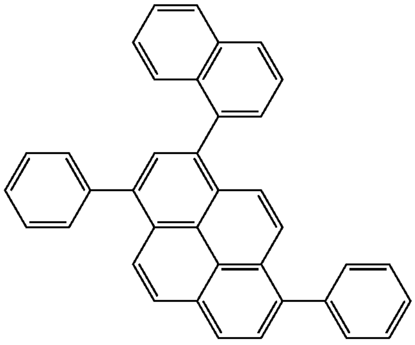
-continued
H30
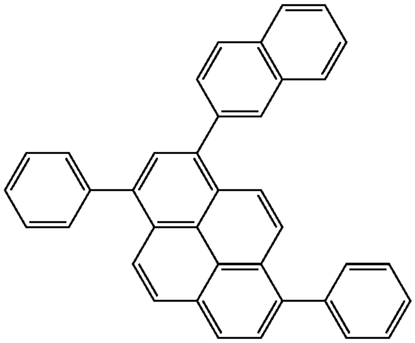
H31
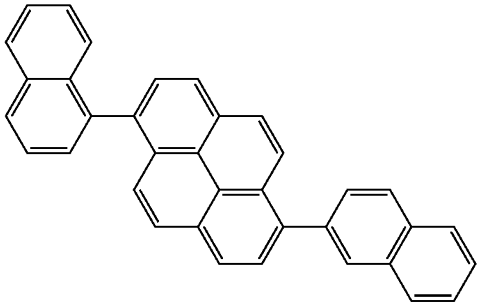
H32
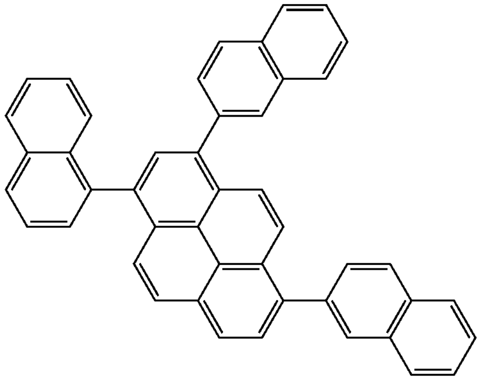
H33
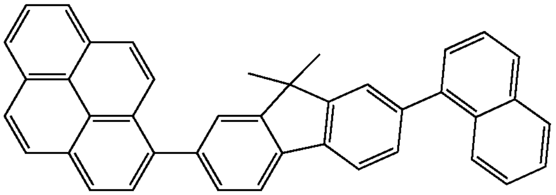
H34
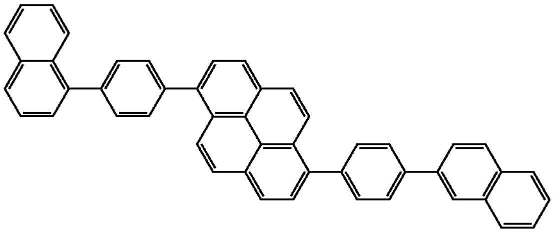

-continued
H35
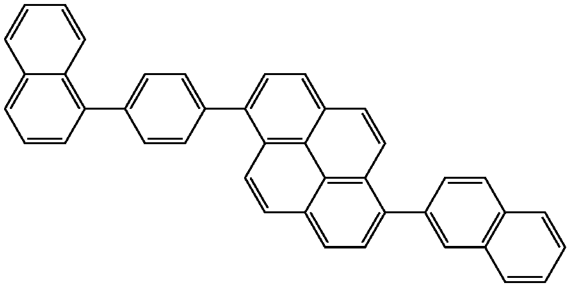
H36
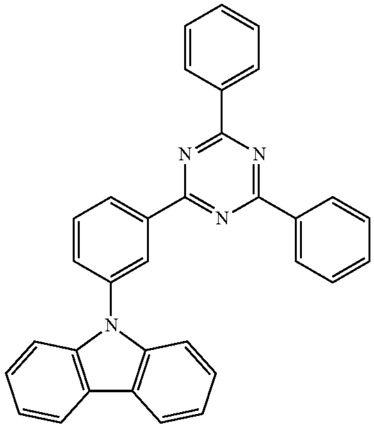
H37
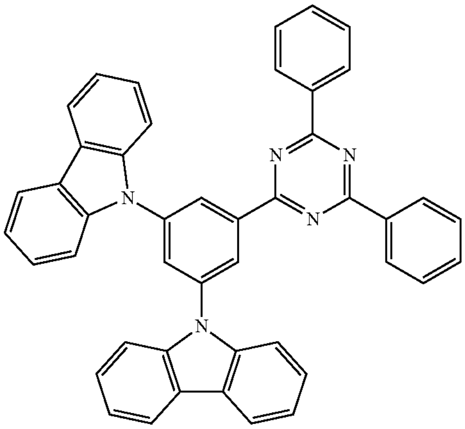
H38
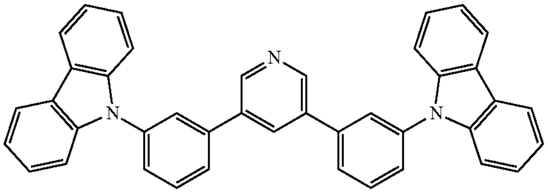
-continued
H39
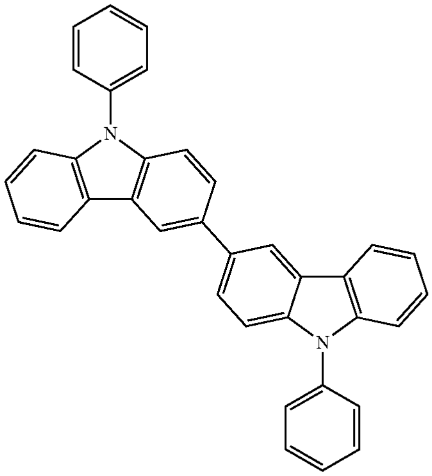
H40
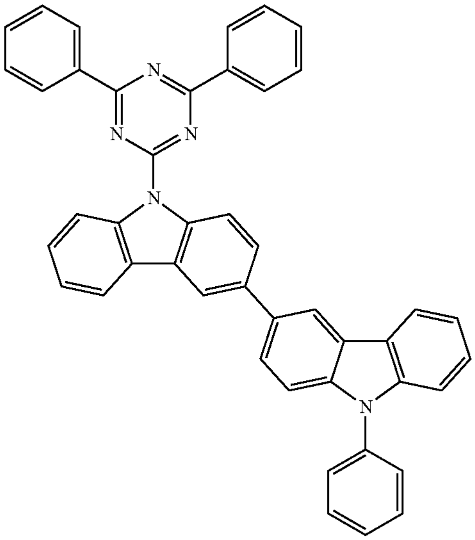
H41
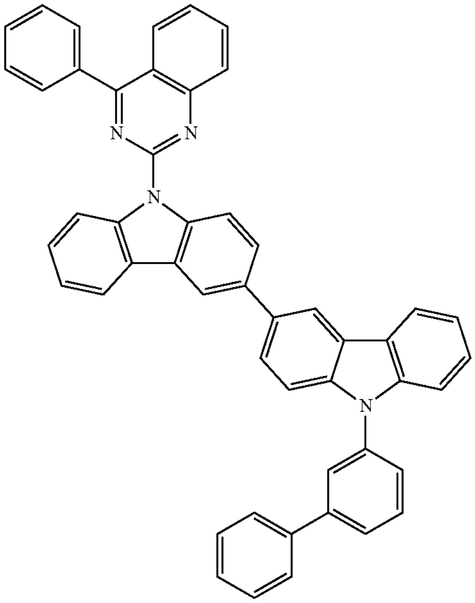

-continued
H42
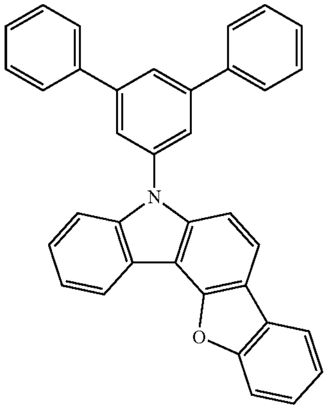
H43
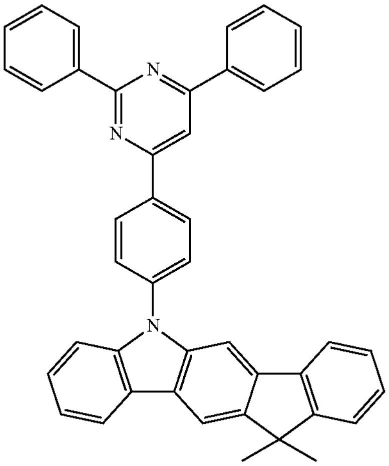
H44
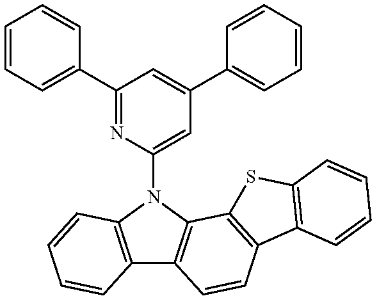
H45
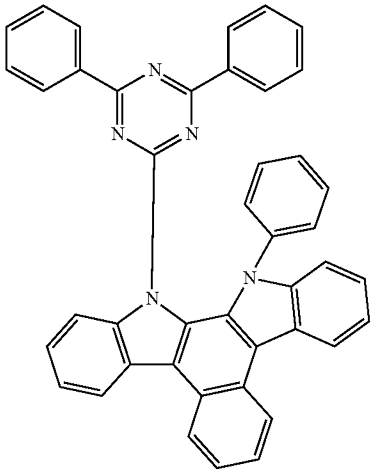
-continued
H46
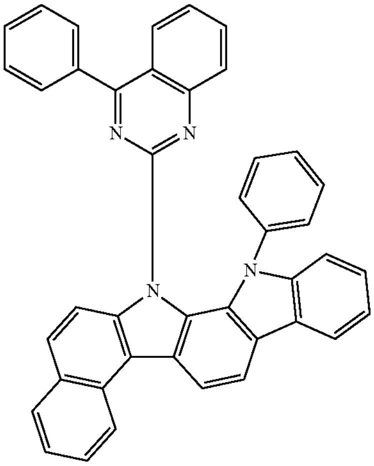
H47
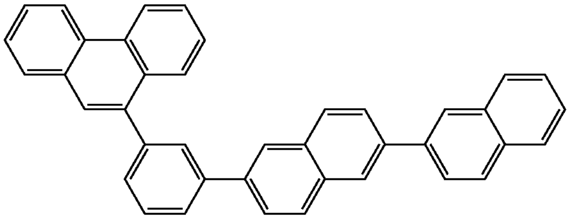
H48
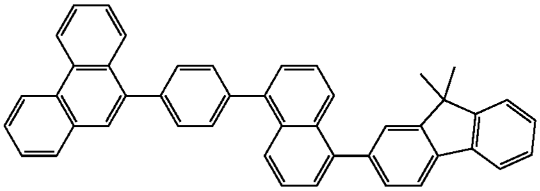
H49
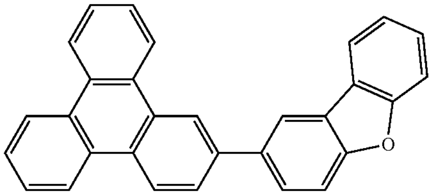
H50
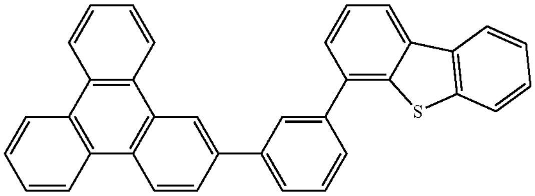
H51
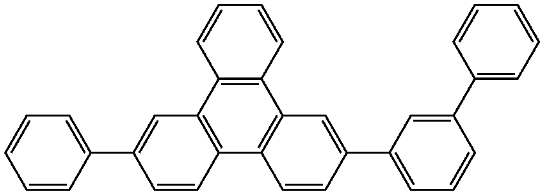

-continued
H52
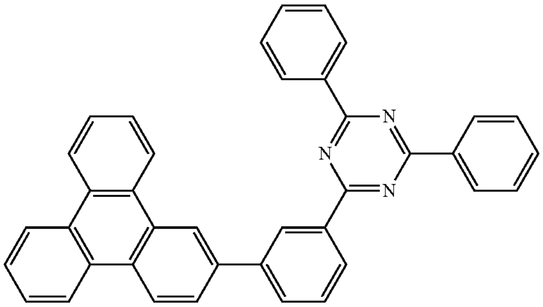
H53
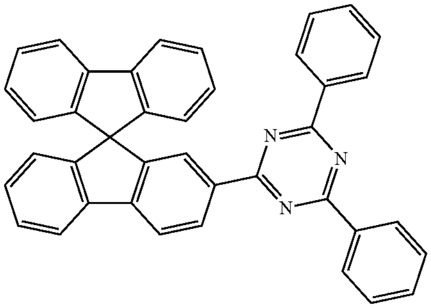
H54
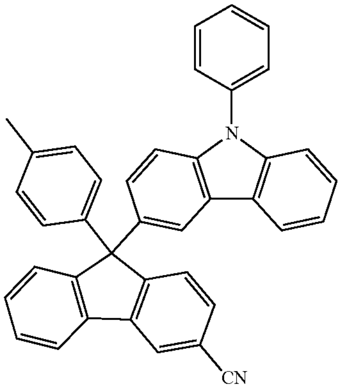
H55
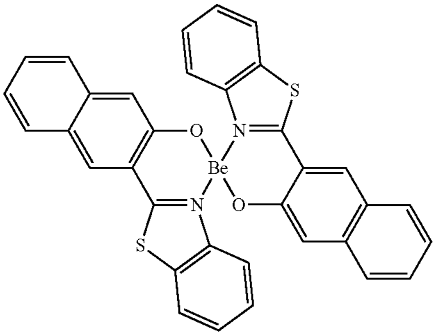
-continued
H56
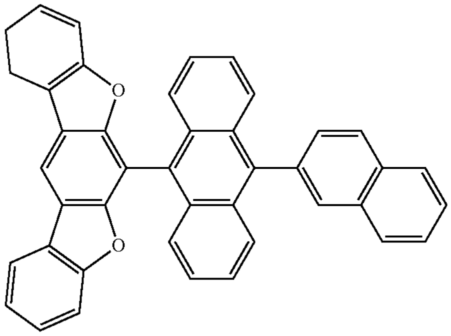
H57
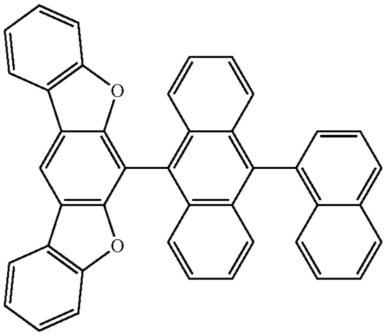
H58
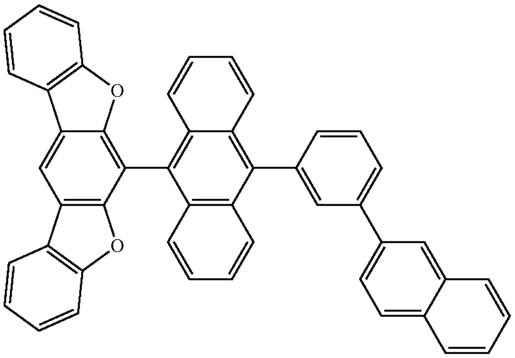
H59
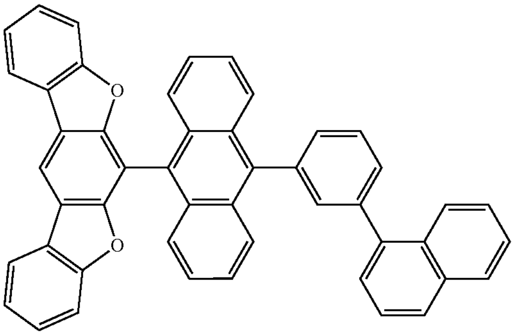

-continued
H60
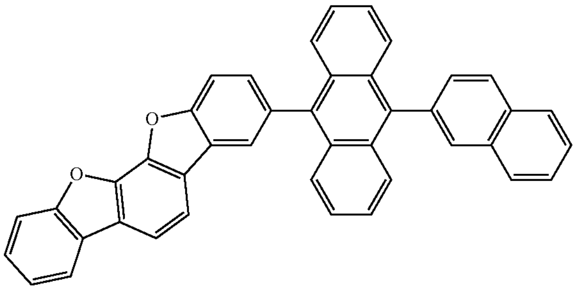
H61
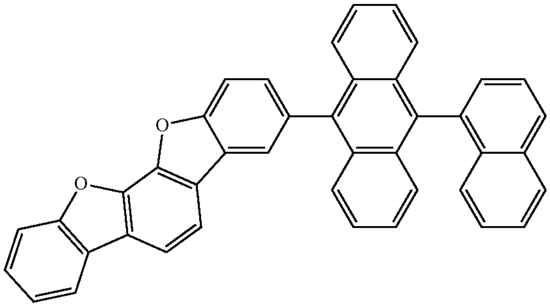
H62
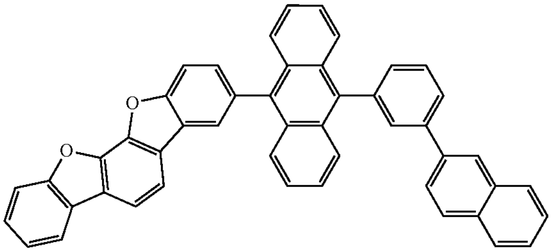
H63
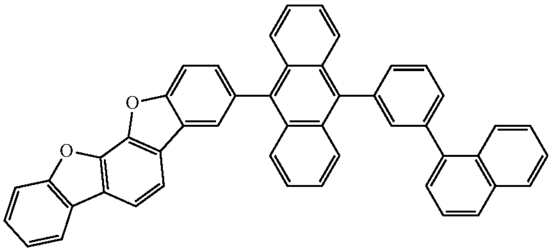
H64
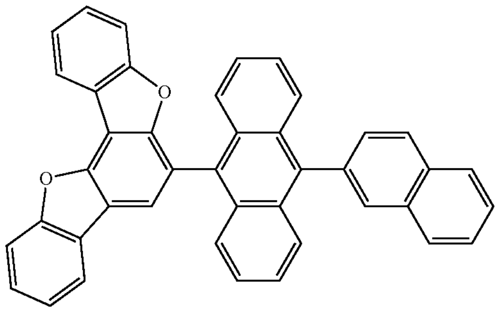
-continued
H65
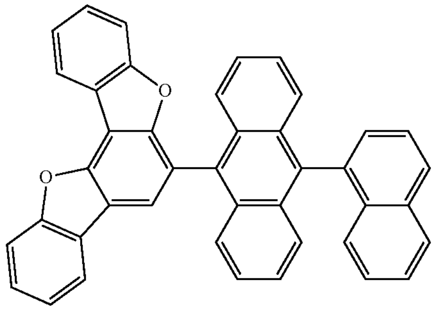
H66
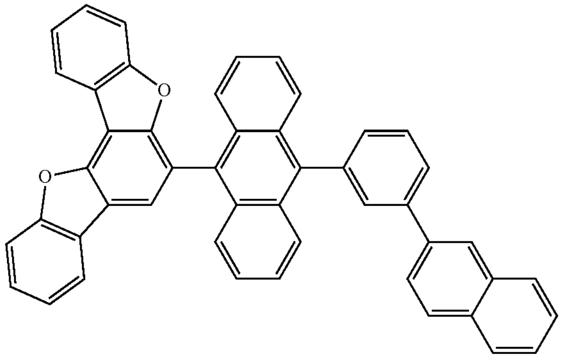
H67
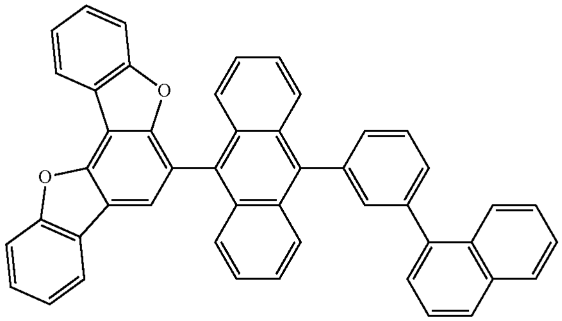
H68
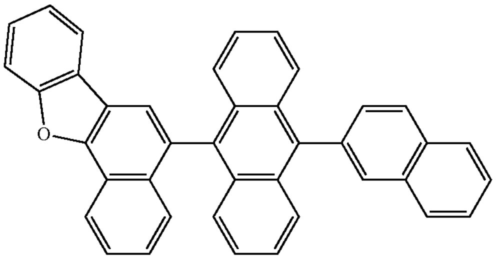
H69
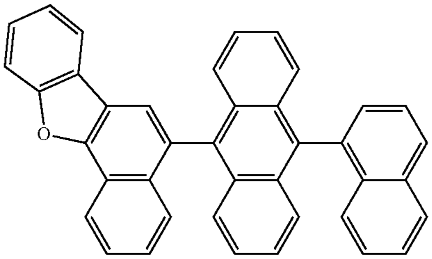

-continued
H70
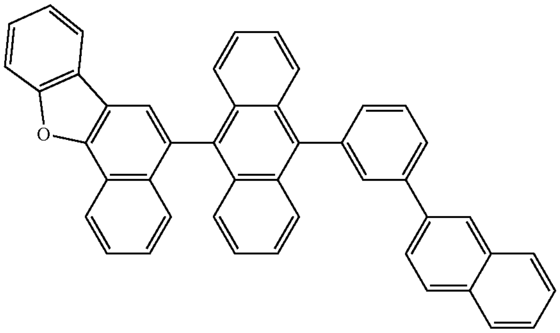
H71
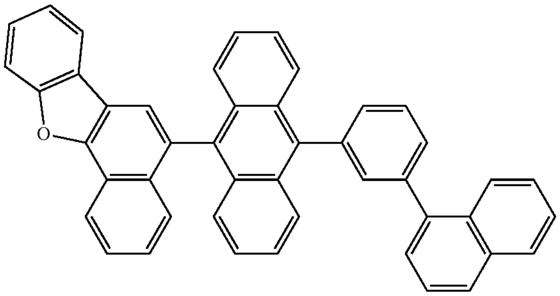
H72
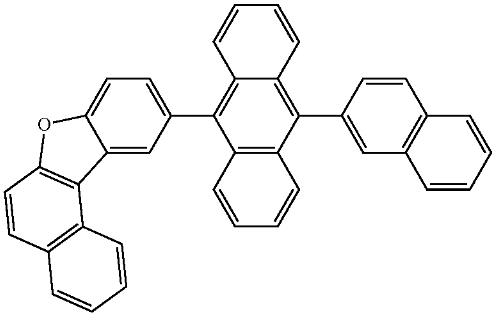
H73
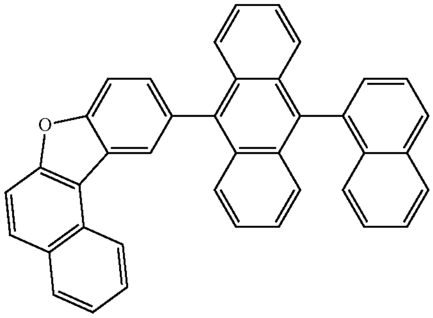
-continued
H74
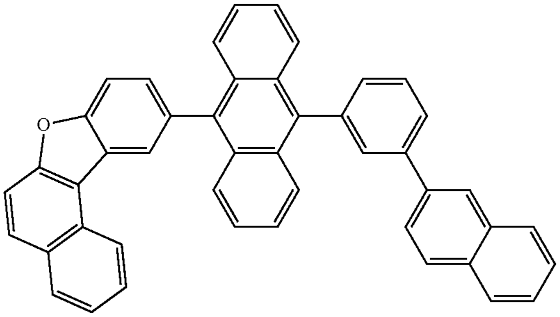
H75
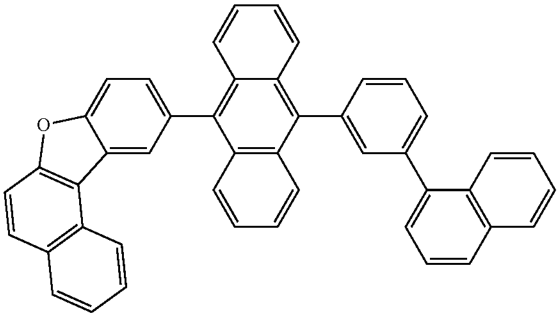
H76
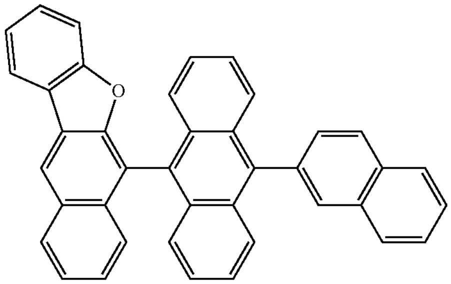
H77
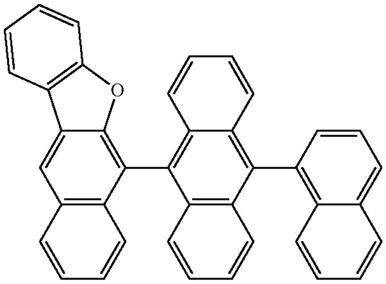
H78
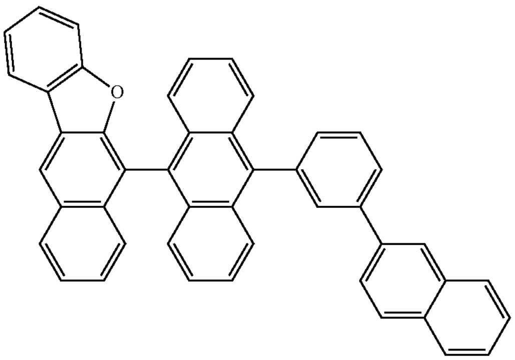

-continued
H79
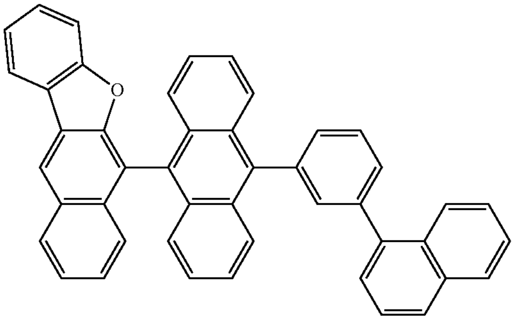
H80
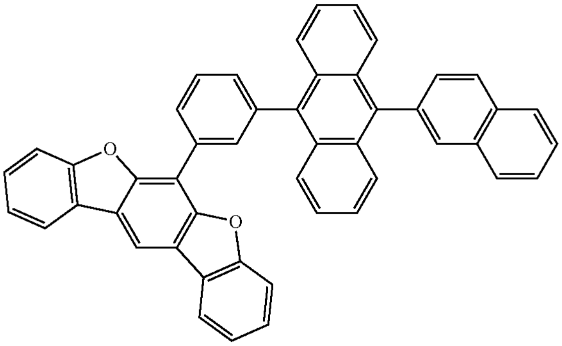
H81
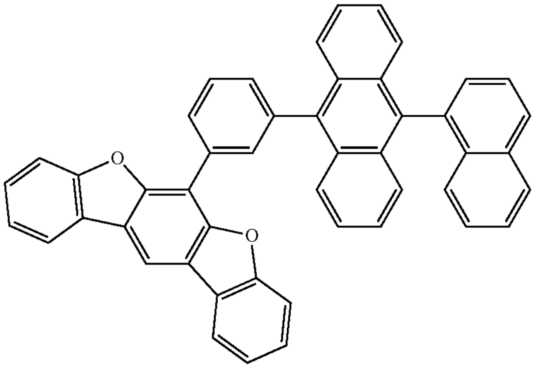
H82
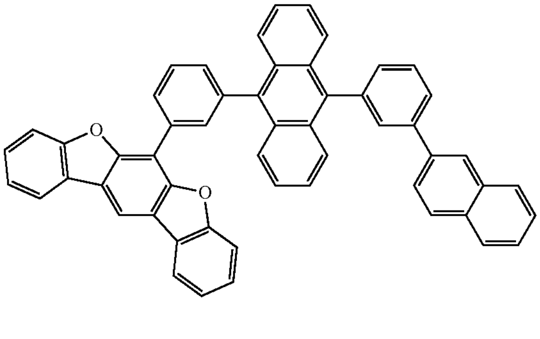
-continued
H83
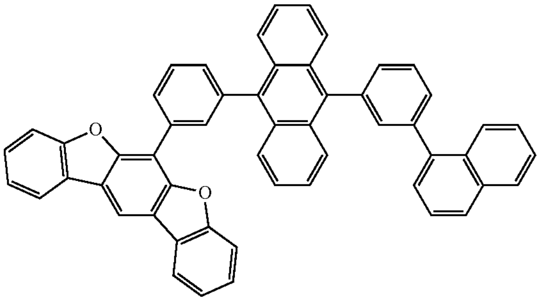
H84
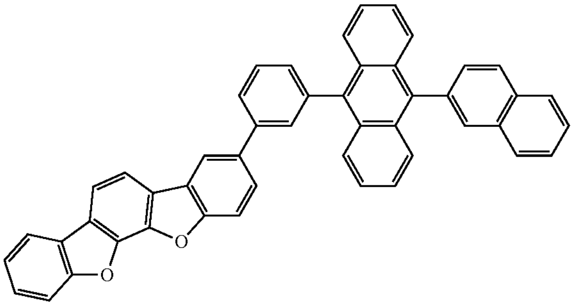
H85
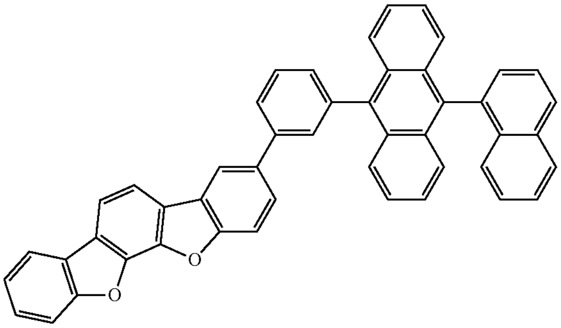
H86
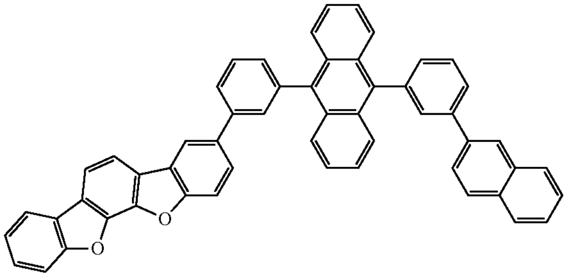
H87
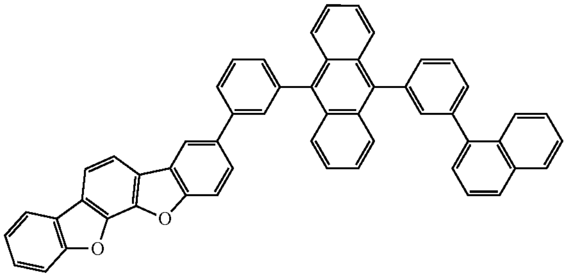

-continued
H88
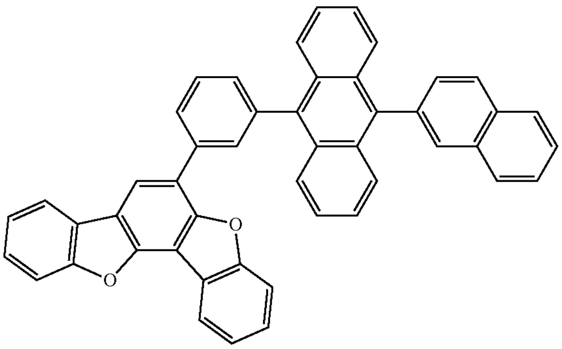
H89
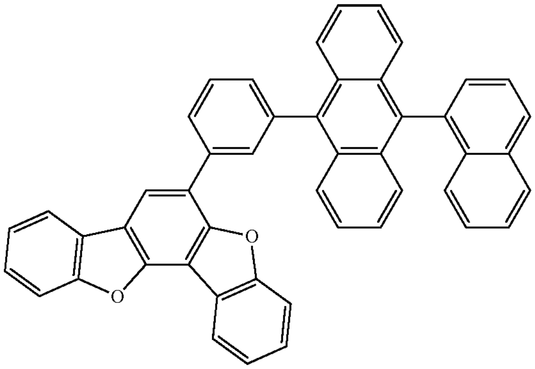
H90
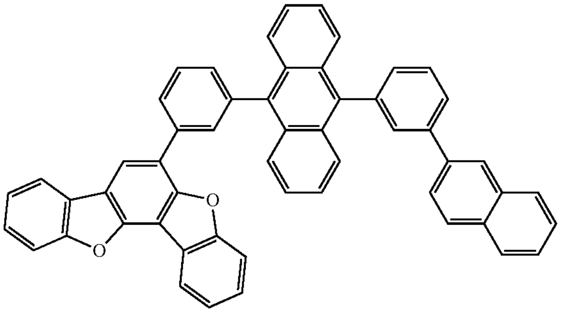
H91
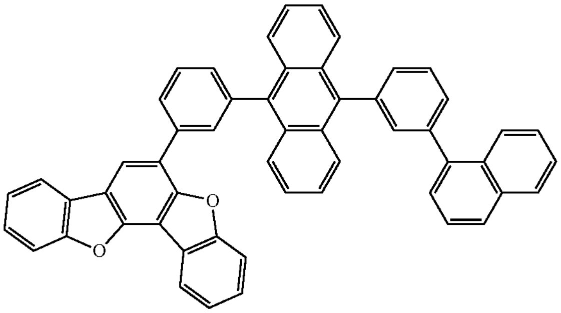
-continued
H92
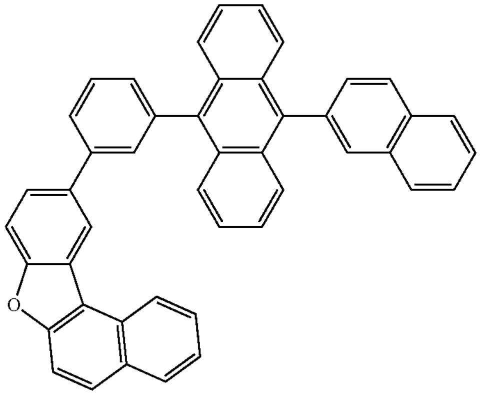
H93
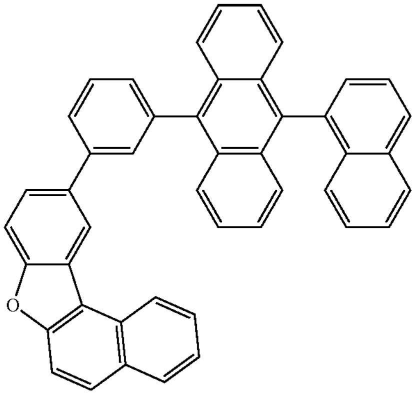
H94
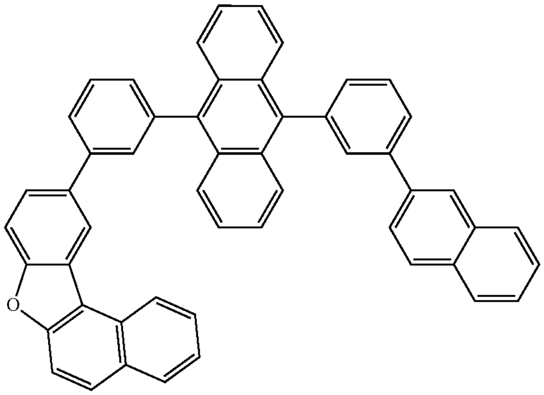
H95
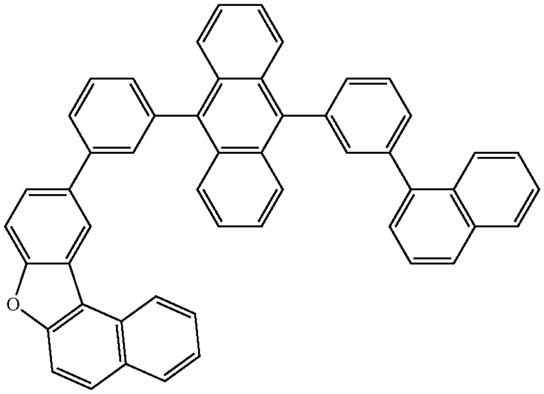

-continued
H96
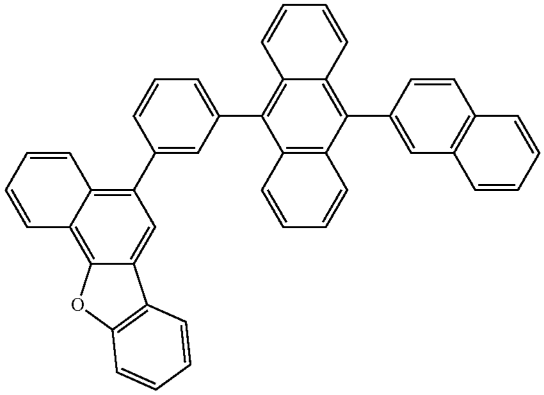
H97
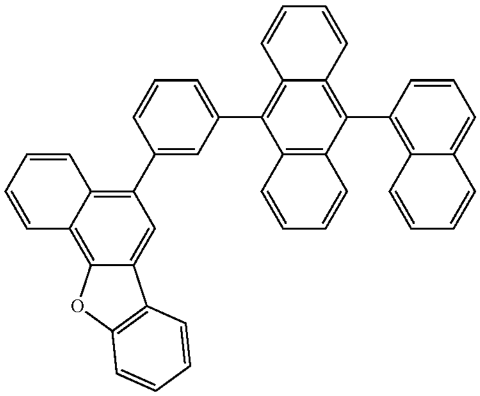
H98
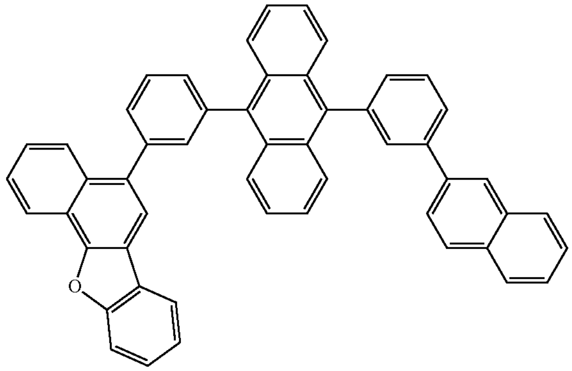
H99
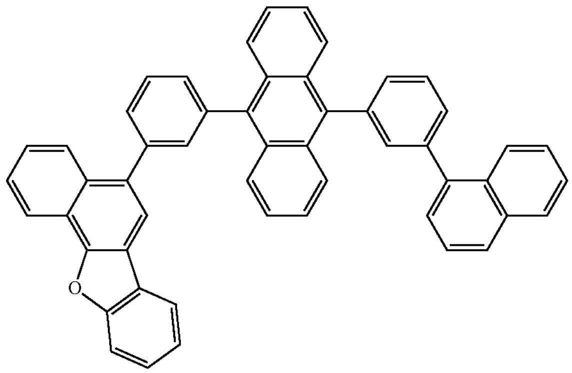
-continued
H100
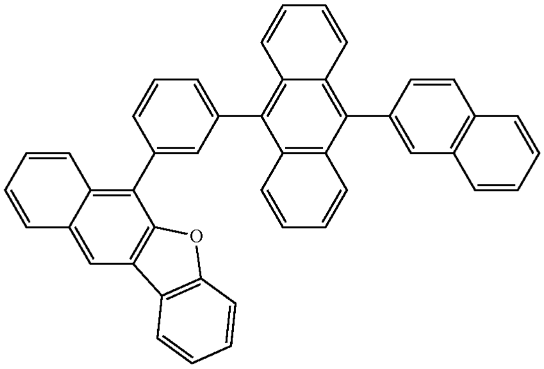
H101
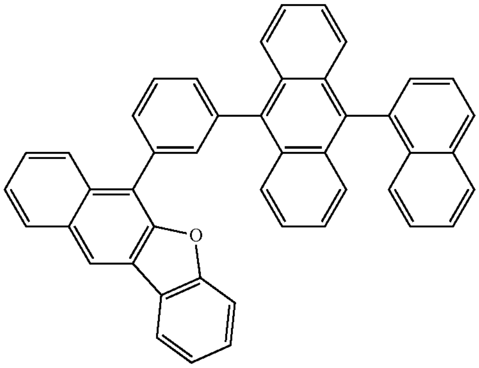
H102
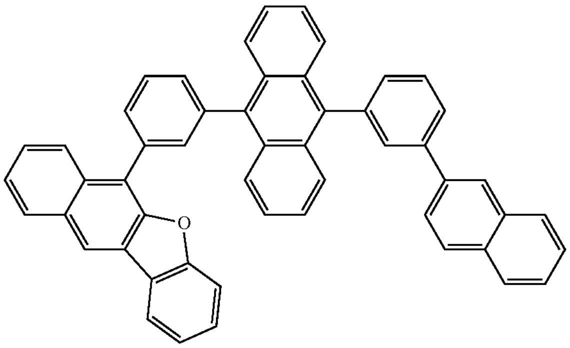
H103
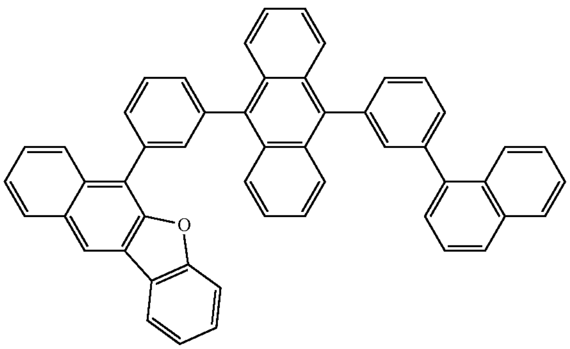

-continued
H104
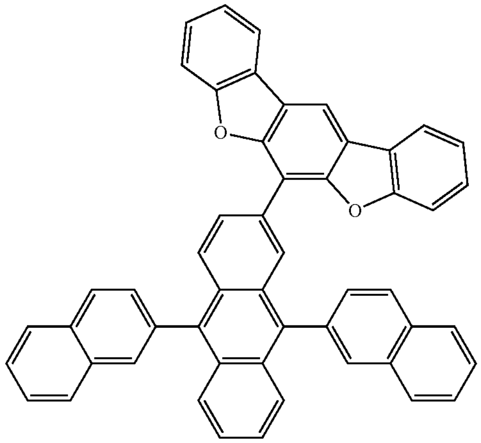
H105
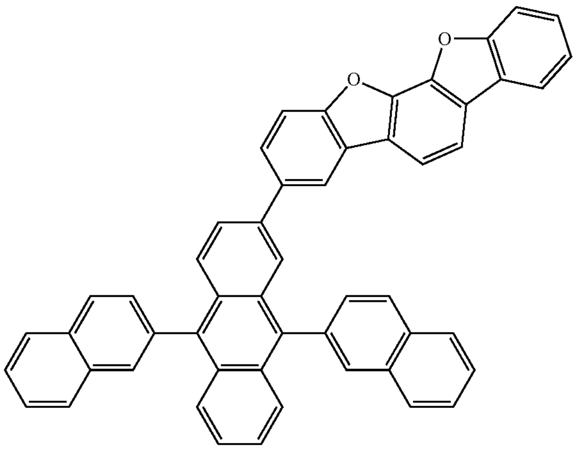
H106
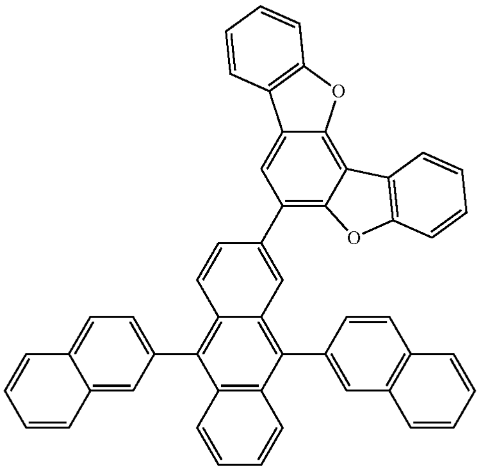
-continued
H107
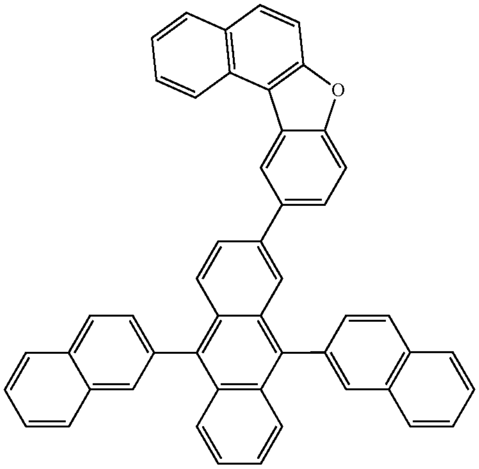
H108
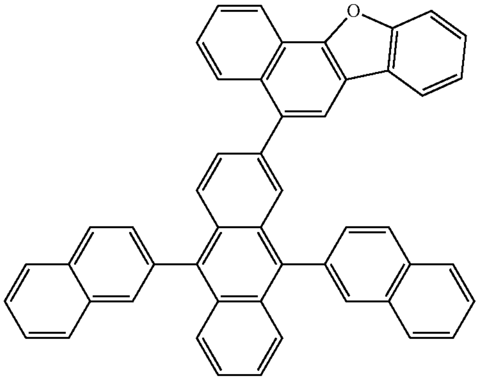
H109
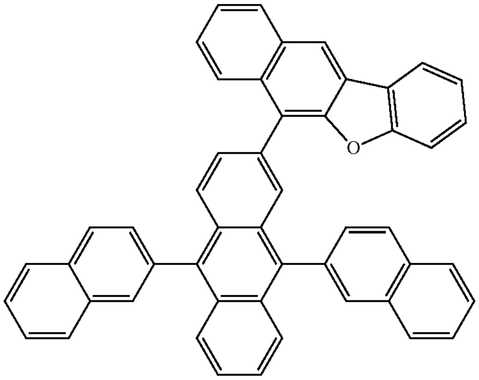
H110
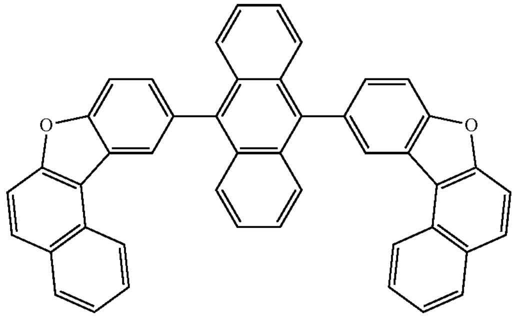

-continued
H111
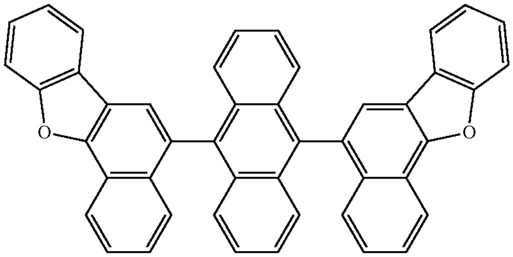
H112
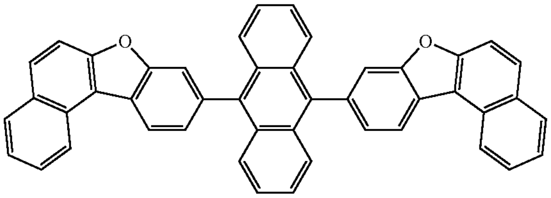
H113
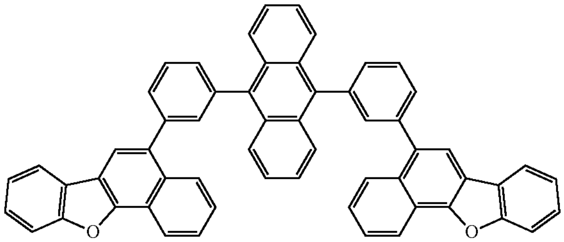
H114
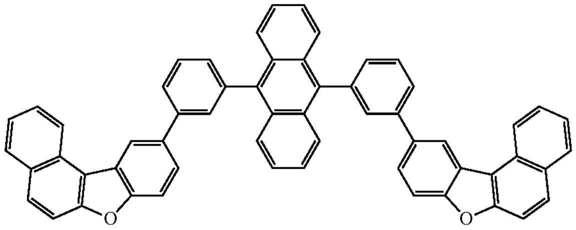
H115
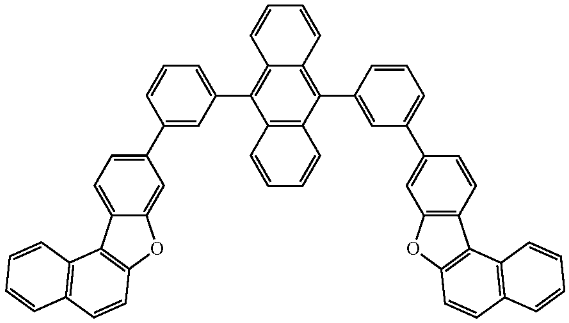
-continued
H116
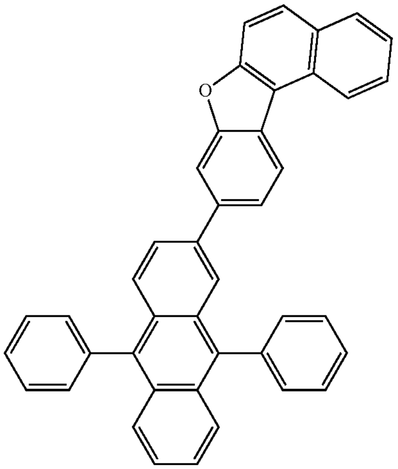
H117
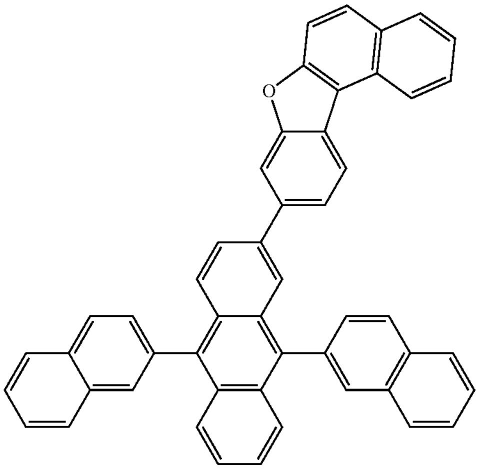
H118
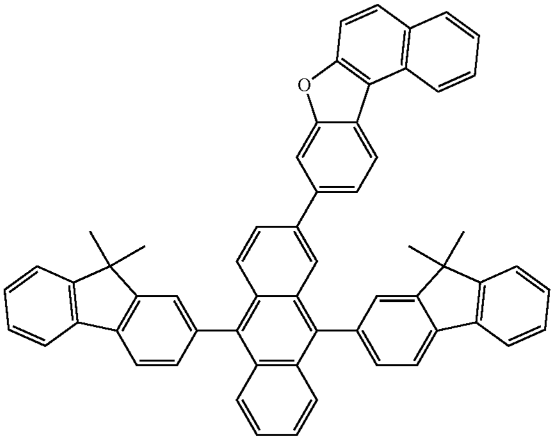

-continued
H119
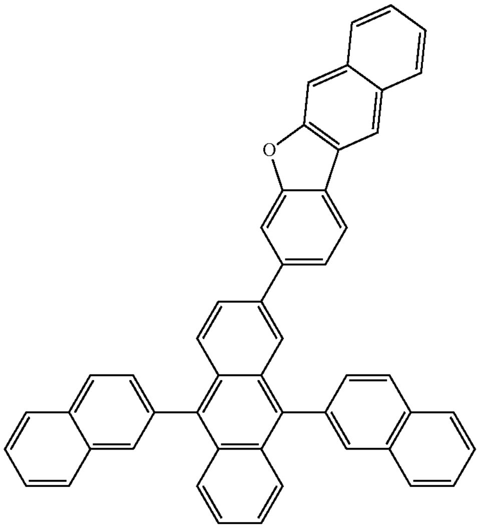
H120
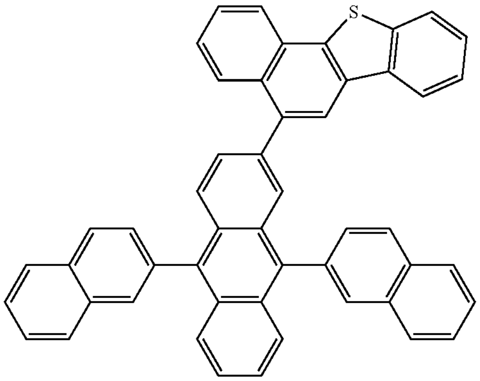
H121
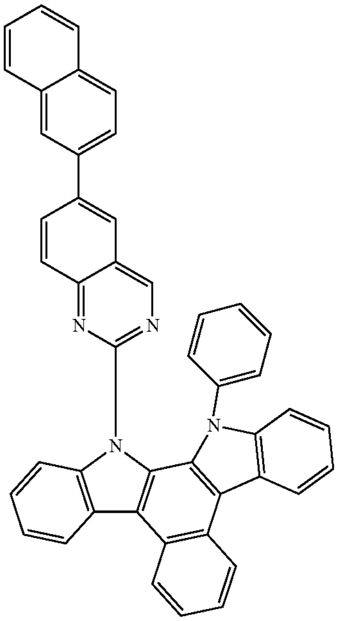
-continued
H122
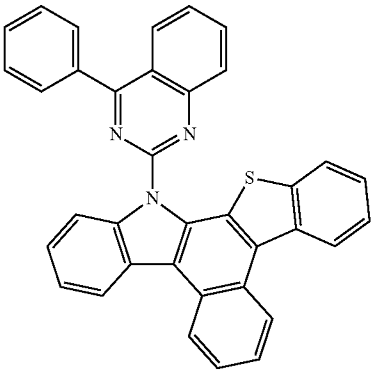
H123
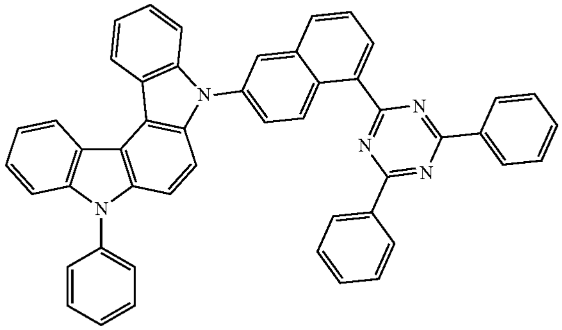
H124
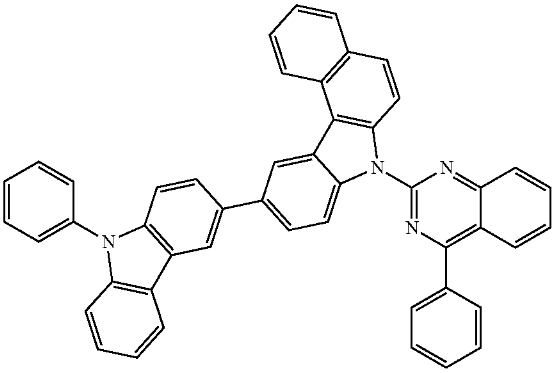
H125
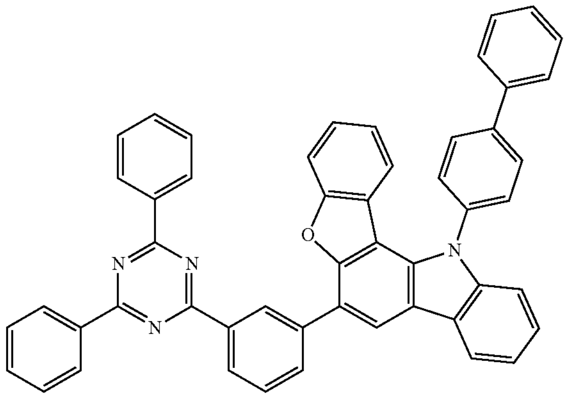

-continued

H126

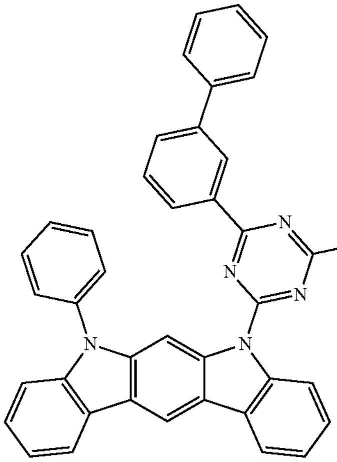

H127

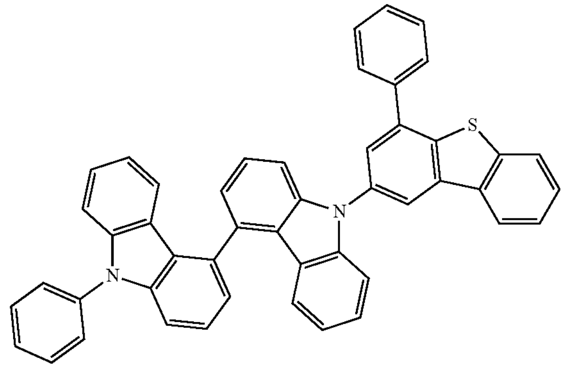

H128

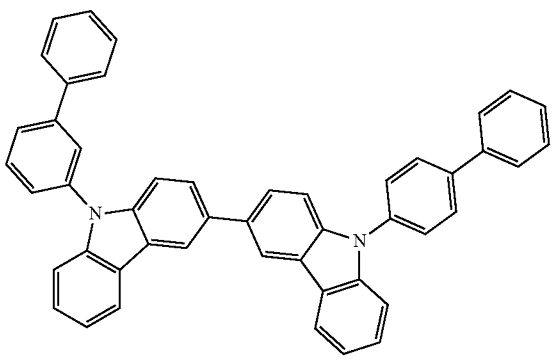

In one or more embodiments, the host may include a silicon-containing compound, a phosphine oxide-containing compound, or any combination thereof.

The host may have one or more suitable modifications. For example, the host may include only one kind of compound, or may include two or more kinds of different compounds.

Phosphorescent Dopant

The emission layer may include a phosphorescent dopant.

The phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

For example, the phosphorescent dopant may include an organometallic compound represented by Formula 401:

$$M(L_{401})_{xc1}(L_{402})_{xc2}$$ Formula 401

Formula 402

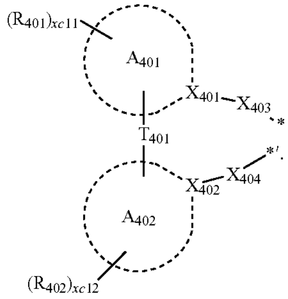

In Formulae 401 and 402,

M may be a transition metal (e.g., iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein, when xc1 is 2 or more, two or more of $L_{401}$ may be identical to or different from each other, $L_{402}$ may be an organic ligand, and xc2 may be 0, 1, 2, 3, or 4, wherein, when xc2 is 2 or more, two or more of $L_{402}$ may be identical to or different from each other, $X_{401}$ and $X_{402}$ may each independently be N or C, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C($Q_{411}$)=*', $X_{403}$ and $X_{404}$ may each independently be a chemical bond (e.g., a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each be the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each be the same as described in connection with $Q_1$, xc11 and xc12 may each independently be an integer from 0 to 10, and

* and *' in Formula 402 each indicate a binding site to M in Formula 401.

For example, in Formula 402, i) $X_{401}$ may be nitrogen and $X_{402}$ may be carbon, or ii) each of $X_{401}$ and $X_{402}$ may be nitrogen.

In one or more embodiments, when xc1 in Formula 401 is 2 or more, two ring $A_{401}$(s) among two or more selected from $L_{401}$ may optionally be linked to each other via $T_{402}$, which is a linking group, and two ring $A_{402}$(s) among two or more selected from $L_{401}$ may optionally be linked to each other via $T_{403}$, which is a linking group (see Compounds PD1 to PD4 and PD7). $T_{402}$ and $T_{403}$ may each be as described in connection with $T_{401}$.

In Formula 401, $L_{402}$ may be an organic ligand. For example, $L_{402}$ may include a halogen group, a diketone group (e.g., an acetylacetonate group), a carboxylic acid group (e.g., a picolinate group), —C(═O), an isonitrile group, —CN group, a phosphorus group (e.g., a phosphine group, a phosphite group, and/or the like), or any combination thereof.

The phosphorescent dopant may include, for example, one selected from among Compounds PD1 to PD39, and/or any combination thereof:

PD1

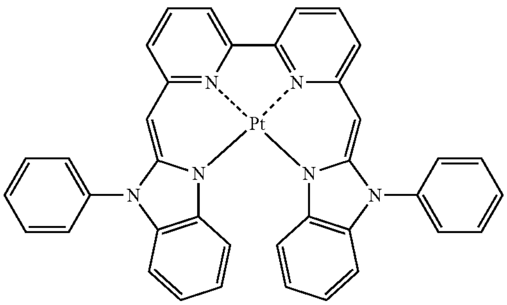

PD2

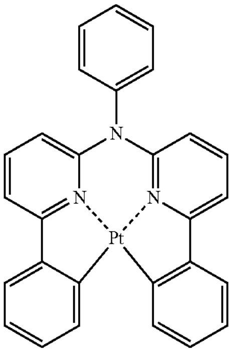

PD3

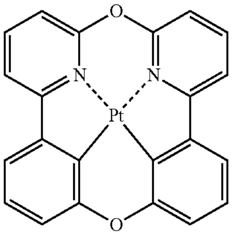

PD4

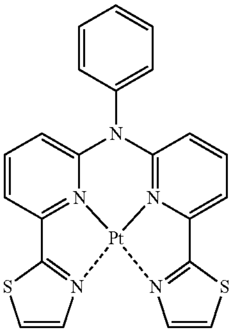

-continued

PD5

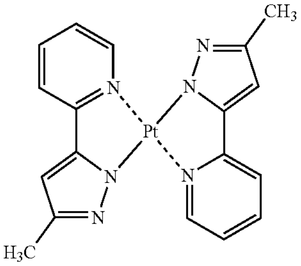

PD6

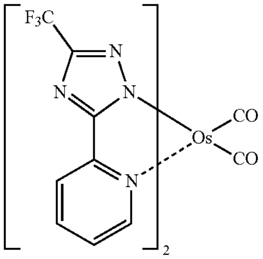

PD7

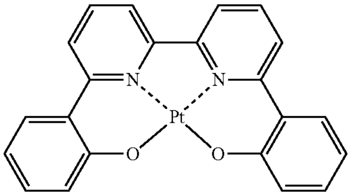

PD8

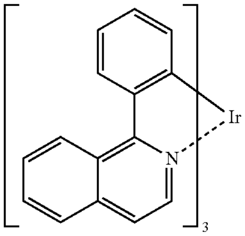

PD9

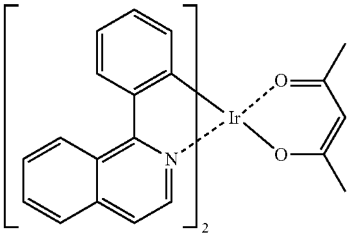

PD10

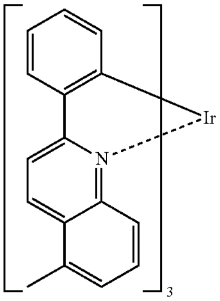

-continued
PD11
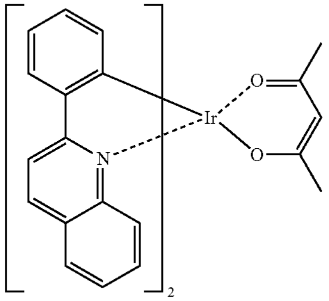
PD12
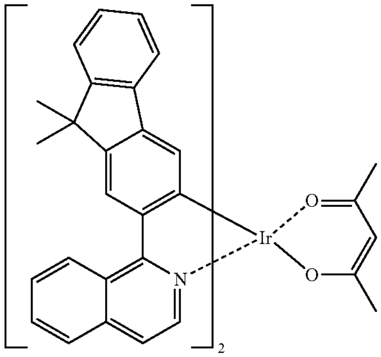
PD13
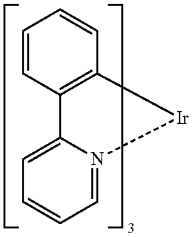
PD14
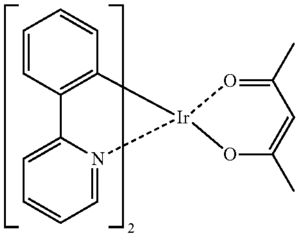
PD15
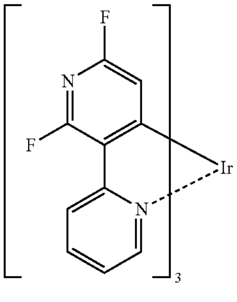
-continued
PD16
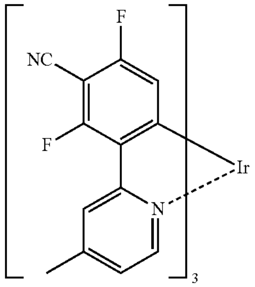
PD17
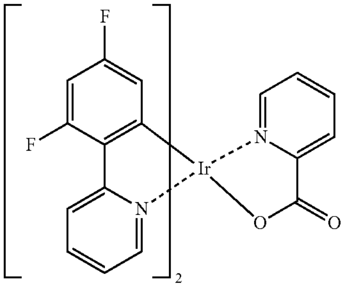
PD18
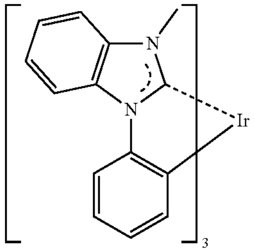
PD19
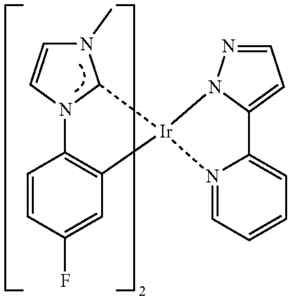
PD20
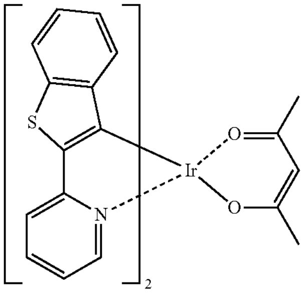

-continued
PD21
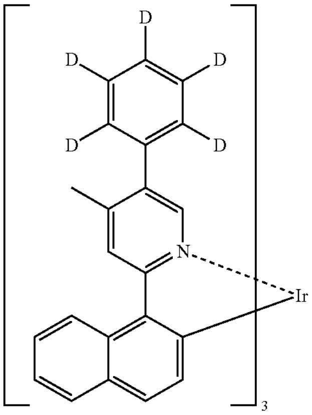
PD22
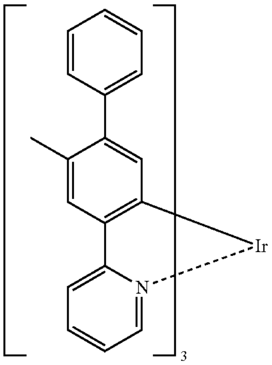
PD23
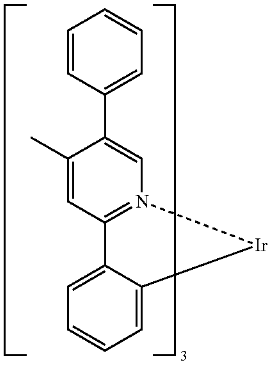
PD24
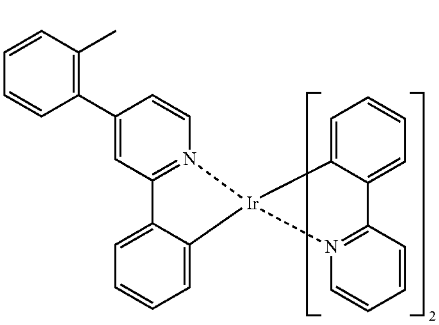
-continued
PD25
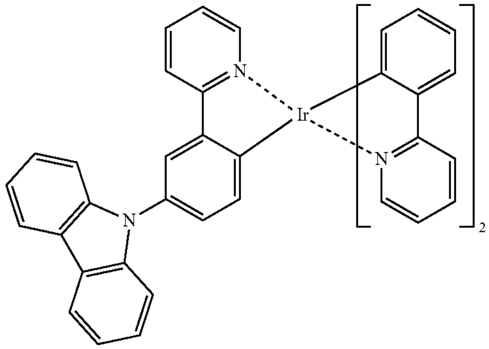
PD26
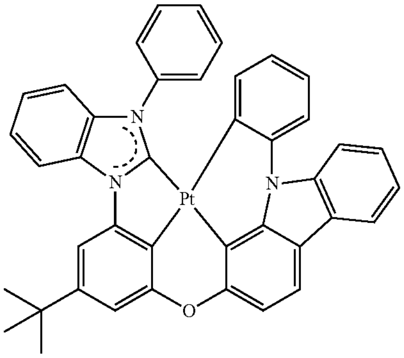
PD27
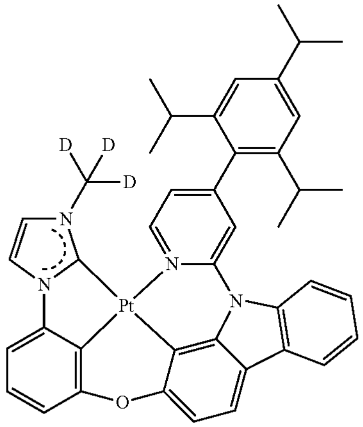
PD28
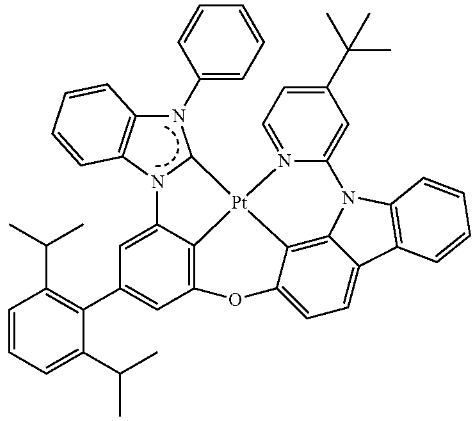

-continued
PD29
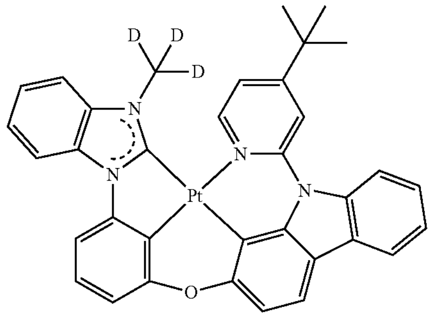
PD30
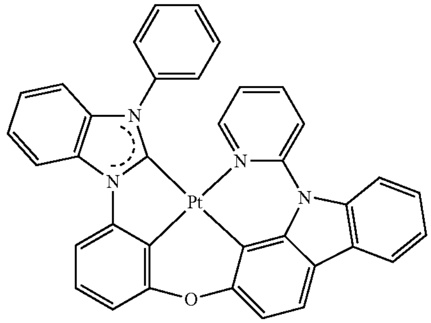
PD31
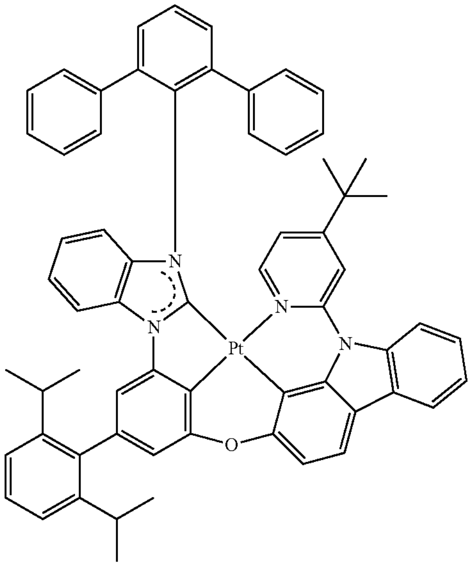
-continued
PD32
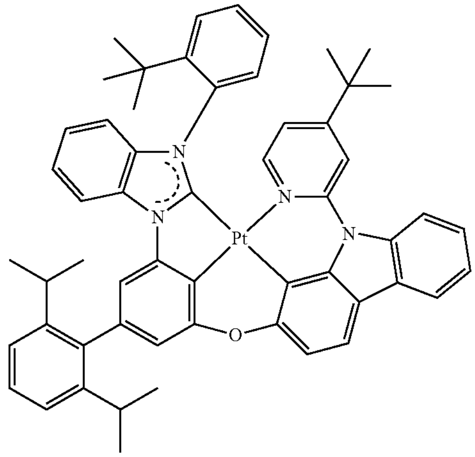
PD33
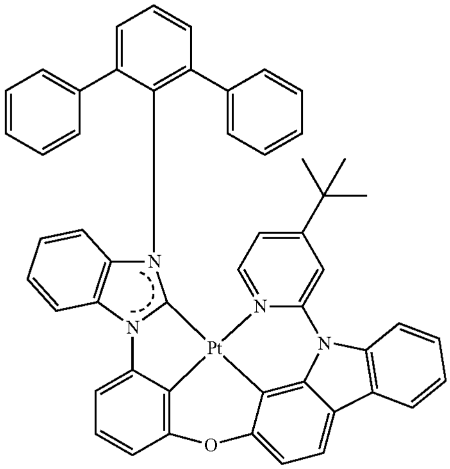
PD34
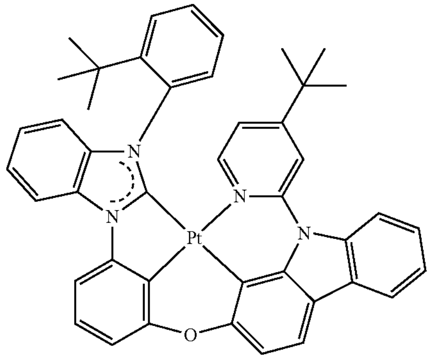

-continued

PD35

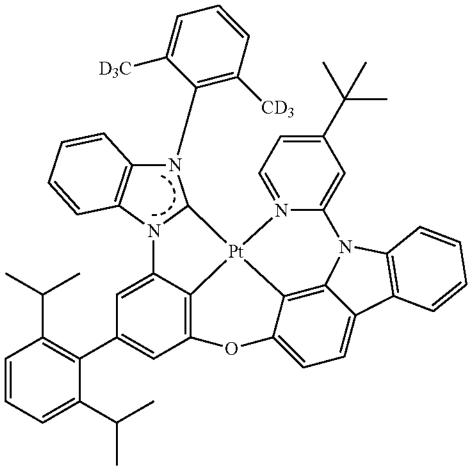

PD36

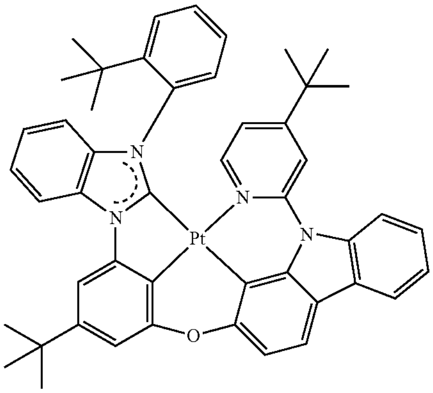

PD37

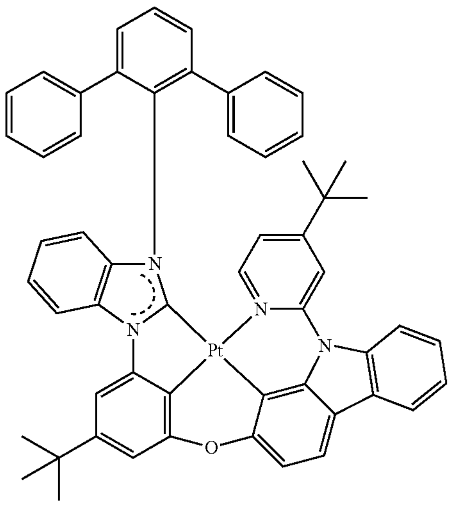

-continued

PD38

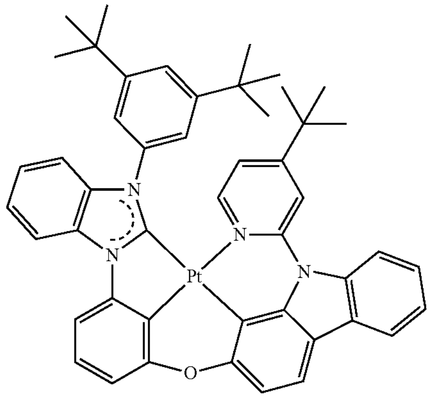

PD39

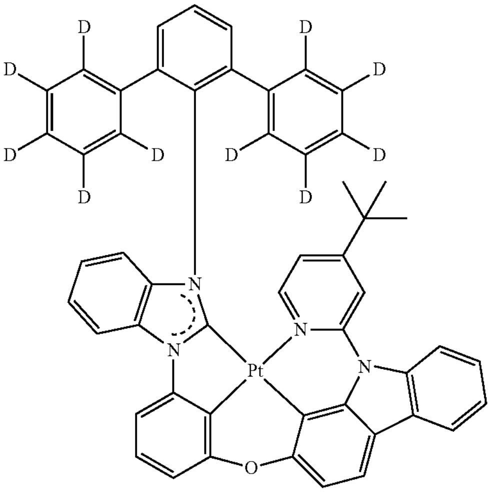

Fluorescent Dopant

The emission layer may include a fluorescent dopant and/or an auxiliary dopant.

For example, the fluorescent dopant and/or the auxiliary dopant may each independently include a compound represented by Formula 501:

Formula 501

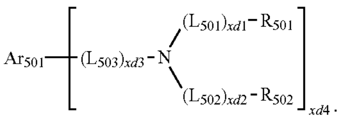

In Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

For example, $Ar_{501}$ in Formula 501 may be a condensed cyclic group (e.g., an anthracene group, a chrysene group, a pyrene group, and/or the like) in which three or more monocyclic groups are condensed together.

In one or more embodiments, xd4 in Formula 501 may be 2.

For example, the fluorescent dopant and the auxiliary dopant may each include one selected from among Compounds FD1 to FD37, DPVBi, DPAVBi, and/or any combination thereof:
FD1
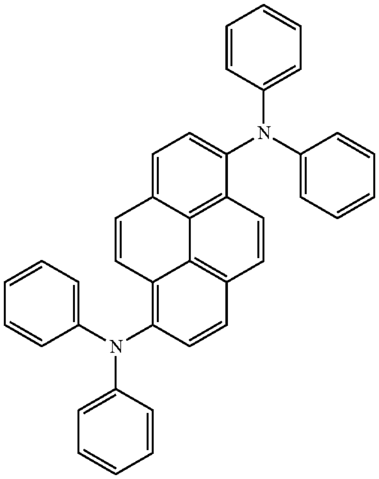
FD2
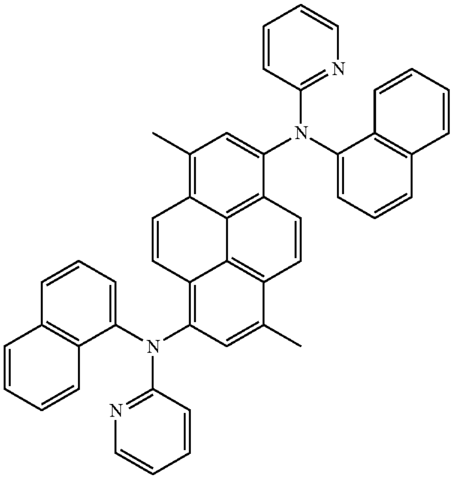
FD3
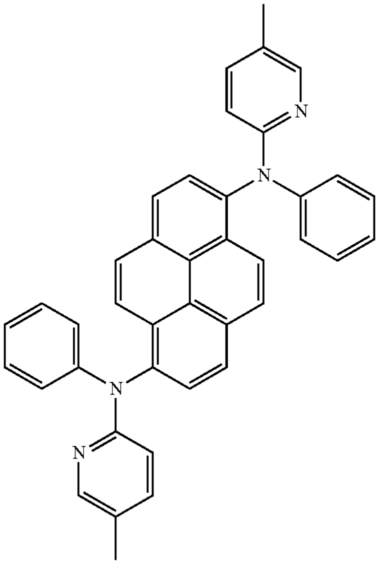
FD4
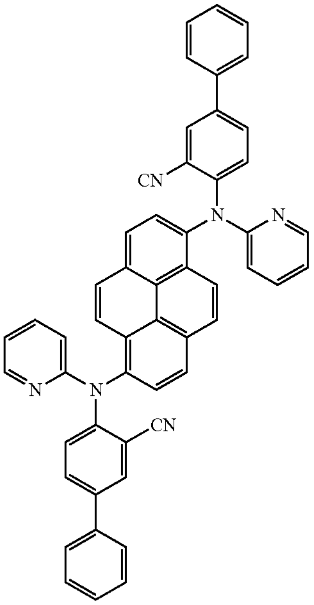
FD5
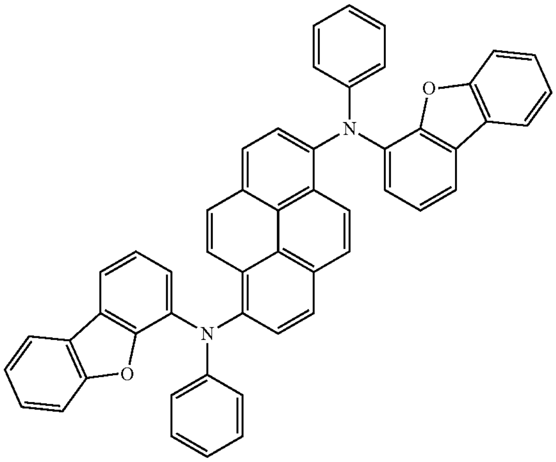
FD6
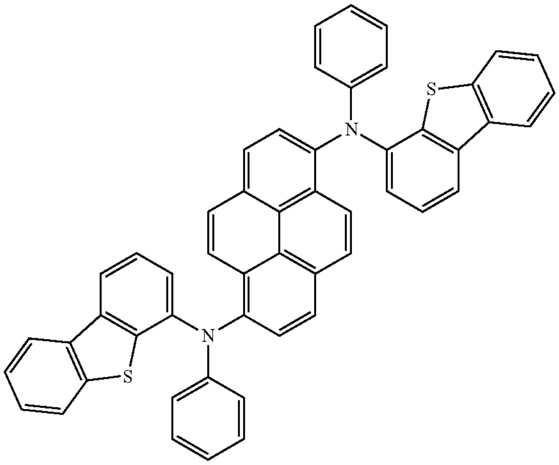

-continued
FD7
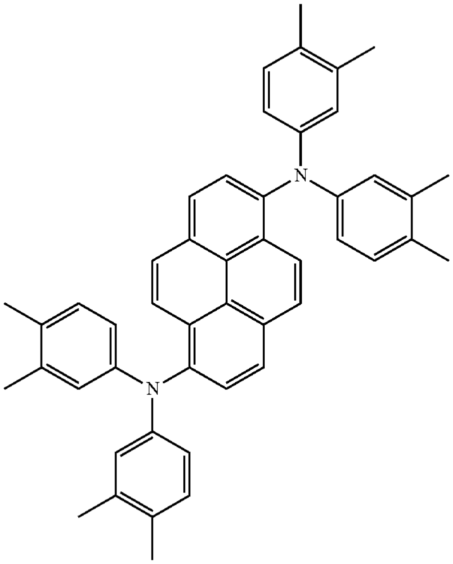
FD8
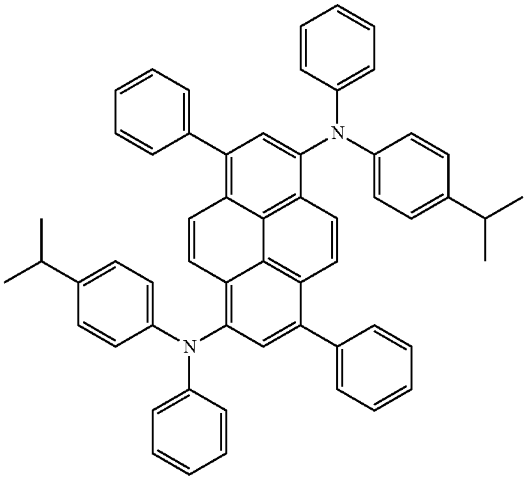
FD9
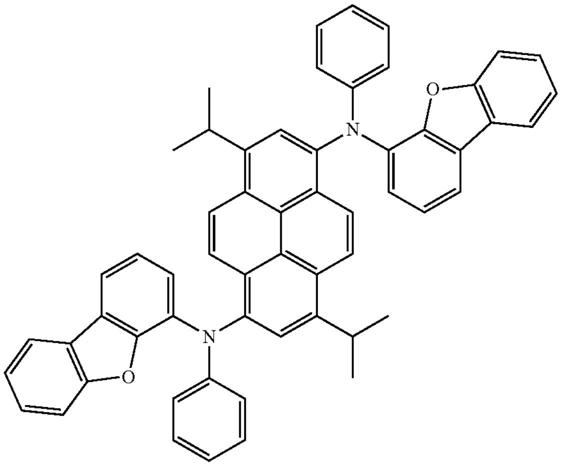
FD10
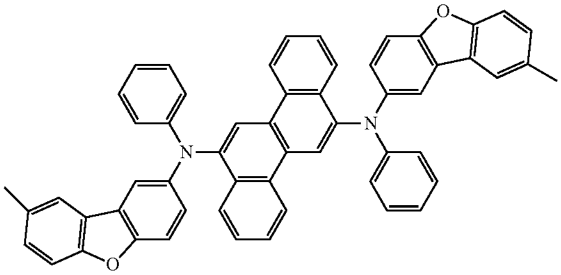
FD11
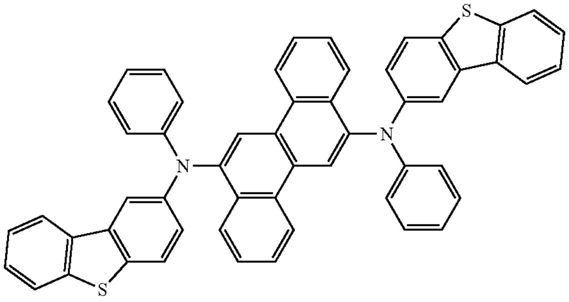
FD12
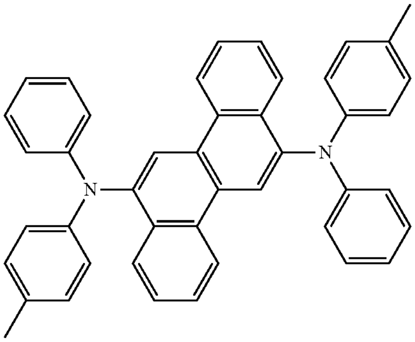

-continued
FD13
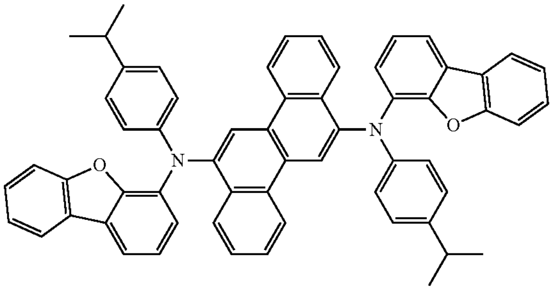
FD14
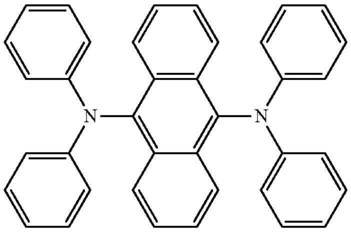
FD15
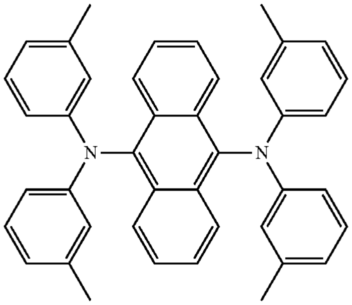
FD16
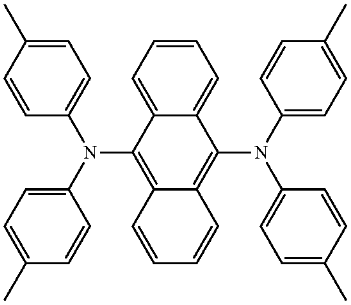
FD17
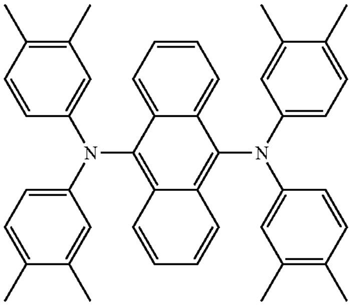
FD18
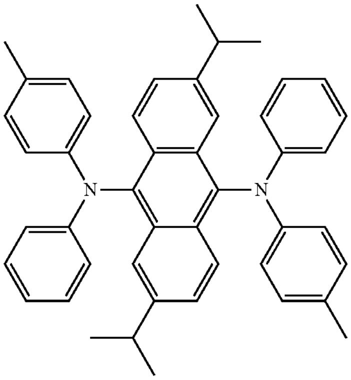
FD19
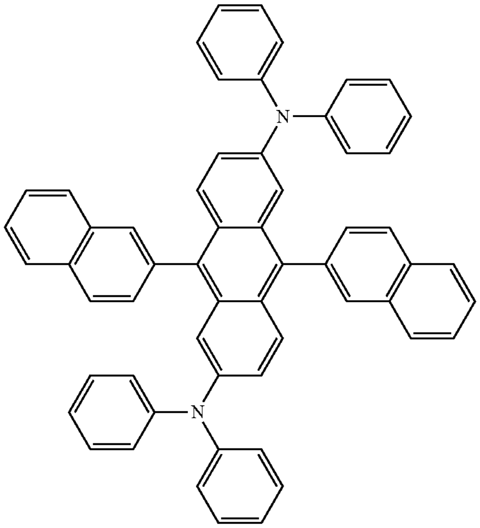
FD20
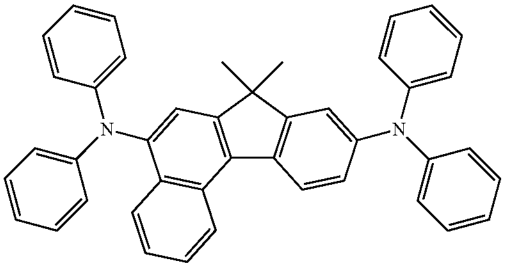

-continued
FD21
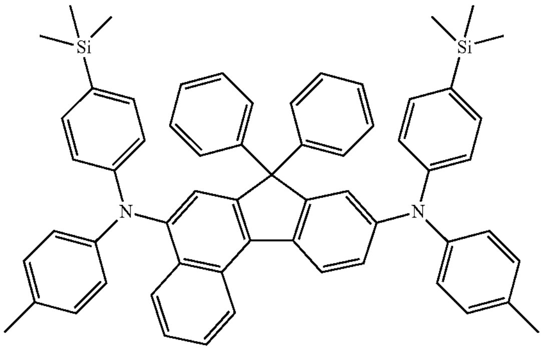
FD22
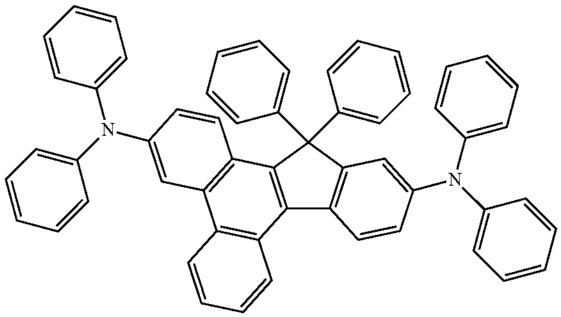
FD23
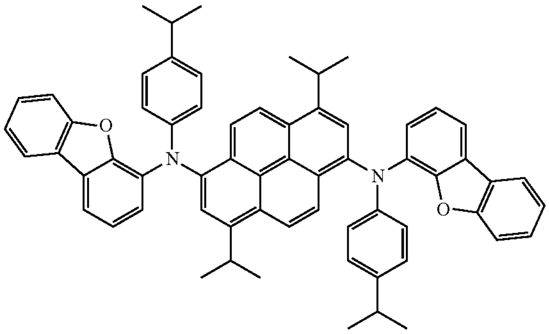
FD24
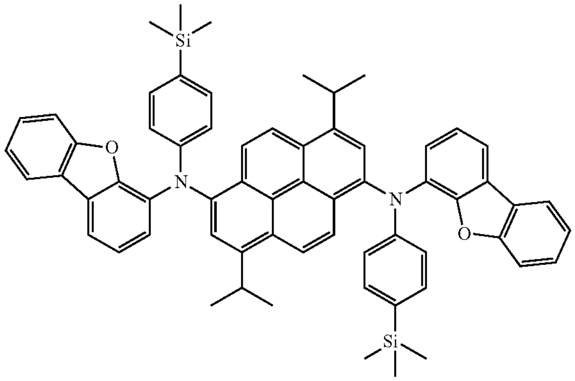
FD25
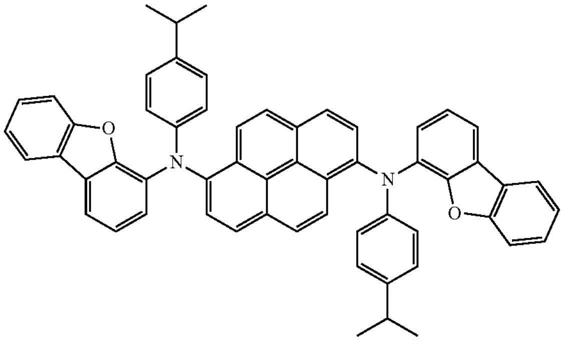
FD26
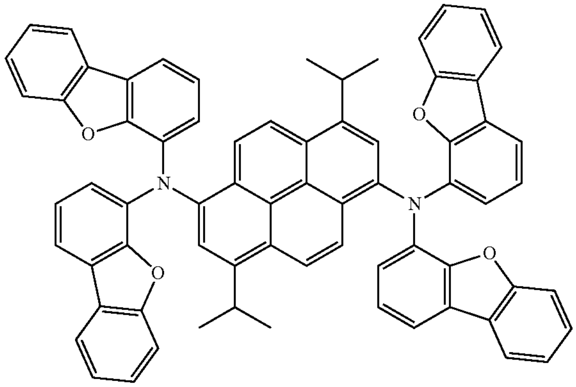
FD27
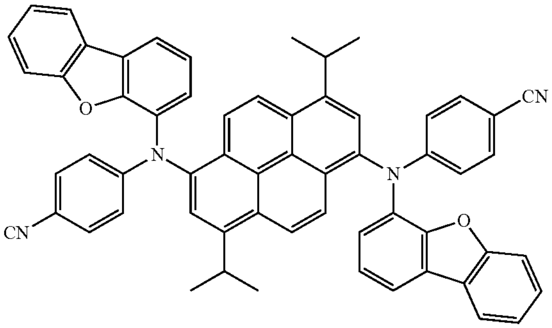
FD28
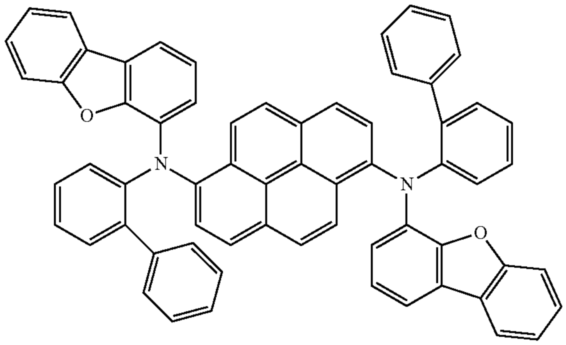

-continued
FD29
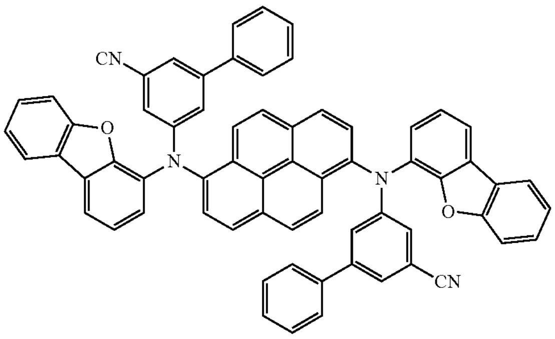
FD30
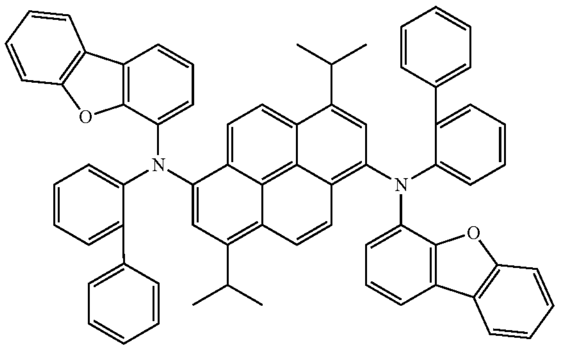
FD31
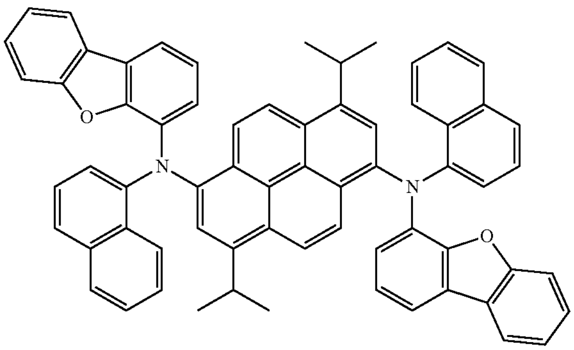
FD32
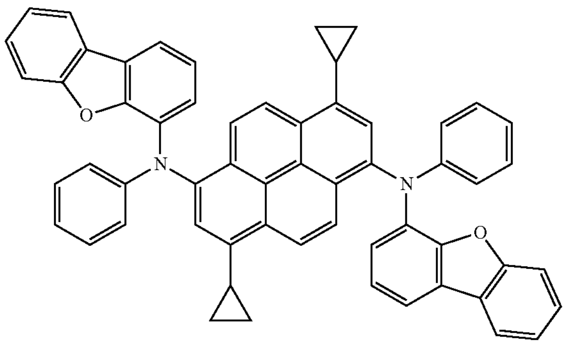
FD33
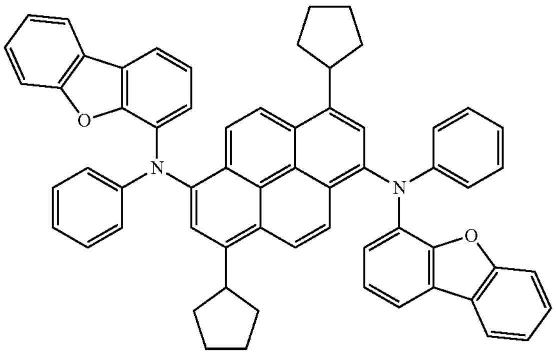
FD34
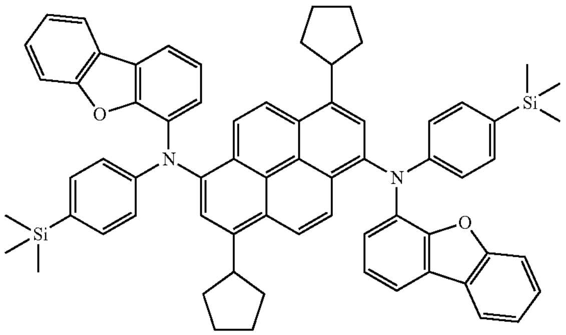
FD35
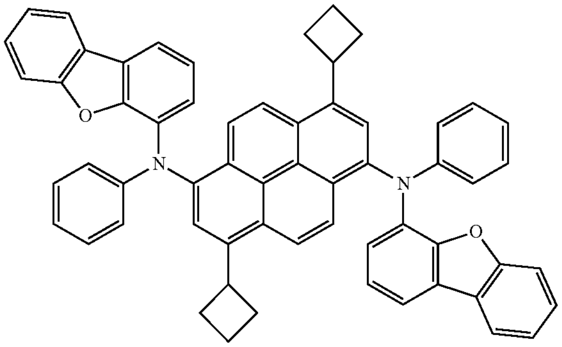
FD36
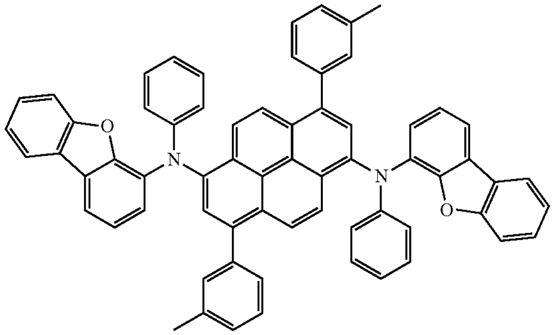

-continued

FD37

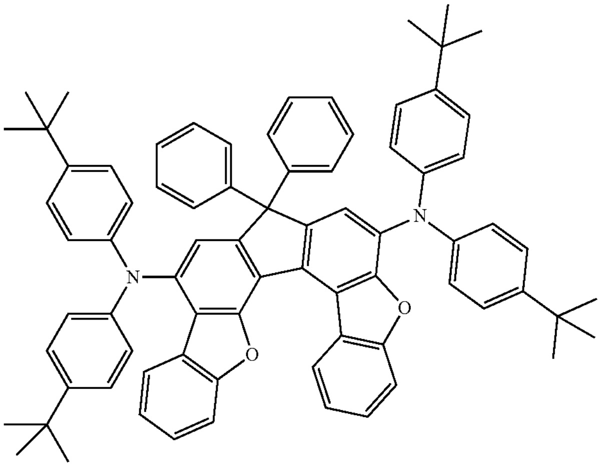

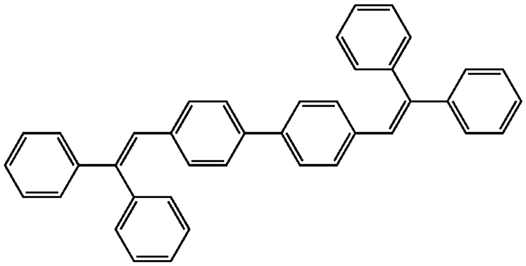

DPVBi

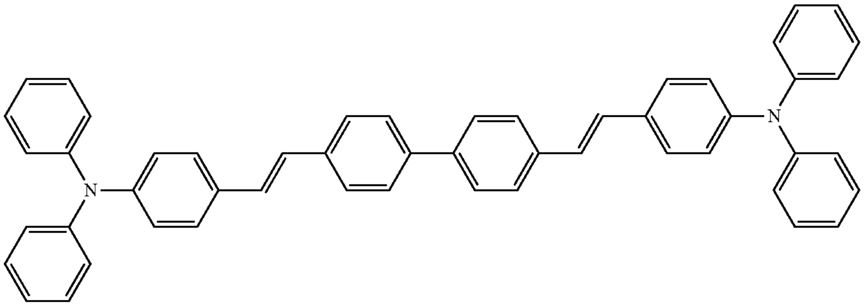.

DPAVBi

Delayed Fluorescence Material

The emission layer may include a delayed fluorescence material.

In the specification, the delayed fluorescence material may be selected from compounds capable of emitting delayed fluorescence based on a delayed fluorescence emission mechanism.

The delayed fluorescence material included in the emission layer may act as a host or a dopant depending on the type or kind of other materials included in the emission layer.

In one or more embodiments, a difference between a triplet energy level (eV) of the delayed fluorescence material and a singlet energy level (eV) of the delayed fluorescence material may be greater than or equal to 0 eV and less than or equal to 0.5 eV. When the difference between the triplet energy level (eV) of the delayed fluorescence material and the singlet energy level (eV) of the delayed fluorescence material is satisfied within the range above, up-conversion from the triplet state to the singlet state of the delayed fluorescence materials may effectively occur, and thus, the light-emitting device 10 may have improved luminescence efficiency.

For example, the delayed fluorescence material may include: i) a material including at least one electron donor (e.g., a π electron-rich $C_3$-$C_{60}$ cyclic group, such as a carbazole group, and/or the like) and at least one electron acceptor (e.g., a sulfoxide group, a cyano group, a π electron-deficient nitrogen-containing $C_1$-$C_{60}$ cyclic group, and/or the like), ii) a material including a $C_8$-$C_{60}$ polycyclic group in which two or more cyclic groups are condensed while sharing boron (B), and/or the like.

Examples of the delayed fluorescence material may include at least one selected from among Compounds DF1 to DF14:

-continued
DF1
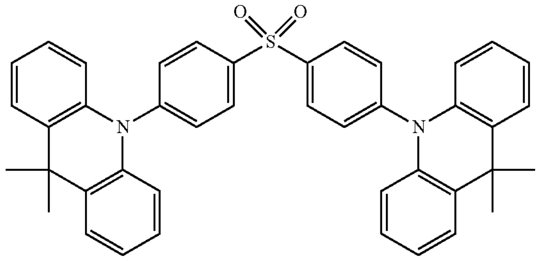
(DMAC-DPS)
DF2
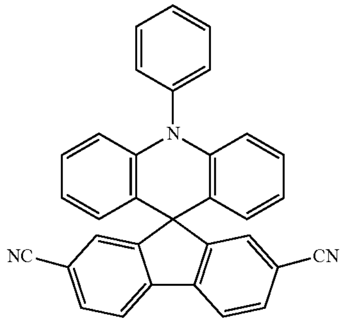
(ACRFLCN)
DF3
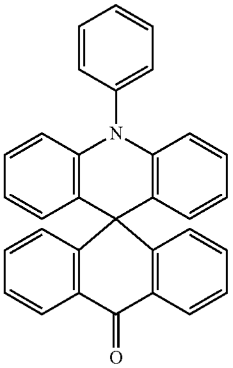
(ACRSA)
DF4
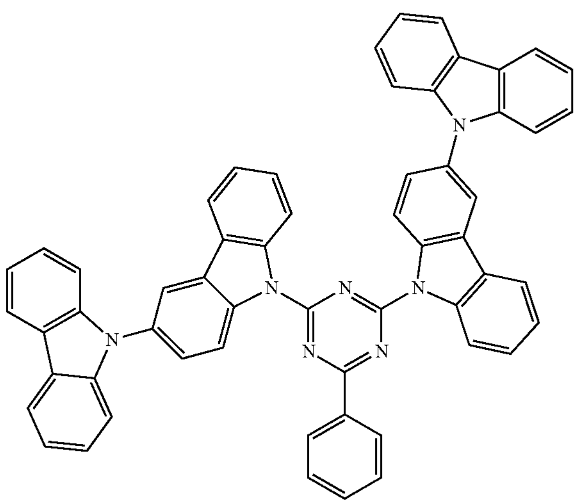
(CC2TA)
DF5
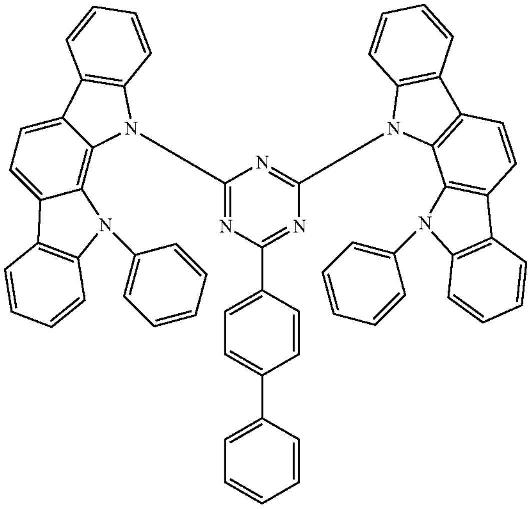
(PIC-TRZ)
DF6
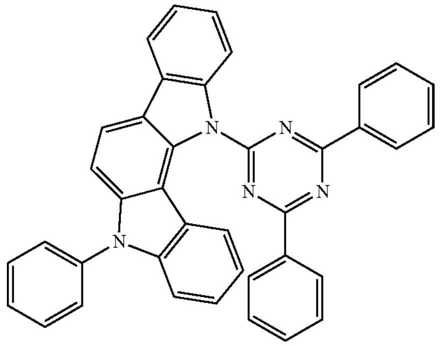
(PIC-TRZ2)
DF7
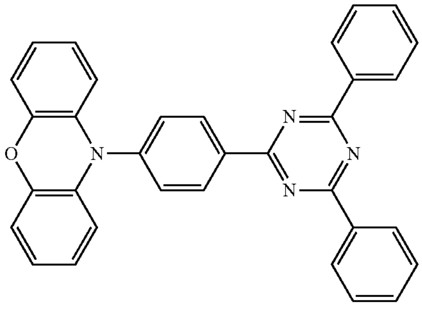
(PXZ-TRZ)
DF8
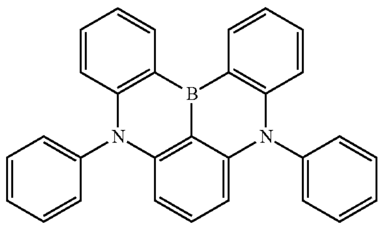
(DABNA-1)

-continued

DF9

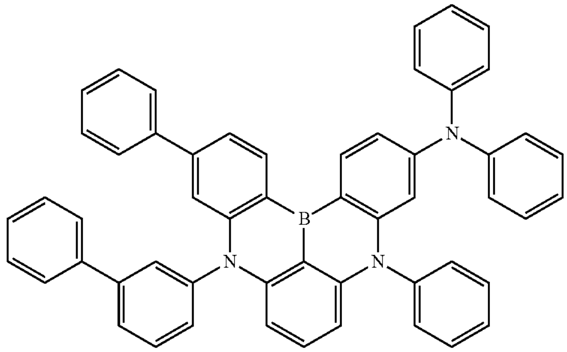

(DABNA-2)

DF10

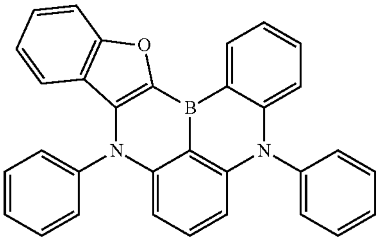

DF11

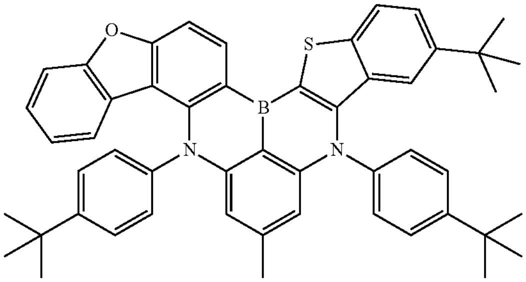

DF12

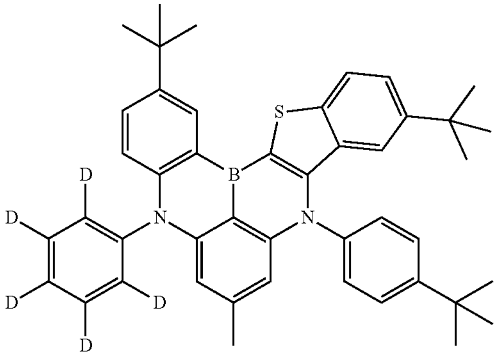

-continued

DF13

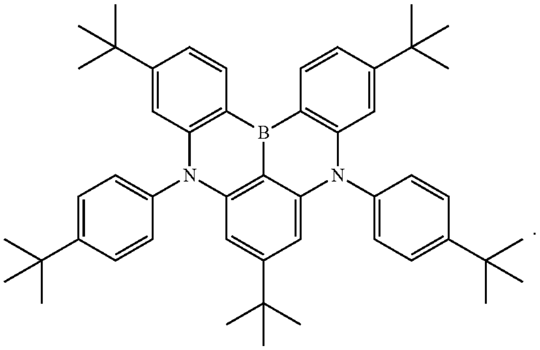

DF14

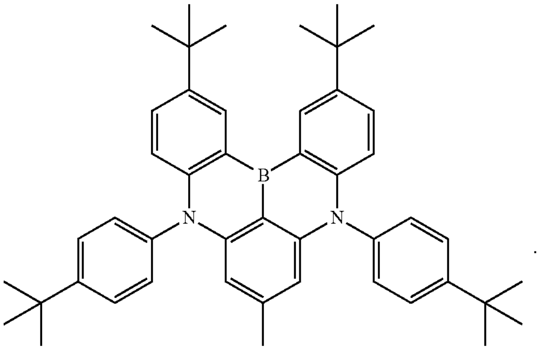

Quantum Dot

The emission layer may include a quantum dot.

The term "quantum dot" as utilized herein refers to a crystal of a semiconductor compound, and may include any material capable of emitting light of one or more suitable emission wavelengths according to the size of the crystal.

A diameter of the quantum dot may be, for example, in a range of about 1 nm to about 10 nm.

The quantum dot may be synthesized by a wet chemical process, a metal organic chemical vapor deposition process, a molecular beam epitaxy process, and/or any process similar thereto.

The wet chemical process is a method including mixing a precursor material with an organic solvent and then growing quantum dot particle crystals. When the crystals grow, the organic solvent naturally acts as a dispersant coordinated on the surface of the quantum dot crystals and controls the growth of the crystals so that the growth of quantum dot particles may be controlled or selected through a process which costs lower and is easier than vapor deposition methods, such as metal organic chemical vapor deposition (MOCVD) or molecular beam epitaxy (MBE).

The quantum dot may include: a Group II-VI semiconductor compound; a Group III-V semiconductor compound; a Group III-VI semiconductor compound; a Group I-III-VI semiconductor compound; a Group IV-VI semiconductor compound; a Group IV element or compound; or any combination thereof.

Examples of the Group II-VI semiconductor compound are: a binary compound, such as CdS, CdSe, CdTe, ZnS, ZnSe, ZnTe, ZnO, HgS, HgSe, HgTe, MgSe, MgS, and/or the like; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and/or the like; a quaternary compound, such as CdZnSeS, CdZnSeTe, CdZnSTe, CdHgSeS, CdHgSeTe, CdHgSTe, HgZnSeS, HgZnSeTe, HgZnSTe, and/or the like; or any combination thereof.

Examples of the Group III-V semiconductor compound are: a binary compound, such as GaN, GaP, GaAs, GaSb, AlN, AlP, AlAs, AlSb, InN, InP, InAs, InSb, and/or the like; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, and/or the like; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and/or the like; or any combination thereof. In one or more embodiments, the Group III-V semiconductor compound may further include a Group II element. Examples of the Group III-V semiconductor compound further including the Group II element are InZnP, InGaZnP, InAlZnP, and/or the like.

Examples of the Group III-VI semiconductor compound are: a binary compound, such as GaS, GaSe, GazSes, GaTe, InS, InSe, $In_2S_3$, $In_2Se_3$, InTe, and/or the like; a ternary compound, such as $InGaS_3$, $InGaSe_3$, and/or the like; or any combination thereof.

Examples of the Group I-III-VI semiconductor compound are: a ternary compound, such as AgInS, $AgInS_2$, CuInS, $CuInS_2$, $CuGaO_2$, $AgGaO_2$, $AgAlO_2$, and/or the like; or any combination thereof.

Examples of the Group IV-VI semiconductor compound are: a binary compound, such as SnS, SnSe, SnTe, PbS, PbSe, PbTe, and/or the like; a ternary compound, such as SnSeS, SnSeTe, SnSTe, PbSeS, PbSeTe, PbSTe, SnPbS, SnPbSe, SnPbTe, and/or the like; a quaternary compound, such as SnPbSSe, SnPbSeTe, SnPbSTe, and/or the like; or any combination thereof.

Examples of the Group IV element or compound are: a single element compound, such as Si, Ge, and/or the like; a binary compound, such as SiC, SiGe, and/or the like; or any combination thereof.

Each element included in a multi-element compound, such as the binary compound, the ternary compound, and the quaternary compound, may be present at a substantially uniform concentration or non-substantially uniform concentration in a particle.

In one or more embodiments, the quantum dot may have a single structure in which the concentration of each element in the quantum dot is substantially uniform, or may have a core-shell dual structure. For example, a material included in the core and a material included in the shell may be different from each other.

The shell of the quantum dot may act as a protective layer which prevents chemical denaturation of the core to maintain semiconductor characteristics, and/or as a charging layer which impart electrophoretic characteristics to the quantum dot. The shell may be single-layered or multi-layered. The interface between the core and the shell may have a concentration gradient in which the concentration of an element existing in the shell decreases toward the center of the core.

Examples of the shell of the quantum dot are an oxide of metal, metalloid, or non-metal, a semiconductor compound, or a combination thereof. Examples of the oxide of metal, metalloid, or non-metal are: a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and/or the like; a ternary compound, such as $MgAl_2O_4$, $CoFe_2O_4$, $NiFe_2O_4$, $CoMn_2O_4$, and/or the like; or any combination thereof. Examples of the semiconductor compound are: as described herein, a Group II-VI semiconductor compound; a Group III-V semiconductor compound; a Group III-VI semiconductor compound; a Group I-III-VI semiconductor compound; a Group IV-VI semiconductor compound; or any combination thereof. Examples of the semiconductor compound are CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The quantum dot may have a full width of half maximum (FWHM) of the emission wavelength spectrum of less than or equal to about 45 nm, less than or equal to about 40 nm, or for example, less than or equal to about 30 nm. When the FWHM of the quantum dot is within these ranges, the quantum dot may have improved color purity or improved color reproducibility. In some embodiments, because light emitted through the quantum dot is emitted in all directions, the wide viewing angle may be improved.

In some embodiments, the quantum dot may be in the form of spherical, pyramidal, multi-arm, or cubic nanoparticles, nanotubes, nanowires, nanofibers, or nanoplate particles.

Because the energy band gap may be adjusted by controlling the size of the quantum dot, light having one or more suitable wavelength bands may be obtained from the quantum dot emission layer. Accordingly, by utilizing quantum dots of different sizes, a light-emitting device that emits light of one or more suitable wavelengths may be implemented. In more detail, the size of the quantum dot may be selected to emit red light, green light, and/or blue light. In some embodiments, the size of the quantum dot may be configured to emit white light by combination of light of one or more suitable colors.

Electron Transport Region in Interlayer 130

The electron transport region may include the metal oxide nanoparticle represented by Formula 1 and/or the nanocomposite including the metal oxide nanoparticle.

The electron transport region may have: i) a single-layered structure including (e.g., consisting of) a single layer including (e.g., consisting of) a single material, ii) a single-layered structure including (e.g., consisting of) a single layer including (e.g., consisting of) multiple materials that are different from each other, or iii) a multi-layered structure including multiple layers including multiple materials that are different from each other.

The electron transport region may include a buffer layer, a hole blocking layer, an electron control layer, an electron transport layer, an electron injection layer, or any combination thereof.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein constituent layers of each structure are sequentially stacked from the emission layer.

The electron transport region (e.g., the buffer layer, the hole blocking layer, the electron control layer, or the electron transport layer in the electron transport region) may include a metal-free compound including at least one π electron-deficient nitrogen-containing $C_1$-$C_{60}$ heterocyclic group.

For example, the electron transport region may include a compound represented by Formula 601:

$$[Ar_{601}]_{xe11}-[(L_{601})_{xe1}-R_{601}]_{xe21}.$$

In Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{601})(Q_{602})(Q_{603})$, —$C(=O)(Q_{601})$, —$S(=O)_2(Q_{601})$, or —$P(=O)(Q_{601})(Q_{602})$, $Q_{601}$ to $Q_{603}$ may each be the same as described in connection with $Q_1$, xe21 may be 1, 2, 3, 4, or 5, and at least one selected from among $Ar_{601}$, $L_{601}$, and $R_{601}$ may each independently be a π electron-deficient nitrogen-containing $C_1$-$C_{60}$ heterocyclic group unsubstituted or substituted with at least one $R_{10a}$.

In one or more embodiments, when xe11 in Formula 601 is 2 or more, two or more of $Ar_{601}$ may be linked to each other via a single bond.

In one or more embodiments, $Ar_{601}$ in Formula 601 may be a substituted or unsubstituted anthracene group.

In one or more embodiments, the electron transport region may include a compound represented by Formula 601-1:

Formula 601-1

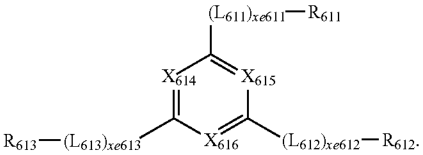

In Formula 601-1, $X_{614}$ may be N or $C(R_{614})$, $X_{615}$ may be N or $C(R_{615})$, $X_{616}$ may be N or $C(R_{616})$, and at least one selected from among $X_{614}$ to $X_{616}$ may be N, $L_{611}$ to $L_{613}$ may each be the same as described in connection with $L_{601}$, xe611 to xe613 may each be the same as described in connection with xe1, $R_{611}$ to $R_{613}$ may each be the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, xe1 and xe611 to xe613 in Formulae 601 and 601-1 may each independently be 0, 1, or 2.

The electron transport region may include: at least one selected from among Compounds ET1 to ET45; 2,9-dimethyl-4,7-diphenyl-1,10-phenanthroline (BCP); 4,7-diphenyl-1,10-phenanthroline (Bphen); $Alq_3$; BAlq; TAZ; NTAZ; and/or any combination thereof:

ET1

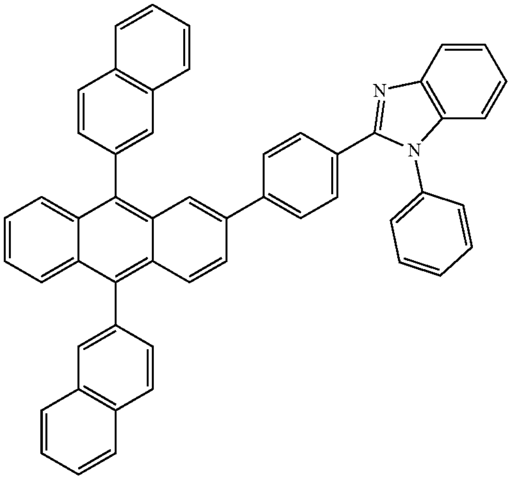

ET2

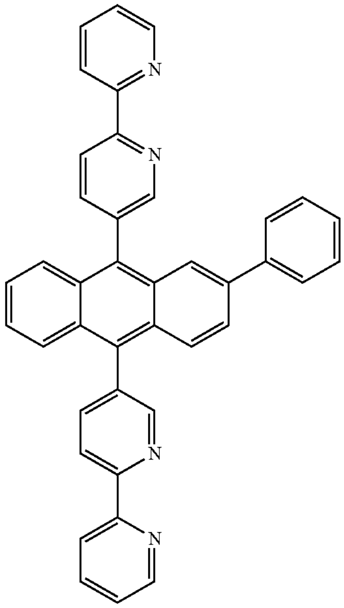

ET3

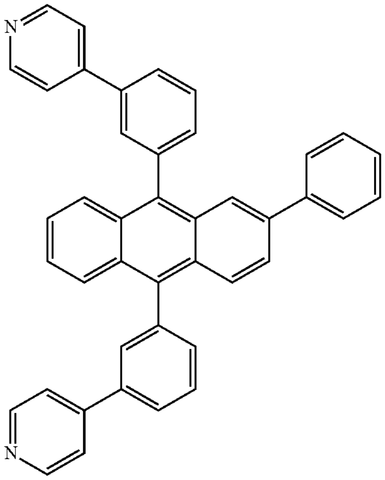

-continued
ET4
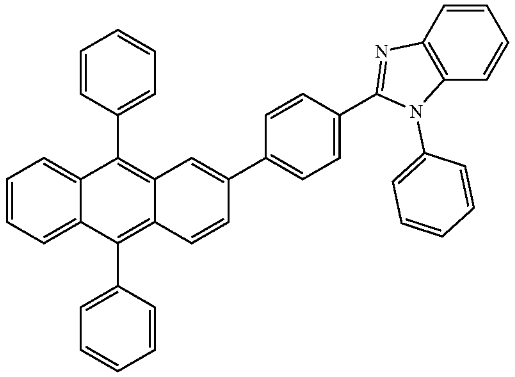
ET5
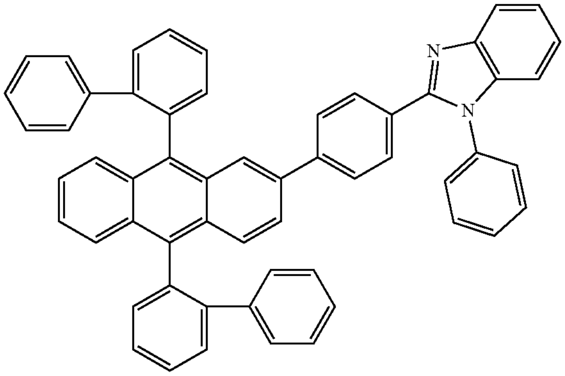
ET6
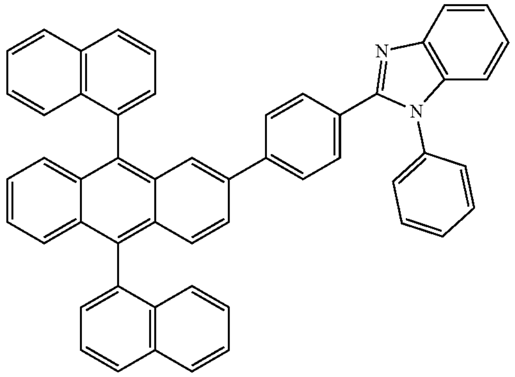
ET7
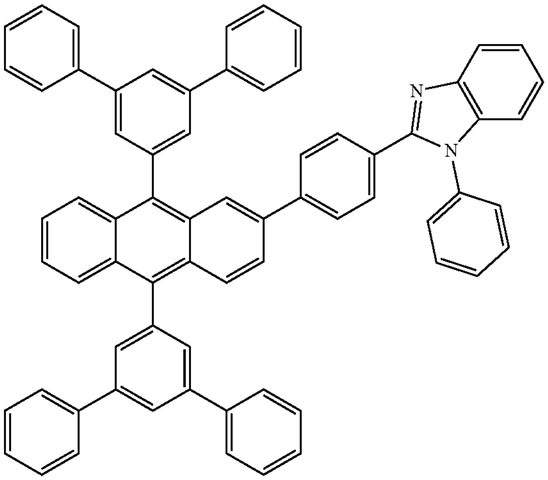
-continued
ET8
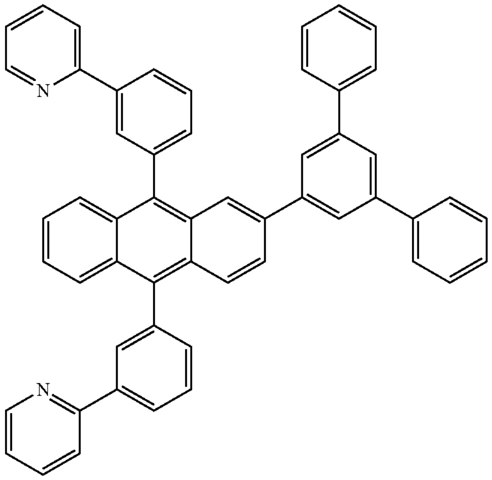
ET9
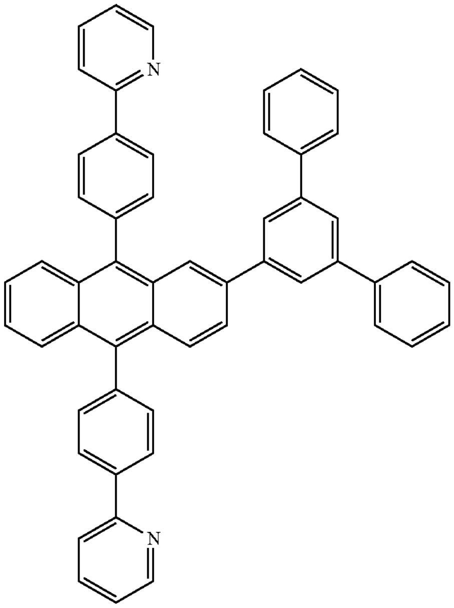

-continued
ET10
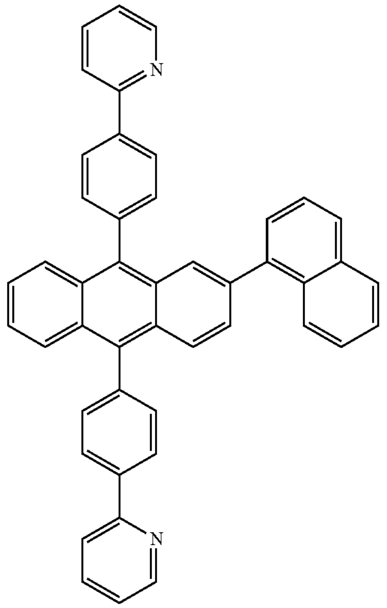
ET11
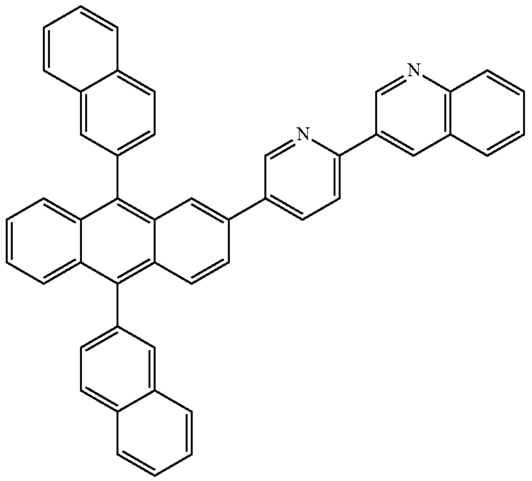
ET12
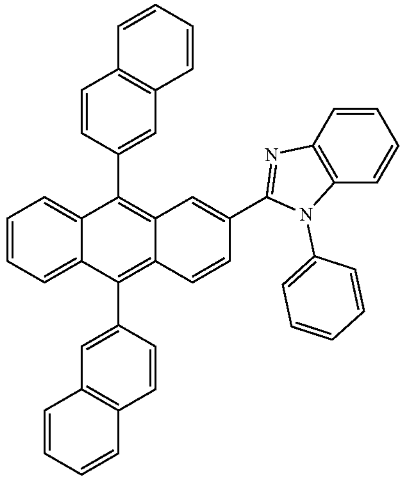
-continued
ET13
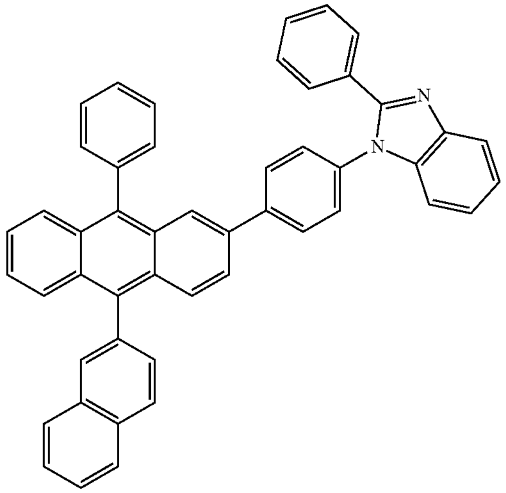
ET14
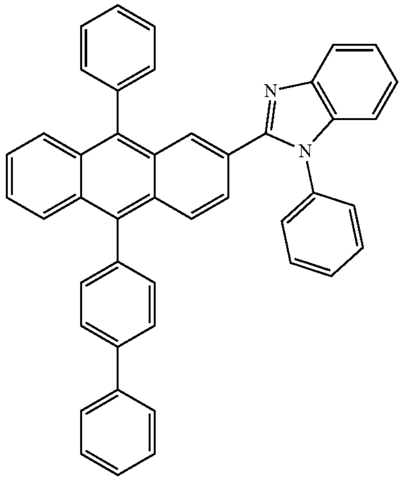
ET15
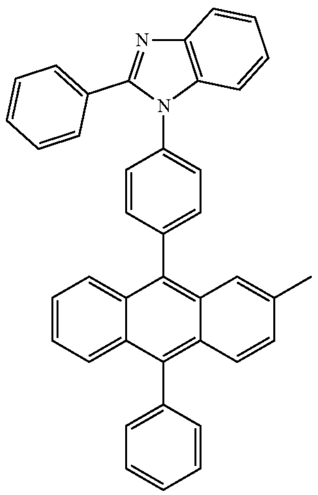

-continued
ET16
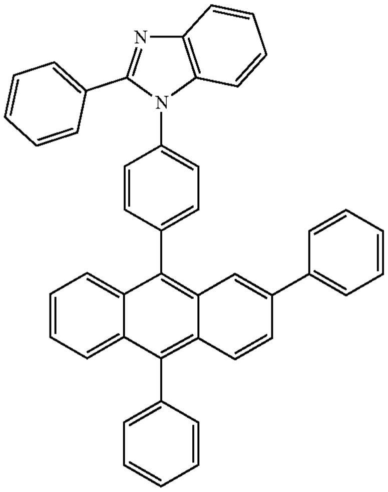
ET17
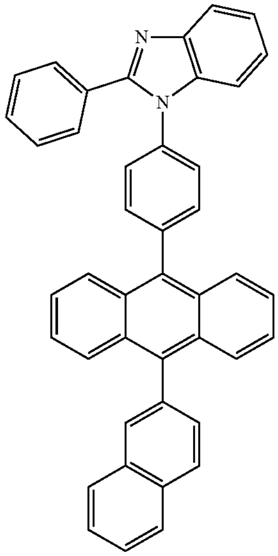
ET18
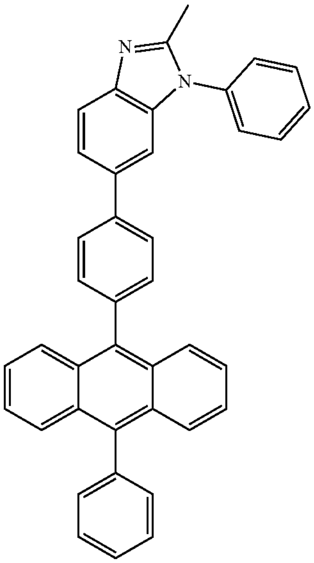
-continued
ET19
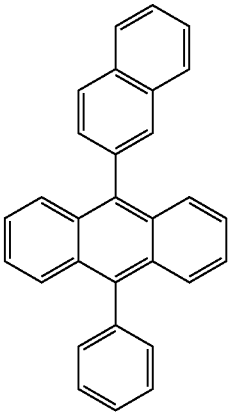
ET20
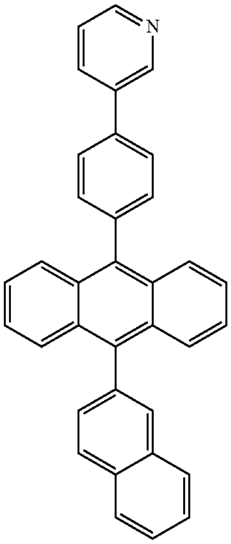
ET21
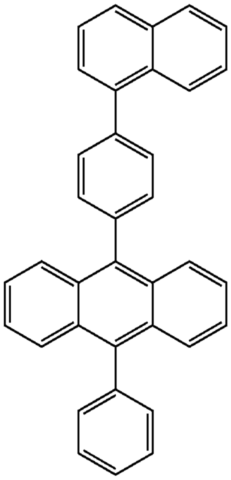

-continued
ET22
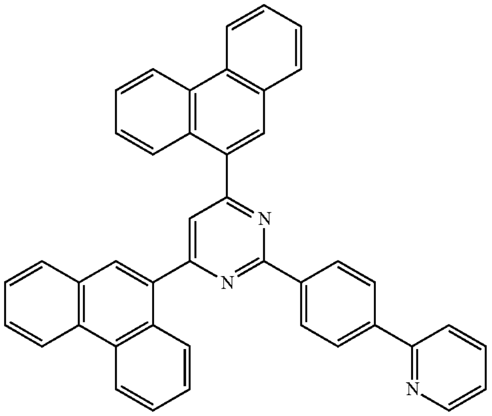
ET23
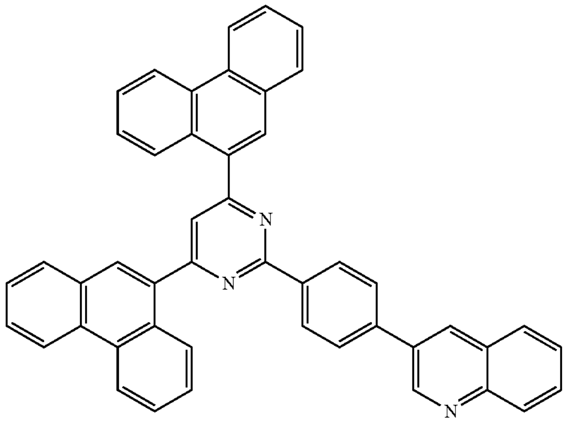
ET24
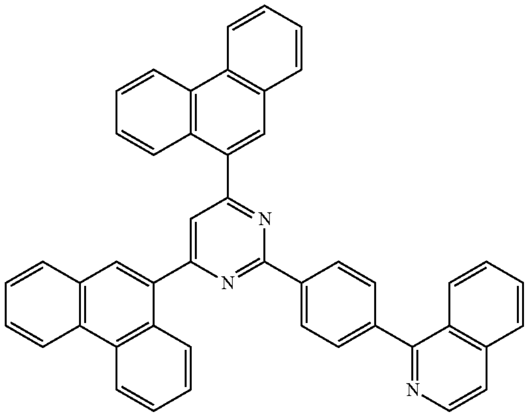
-continued
ET25
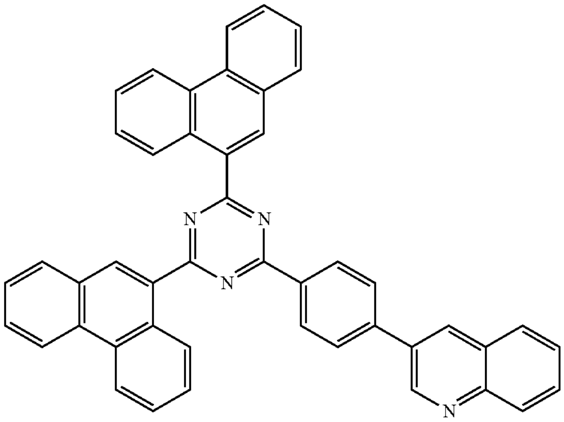
ET26
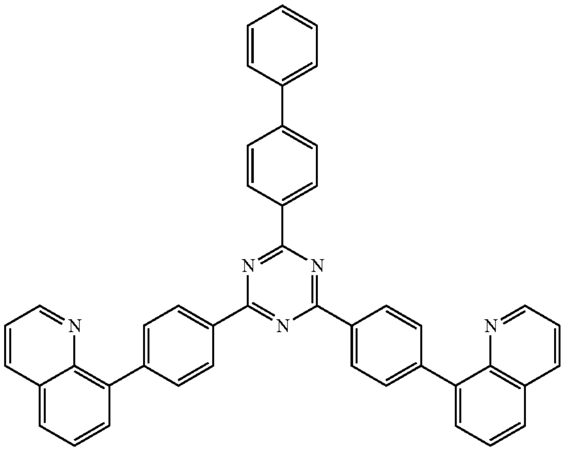
ET27
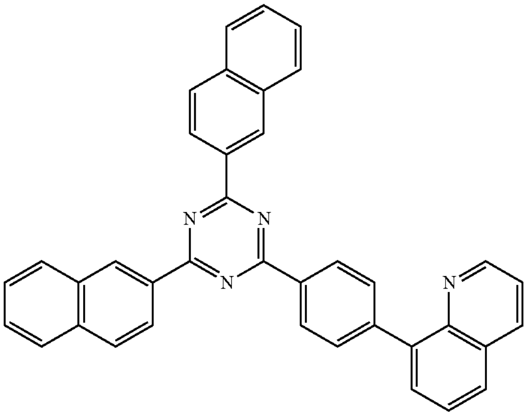

ET28
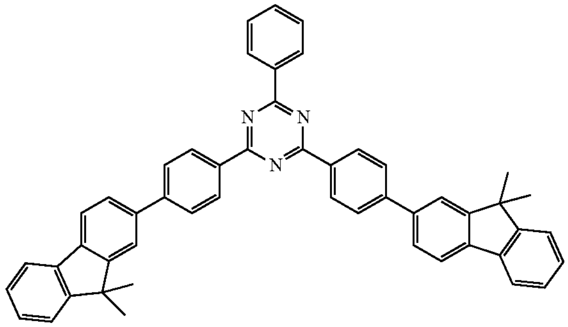
ET29
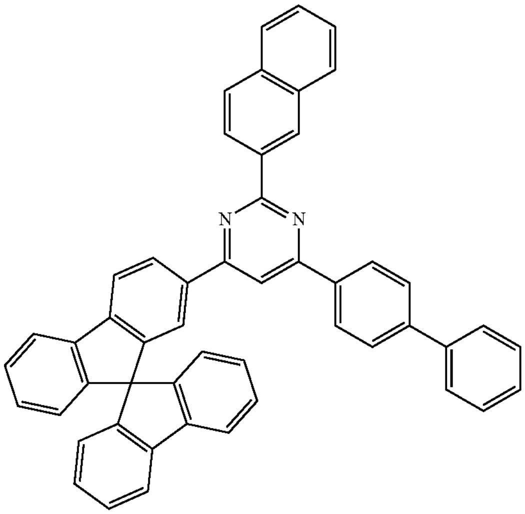
ET30
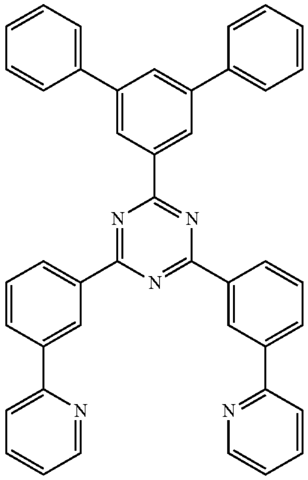
ET31
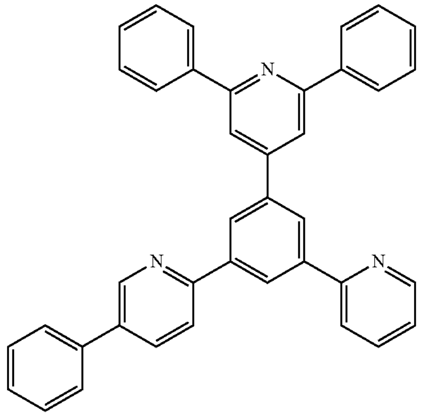
ET32
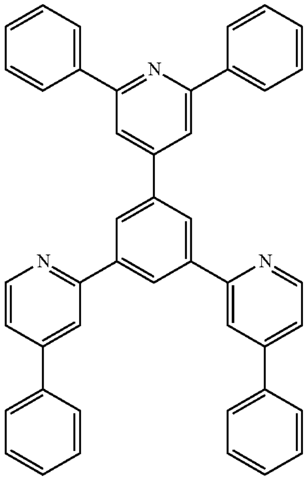
ET33
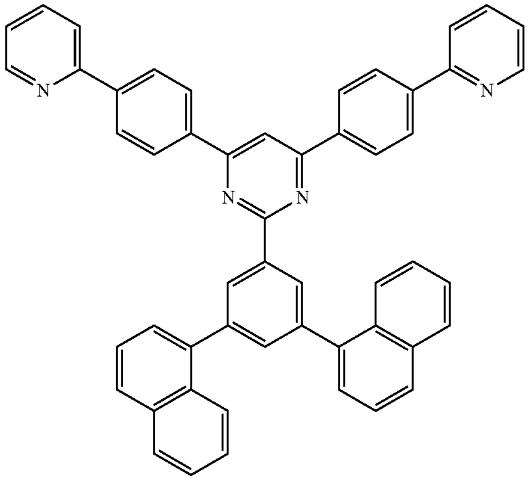

-continued
ET34
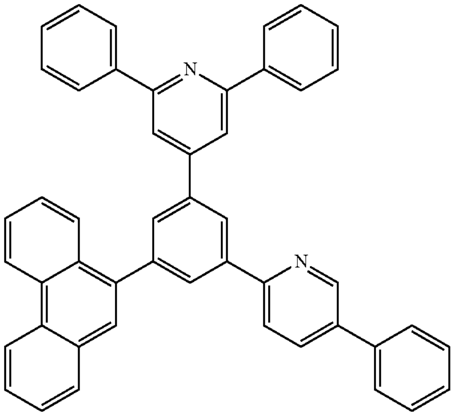
ET35
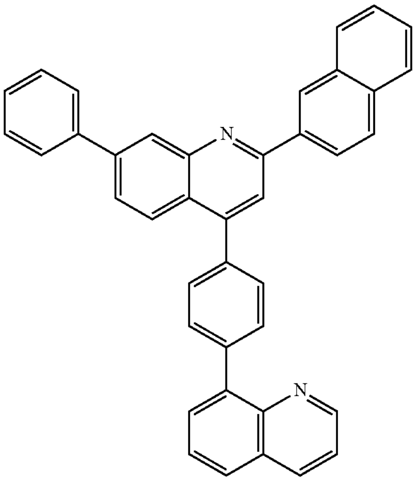
ET36
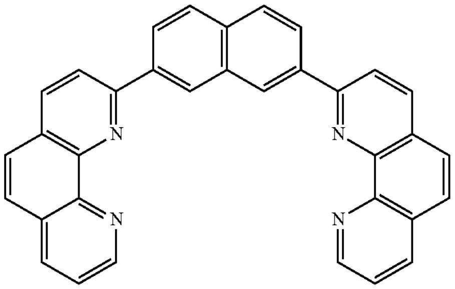
ET37
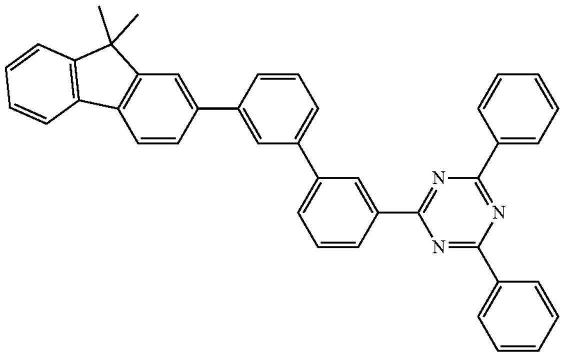
-continued
ET38
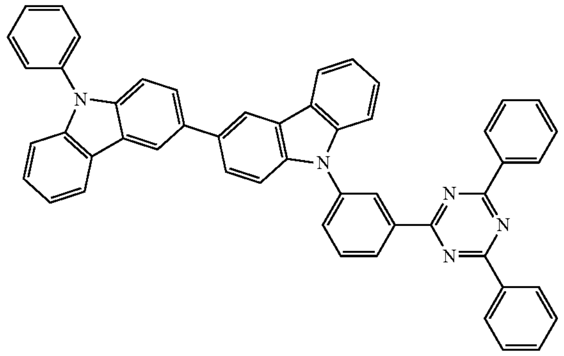
ET39
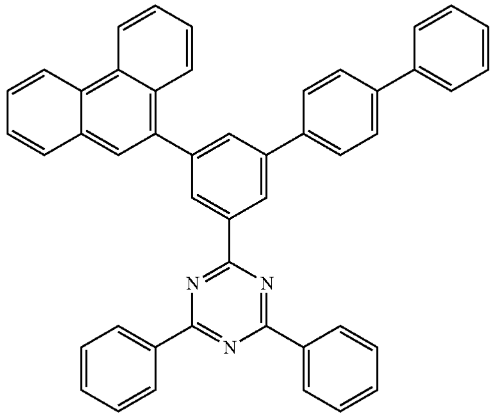
ET40
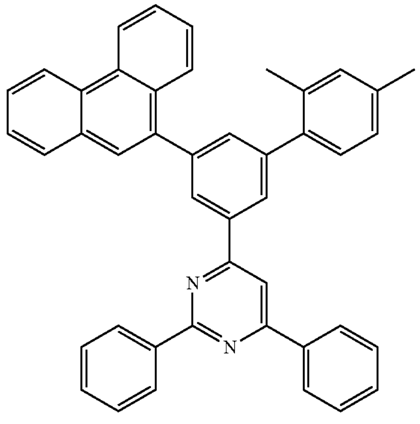

-continued
ET41
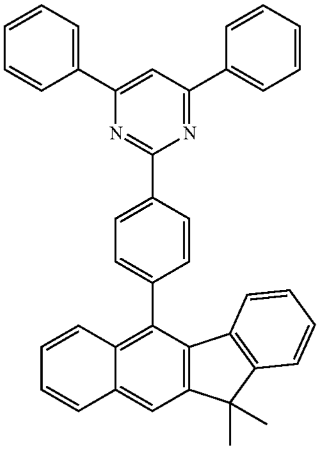
ET42
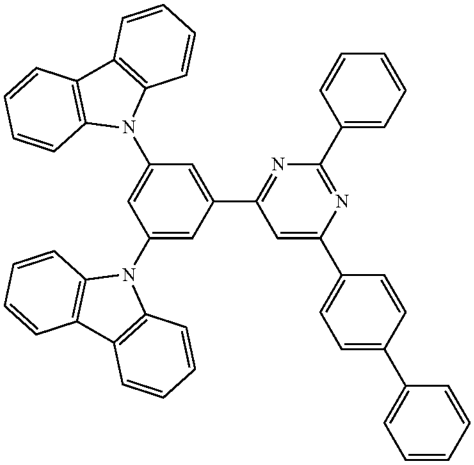
ET43
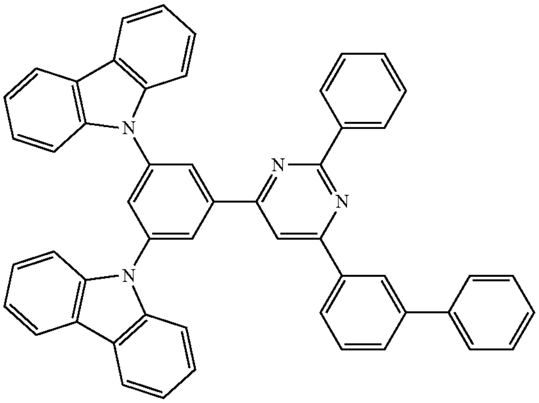
-continued
ET44
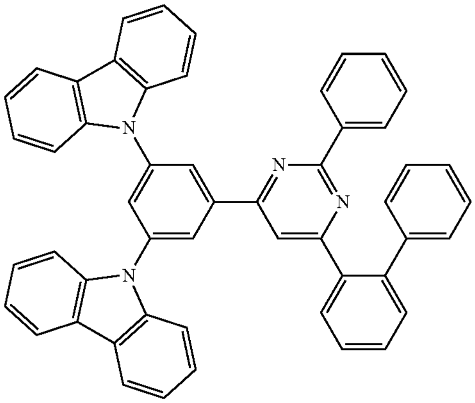
ET45
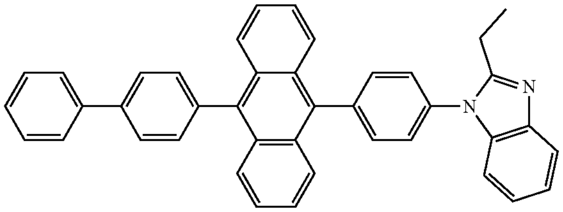
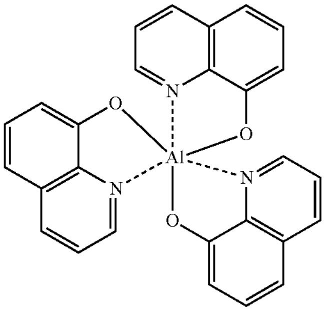
$Alq_3$
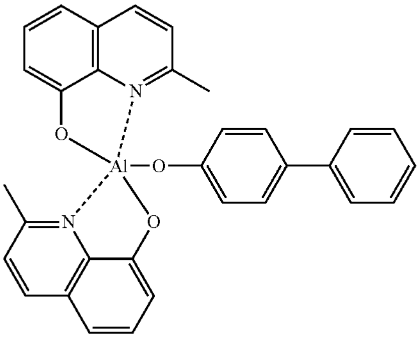
BAlq
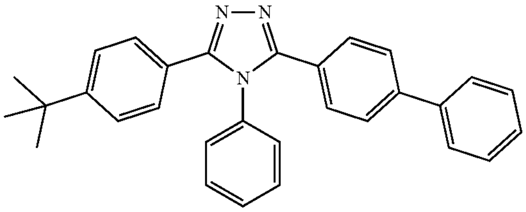
TAZ -continued

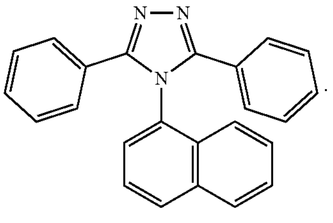

NTAZ

A thickness of the electron transport region may be in a range of about 100 Å to about 5,000 Å, for example, about 160 Å to about 4,000 Å. When the electron transport region includes a buffer layer, a hole blocking layer, an electron control layer, an electron transport layer, or any combination thereof, a thickness of the buffer layer, the hole blocking layer, or the electron control layer may each independently be in a range of about 20 Å to about 1,000 Å, for example, about 30 Å to about 300 Å, and a thickness of the electron transport layer may be in a range of about 100 Å to about 1,000 Å, for example, about 150 Å to about 500 Å. When the thicknesses of the buffer layer, the hole blocking layer, the electron control layer, the electron transport layer, and/or the electron transport region are within these ranges, satisfactory electron transporting characteristics may be obtained without a substantial increase in driving voltage.

The electron transport region (e.g., the electron transport layer in the electron transport region) may further include, in addition to the materials described above, a metal-containing material.

The metal-containing material may include an alkali metal complex, an alkaline earth metal complex, or any combination thereof. The metal ion of an alkali metal complex may be a Li ion, a Na ion, a K ion, a Rb ion, or a Cs ion, and the metal ion of an alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

For example, the metal-containing material may include a Li complex. The Li complex may include, for example, Compound ET-D1 (LiQ) or ET-D2:

ET-D1

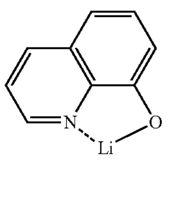

-continued

ET-D2

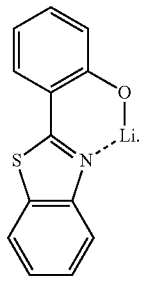

The electron transport region may include an electron injection layer that facilitates the injection of electrons from the second electrode 150. The electron injection layer may directly contact the second electrode 150.

The electron injection layer may have: i) a single-layered structure including (e.g., consisting of) a single layer including (e.g., consisting of) a single material, ii) a single-layered structure including (e.g., consisting of) a single layer including (e.g., consisting of) multiple materials that are different from each other, or iii) a multi-layered structure including multiple layers including multiple materials that are different from each other.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may be oxides, halides (e.g., fluorides, chlorides, bromides, iodides, and/or the like), or tellurides of the alkali metal, the alkaline earth metal, and the rare earth metal, or any combination thereof.

The alkali metal-containing compound may include: an alkali metal oxide, such as $Li_2O$, $Cs_2O$, $K_2O$, and/or the like; alkali metal halides, such as LiF, NaF, CsF, KF, LiI, NaI, CsI, KI, RbI, and/or the like; or any combination thereof. The alkaline earth metal-containing compound may include an alkaline earth metal compound, such as BaO, SrO, CaO, $BaxSr_{1-x}O$ (wherein x is a real number satisfying $0<x<1$), $Ba_xCa_{1-x}O$ (wherein x is a real number satisfying $0<x<1$), and/or the like. The rare earth metal-containing compound may include $YbF_3$, $ScF_3$, $SC_2O_3$, $Y_2O_3$, $Ce_2O_3$, $GdF_3$, $TbF_3$, $YbI_3$, $ScI_3$, $TbI_3$, or any combination thereof. In one or more embodiments, the rare earth metal-containing compound may include lanthanide metal telluride. Examples of the lanthanide metal telluride are LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, $Lu_2Te_3$, and/or the like.

The alkali metal complex, the alkaline earth-metal complex, and the rare earth metal complex may include i) at least one selected from among metal ions of the alkali metal, the alkaline earth metal, and the rare earth metal, and ii) as a ligand bonded to the metal ions (i.e., the selected metal ions), for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenyl benzimidazole, a hydroxyphenylbenzothiazole, a bipyridine, a phenanthroline, a cyclopentadiene, or any combination thereof.

In one or more embodiments, the electron injection layer may include (e.g., consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In one or more embodiments, the electron injection layer may further include an organic material (e.g., a compound represented by Formula 601).

In one or more embodiments, the electron injection layer may include (e.g., consist of) i) an alkali metal-containing compound (e.g., alkali metal halide), ii) a) an alkali metal-containing compound (e.g., alkali metal halide); and b) an alkali metal, an alkaline earth metal, a rare earth metal, or any combination thereof. For example, the electron injection layer may be a KI:Yb co-deposited layer, an RbI:Yb co-deposited layer, a LiF:Yb co-deposited layer, and/or the like.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be uniformly or non-uniformly dispersed in a matrix including the organic material.

A thickness of the electron injection layer may be in a range of about 1 Å to about 100 Å, and, for example, about 3 Å to about 90 Å. When the thickness of the electron injection layer is within these ranges, satisfactory electron injection characteristics may be obtained without a substantial increase in driving voltage.

Second Electrode 150

The second electrode 150 is arranged on the interlayer 130 having a structure as described above. The second electrode 150 may be a cathode, which is an electron injection electrode, and as a material for forming the second electrode 150, a metal, an alloy, an electrically conductive compound, or any combination thereof, each having a low work-function, may be utilized. The term "low work-function material" as utilized herein refers to a substance (e.g., a metal or metal alloy) that requires a relatively small, or low, amount of energy to emit electrons from its surface.

The second electrode 150 may include Li, Ag, Mg, Al, Al—Li, Ca, Mg—In, Mg—Ag, Yb, Ag—Yb, ITO, IZO, or any combination thereof. The second electrode 150 may be a transmissive electrode, a semi-transmissive electrode, or a reflective electrode.

The second electrode 150 may have a single-layered structure or a multi-layered structure including multiple layers.

Capping Layer

A first capping layer may be arranged outside (and, e.g., on) the first electrode 110, and/or a second capping layer may be arranged outside (and, e.g., on) the second electrode 150. For example, the light-emitting device 10 may have a structure in which the first capping layer, the first electrode 110, the interlayer 130, and the second electrode 150 are sequentially stacked in the stated order, a structure in which the first electrode 110, the interlayer 130, the second electrode 150, and the second capping layer are sequentially stacked in the stated order, or a structure in which the first capping layer, the first electrode 110, the interlayer 130, the second electrode 150, and the second capping layer are sequentially stacked in the stated order.

Light generated in the emission layer of the interlayer 130 of the light-emitting device 10 may be extracted toward the outside through the first electrode 110, which is a semi-transmissive electrode or a transmissive electrode, and the first capping layer. Light generated in the emission layer of the interlayer 130 of the light-emitting device 10 may be extracted toward the outside through the second electrode 150, which is a semi-transmissive electrode or a transmissive electrode, and the second capping layer.

The first capping layer and the second capping layer may increase external emission efficiency according to the principle of constructive interference. Accordingly, the light extraction efficiency of the light-emitting device 10 is increased, so that the luminescence efficiency of the light-emitting device 10 may be improved.

Each of the first capping layer and the second capping layer may include a material having a refractive index of greater than or equal to 1.6 (at 589 nm).

The first capping layer and the second capping layer may each independently be an organic capping layer including an organic material, an inorganic capping layer including an inorganic material, or an organic-inorganic composite capping layer including an organic material and an inorganic material.

At least one selected from among the first capping layer and the second capping layer may each independently include a carbocyclic compound, a heterocyclic compound, an amine group-containing compound, a porphine derivative, a phthalocyanine derivative, a naphthalocyanine derivative, an alkali metal complex, an alkaline earth metal complex, or any combination thereof. The carbocyclic compound, the heterocyclic compound, and the amine group-containing compound may optionally be substituted with a substituent including O, N, S, Se, Si, F, Cl, Br, I, or any combination thereof. In one or more embodiments, at least one selected from among the first capping layer and the second capping layer may each independently include an amine group-containing compound.

In one or more embodiments, at least one selected from among the first capping layer and the second capping layer may each independently include a compound represented by Formula 201, a compound represented by Formula 202, or any combination thereof.

In one or more embodiments, at least one selected from among the first capping layer and the second capping layer may each independently include one selected from among Compounds HT28 to HT33, one selected from among Compounds CP1 to CP6, β-NPB, and/or any combination thereof:

CP1

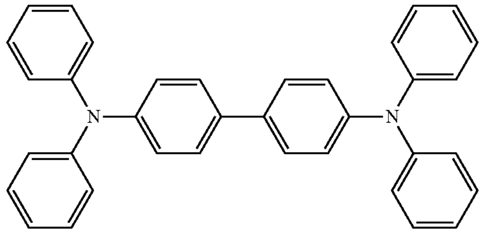

-continued

CP2

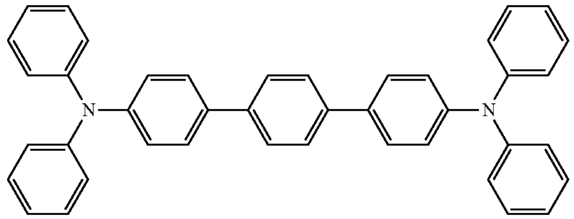

CP3

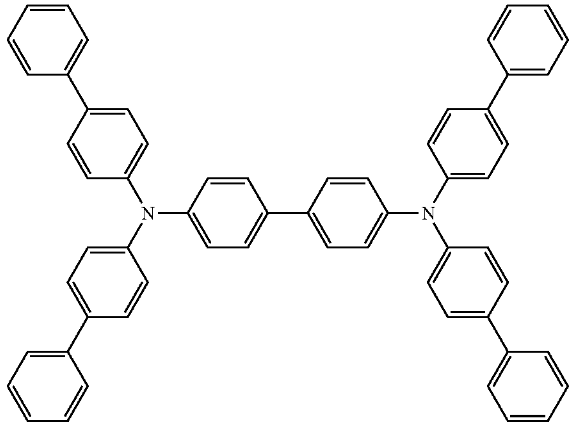

CP4

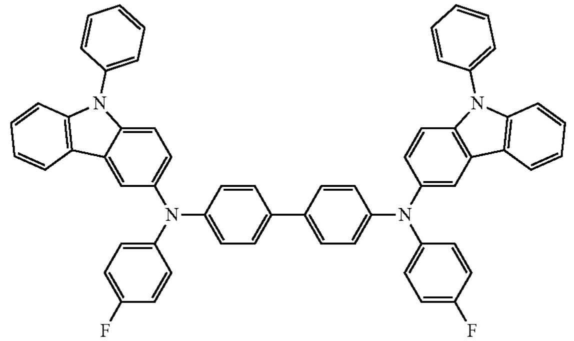

CP5

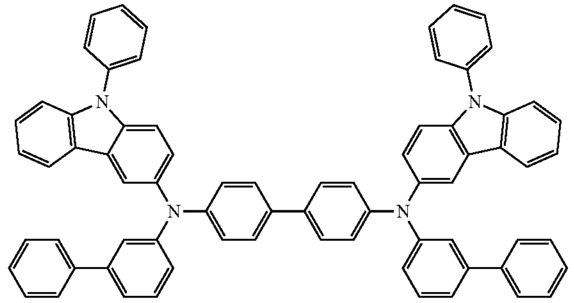

-continued

CP6

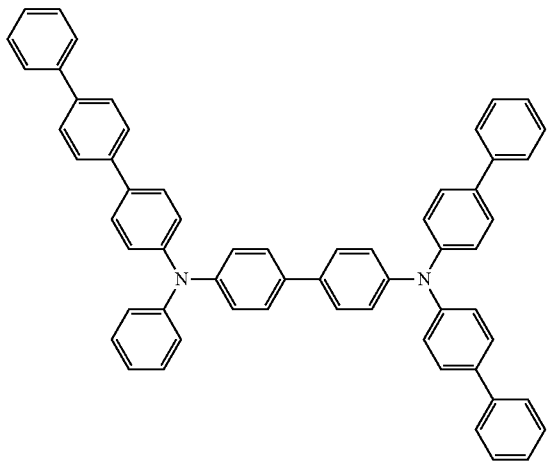

β-NPB

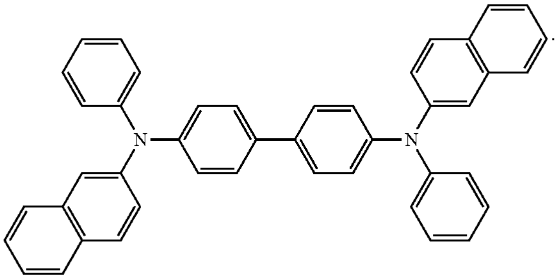

Film

The metal oxide nanoparticle represented by Formula 1 and/or the nanocomposite including the same may be included in one or more suitable films. Accordingly, another aspect of the disclosure provides a film including the metal oxide nanoparticle represented by Formula 1 and/or the nanocomposite including the same. The film may be, for example, an optical member (or a light control member or component) (e.g., a color filter, a color conversion member, a capping layer, a light extraction efficiency enhancement layer, a selective light absorbing layer, a polarizing layer, a quantum dot-containing layer, and/or the like), a light blocking member (e.g., a light reflective layer, a light absorbing layer, and/or the like), a protective member (e.g., an insulating layer, a dielectric layer, and/or the like), and/or the like.

Electronic Apparatus

The light-emitting device may be included in one or more suitable electronic apparatuses. For example, the electronic apparatus including the light-emitting device may be a light-emitting apparatus, an authentication apparatus, and/or the like.

The electronic apparatus (e.g., a light-emitting apparatus) may further include, in addition to the light-emitting device, i) a color filter, ii) a color conversion layer, or iii) a color filter and a color conversion layer. The color filter and/or the color conversion layer may be arranged in at least one traveling direction of light emitted from the light-emitting device. For example, light emitted from the light-emitting device may be blue light, green light, or white light. Details on the light-emitting device may be the same as described herein. In one or more embodiments, the color conversion layer may include a quantum dot.

The electronic apparatus may include a first substrate. The first substrate may include a plurality of subpixel areas, the color filter may include a plurality of color filter areas respectively corresponding to the subpixel areas, and the color conversion layer may include a plurality of color conversion areas respectively corresponding to the subpixel areas.

A pixel-defining film may be arranged among the subpixel areas to define each of the subpixel areas.

The color filter may further include a plurality of color filter areas and light-shielding patterns arranged among the color filter areas, and the color conversion layer may further include a plurality of color conversion areas and light-shielding patterns arranged among the color conversion areas.

The plurality of color filter areas (or the plurality of color conversion areas) may include a first area emitting first color light, a second area emitting second color light, and/or a third area emitting third color light, wherein the first color light, the second color light, and/or the third color light may have different maximum emission wavelengths from one another. For example, the first color light may be red light, the second color light may be green light, and the third color light may be blue light. For example, the plurality of color filter areas (or the plurality of color conversion areas) may include quantum dots. In detail, the first area may include a red quantum dot, the second area may include a green quantum dot, and the third area may not include (e.g., may exclude) a (e.g., any) quantum dot. Details on the quantum dot may be the same as described herein. The first area, the second area, and/or the third area may each further include a scatter.

For example, the light-emitting device may be to emit (e.g., configured to emit) first light, the first area may be to absorb (e.g., configured to absorb) the first light to emit first-first color light, the second area may be to absorb (e.g., configured to absorb) the first light to emit second-first color light, and the third area may be to absorb (e.g., configured to absorb) the first light to emit third-first color light. In this regard, the first-first color light, the second-first color light, and the third-first color light may have different maximum emission wavelengths. In one or more embodiments, the first light may be blue light, the first-first color light may be red light, the second-first color light may be green light, and the third-first color light may be blue light.

The electronic apparatus may further include a thin-film transistor, in addition to the light-emitting device as described above. The thin-film transistor may include a source electrode, a drain electrode, and an activation layer, wherein any one of the source electrode and the drain electrode may be electrically connected to any one of the first electrode and the second electrode of the light-emitting device.

The thin-film transistor may further include a gate electrode, a gate insulating film, and/or the like.

The activation layer may include crystalline silicon, amorphous silicon, an organic semiconductor, an oxide semiconductor, and/or the like.

The electronic apparatus may further include a sealing portion for sealing the light-emitting device. The sealing portion may be arranged between the color filter and/or the color conversion layer and the light-emitting device. The sealing portion allows light from the light-emitting device to be extracted to the outside, and concurrently (e.g., simultaneously) prevents or reduces ambient air and moisture from penetrating into the light-emitting device. The sealing portion may be a sealing substrate including a transparent glass substrate or a plastic substrate. The sealing portion may be a thin-film encapsulation layer including at least one layer of an organic layer and/or an inorganic layer. When the sealing portion is a thin-film encapsulation layer, the electronic apparatus may be flexible.

One or more suitable functional layers may be additionally arranged on the sealing portion, in addition to the color filter and/or the color conversion layer, according to the utilize of the electronic apparatus. Examples of the functional layers may include a touch screen layer, a polarizing layer, and/or the like. The touch screen layer may be a pressure-sensitive touch screen layer, a capacitive touch screen layer, or an infrared touch screen layer. The authentication apparatus may be, for example, a biometric authentication apparatus that authenticates an individual by utilizing biometric information of a living body (e.g., fingertips, pupils, and/or the like).

The authentication apparatus may further include, in addition to the light-emitting device as described above, a biometric information collector.

The electronic apparatus may be applied to one or more suitable displays, light sources, lighting, personal computers (e.g., a mobile personal computer), mobile phones, digital cameras, electronic organizers, electronic dictionaries, electronic game machines, medical instruments (e.g., electronic thermometers, sphygmomanometers, blood glucose meters, pulse measurement devices, pulse wave measurement devices, electrocardiogram displays, ultrasonic diagnostic devices, or endoscope displays), fish finders, one or more suitable measuring instruments, meters (e.g., meters for a vehicle, an aircraft, and a vessel), projectors, and/or the like.

Electronic Equipment

The light-emitting device may be included in one or more suitable electronic equipment.

For example, the electronic equipment including the light-emitting device may be at least one selected from among a flat panel display, a curved display, a computer monitor, a medical monitor, a television, a billboard, an indoor or outdoor light and/or light for signal, a head-up display, a fully or partially transparent display, a flexible display, a rollable display, a foldable display, a stretchable display, a laser printer, a telephone, a portable phone, a tablet personal computer, a phablet, a PDA, a wearable device, a laptop computer, a digital camera, a camcorder, a viewfinder, a micro display, a 3D display, a virtual reality or augmented reality display, a vehicle, a video wall with multiple displays tiled together, a theater or stadium screen, a phototherapy device, a signboard, and combinations thereof.

Because the light-emitting device has excellent or suitable luminescence efficiency and long lifespan, the electronic equipment including the light-emitting device may have characteristics such as high luminance, high resolution, and low power consumption.

Figure 2:
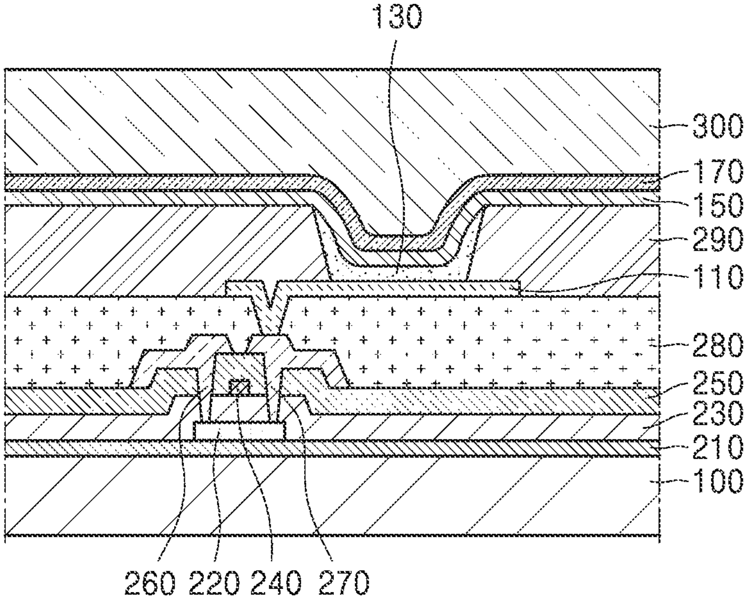
FIG. 2 is a schematic cross-sectional view of a structure of an electronic apparatus according to one or more embodiments of the present disclosure.
Figure 3:
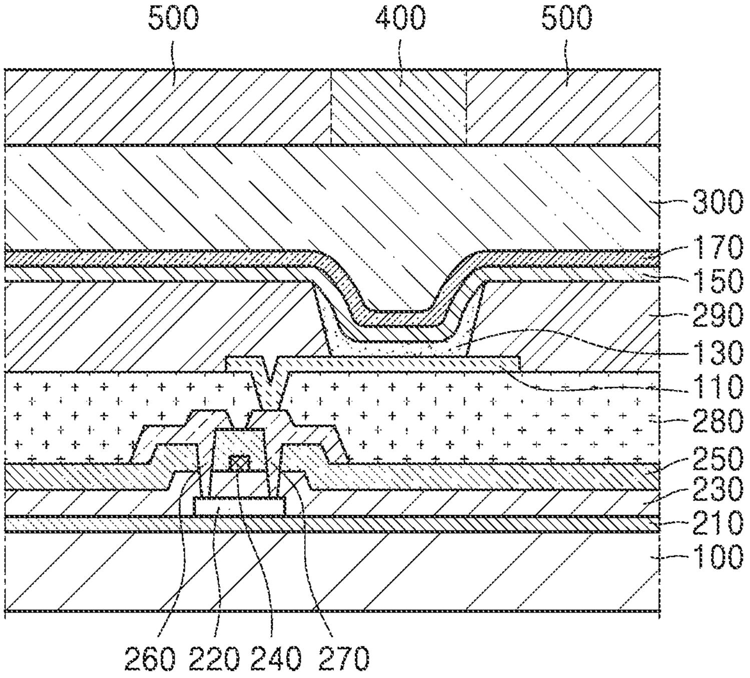
FIG. 3 is a schematic cross-sectional view of a structure of an electronic apparatus according to one or more embodiments of the present disclosure.

Descriptions of FIGS. 2 and 3

FIG. 2 is a cross-sectional view of a light-emitting apparatus as an example of the electronic apparatus according to one or more embodiments.

The light-emitting apparatus of FIG. 2 includes a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be arranged on the substrate 100. The buffer layer 210 may prevent or reduce penetration of impurities through the substrate 100 and may provide a flat surface on the substrate 100.

The TFT may be arranged on the buffer layer 210. The TFT may include an activation layer 220, a gate electrode 240, a source electrode 260, and a drain electrode 270.

The activation layer 220 may include an inorganic semiconductor such as silicon or polysilicon, an organic semiconductor, or an oxide semiconductor, and may include a source region, a drain region, and a channel region.

A gate insulating film 230 for insulating the activation layer 220 from the gate electrode 240 may be arranged on the activation layer 220, and the gate electrode 240 may be arranged on the gate insulating film 230.

An interlayer insulating film 250 may be arranged on the gate electrode 240. The interlayer insulating film 250 may be arranged between the gate electrode 240 and the source electrode 260 and between the gate electrode 240 and the drain electrode 270, to insulate from one another.

The source electrode 260 and the drain electrode 270 may be arranged on the interlayer insulating film 250. The interlayer insulating film 250 and the gate insulating film 230 may be formed to expose the source region and the drain region of the activation layer 220, and the source electrode 260 and the drain electrode 270 may be arranged in contact with the exposed portions of the source region and the drain region of the activation layer 220.

The TFT may be electrically connected to a light-emitting device to drive the light-emitting device, and may be covered and protected by a passivation layer 280. The passivation layer 280 may include an inorganic insulating film, an organic insulating film, or any combination thereof. A light-emitting device may be provided on the passivation layer 280. The light-emitting device may include the first electrode 110, the interlayer 130, and the second electrode 150.

The first electrode 110 may be arranged on the passivation layer 280. The passivation layer 280 may be arranged to expose a portion of the drain electrode 270, not fully covering the drain electrode 270, and the first electrode 110 may be arranged to be connected to the exposed portion of the drain electrode 270.

A pixel defining layer 290 including an insulating material may be arranged on the first electrode 110. The pixel defining layer 290 may expose a certain region of the first electrode 110, and an interlayer 130 may be formed in the exposed region of the first electrode 110. The pixel defining layer 290 may be a polyimide-based organic film or a polyacrylic-based organic film. In one or more embodiments, at least some layers of the interlayer 130 may extend beyond the upper portion of the pixel defining layer 290 to be arranged in the form of a common layer(s).

The second electrode 150 may be arranged on the interlayer 130, and a second capping layer 170 may be additionally formed on the second electrode 150. The second capping layer 170 may be formed to cover the second electrode 150.

The encapsulation portion 300 may be arranged on the second capping layer 170. The encapsulation portion 300 may be arranged on a light-emitting device to protect the light-emitting device from moisture and/or oxygen. The encapsulation portion 300 may include: an inorganic film including silicon nitride (SiNx), silicon oxide (SiOx), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (e.g., polymethyl methacrylate, polyacrylic acid, and/or the like), an epoxy-based resin (e.g., aliphatic glycidyl ether (AGE), and/or the like), or any combination thereof; or any combination of the inorganic film (s) and the organic film(s).

FIG. 3 is a cross-sectional view of a light-emitting apparatus as an example of the electronic apparatus according to one or more embodiments.

The light-emitting apparatus of FIG. 3 is the same as the light-emitting apparatus of FIG. 2, except that a light-shielding pattern 500 and a functional region 400 are additionally arranged on the encapsulation portion 300. The functional region 400 may be i) a color filter area, ii) a color conversion area, or iii) a combination of the color filter area and the color conversion area. In one or more embodiments, the light-emitting device included in the light-emitting apparatus of FIG. 3 may be a tandem light-emitting device.

Figure 4:
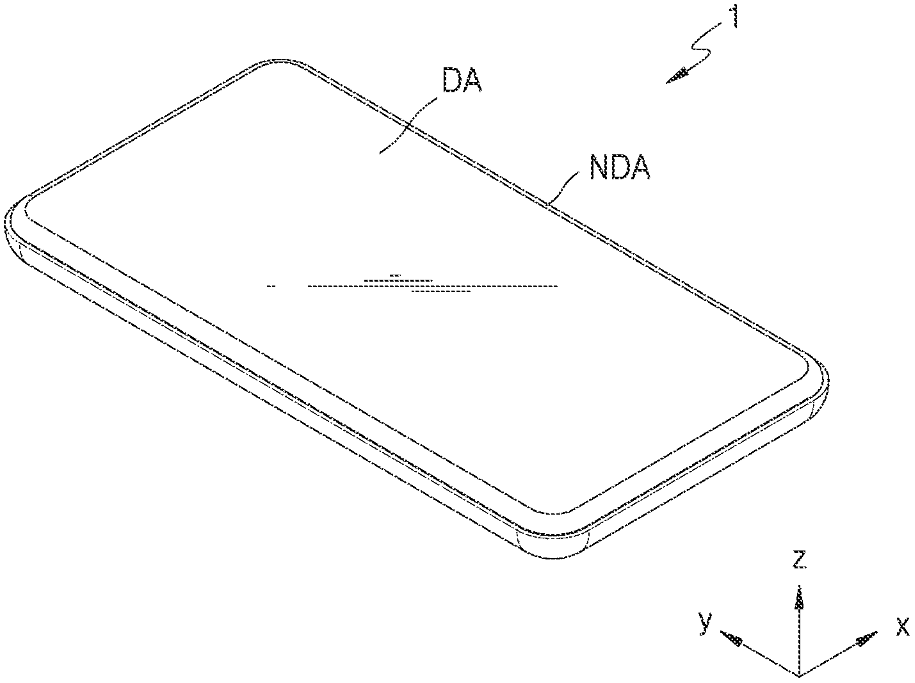
FIG. 4 is a schematic perspective view of electronic equipment including a light-emitting device according to one or more embodiments of the present disclosure.

Description of FIG. 4

FIG. 4 is a schematic perspective view of electronic equipment 1 including a light-emitting device according to one or more embodiments. The electronic equipment may be, as a device that displays a moving image or still image, a portable electronic equipment, such as a mobile phone, a smart phone, a tablet personal computer (PC), a mobile communication terminal, an electronic notebook, an electronic book, a portable multimedia player (PMP), a navigation, or a ultra-mobile PC (UMPC), as well as one or more suitable products, such as a television, a laptop, a monitor, a billboards, or an Internet of things (IoT). The electronic equipment 1 may be such a product above or a part thereof. In some embodiments, the electronic equipment 1 may be a wearable device, such as a smart watch, a watch phone, a glasses-type or kind display, or a head mounted display (HMD), or a part of the wearable device. However, embodiments are not limited thereto. For example, the electronic equipment 1 may include a dashboard of a vehicle, a center information display on a center fascia or dashboard of a vehicle, a room mirror display replacing a side mirror of a vehicle, an entertainment display arranged for the rear seat of a vehicle or arranged on the back of the front seat, a head-up display (HUD) installed at the front of a vehicle or projected on a front window glass, or a computer generated hologram augmented reality head up display (CGH AR HUD). FIG. 4 illustrates a case in which the electronic equipment 1 is a smart phone for convenience of explanation.

The electronic equipment 1 may include a display area DA and a non-display area NDA outside the display area DA. A display device may implement an image through an array of a plurality of pixels that are two-dimensionally arranged in the display area DA.

The non-display area NDA is an area that does not display an image, and may entirely surround the display area DA. On the non-display area NDA, a driver for providing electrical signals or power to display devices arranged on the display area DA may be arranged. On the non-display area NDA, a pad, which is an area to which an electronic element or a printing circuit board may be electrically connected, may be arranged.

In the electronic equipment 1, a length in the x-axis direction and a length in the y-axis direction may be different from each other. In one or more embodiments, as shown in FIG. 4, the length in the x-axis direction may be shorter than the length in the y-axis direction. In one or more embodiments, the length in the x-axis direction may be the same as the length in the y-axis direction. In one or more embodiments, the length in the x-axis direction may be longer than the length in the y-axis direction.

Descriptions of FIGS. 5 and 6A to 6C

Figure 5:
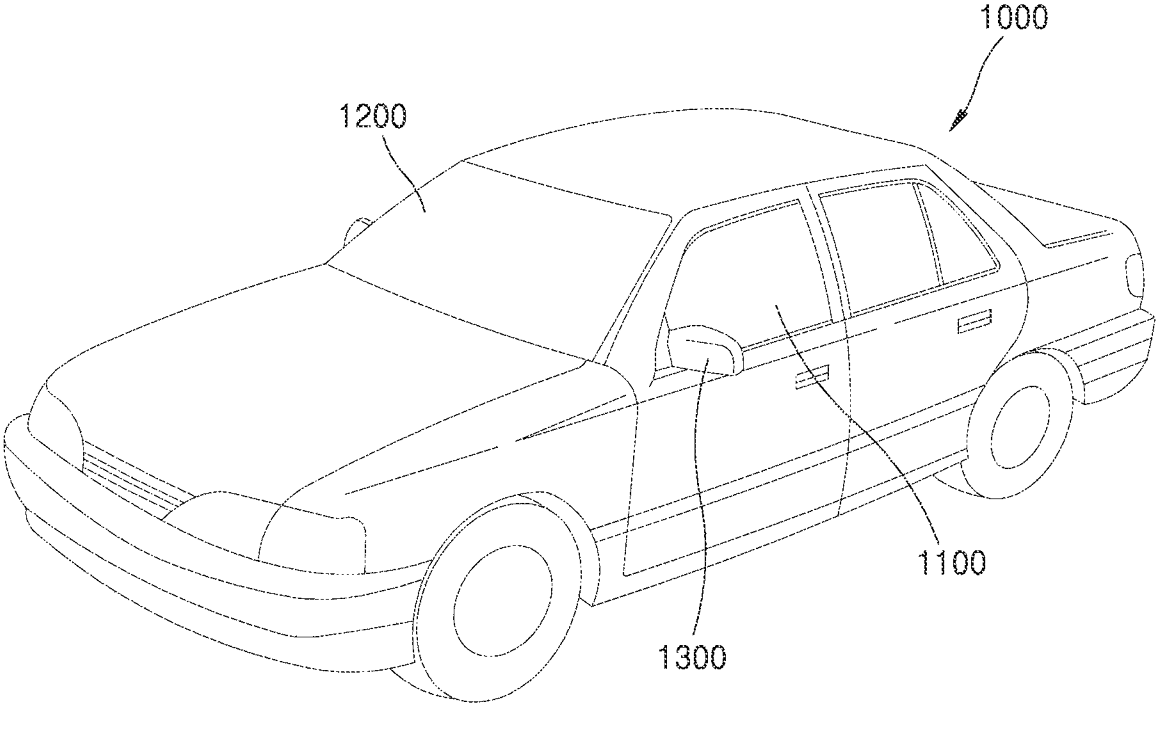
FIG. 5 is a diagram illustrating the exterior of a vehicle as electronic equipment including a light-emitting device according to one or more embodiments of the present disclosure
Figure 6A:
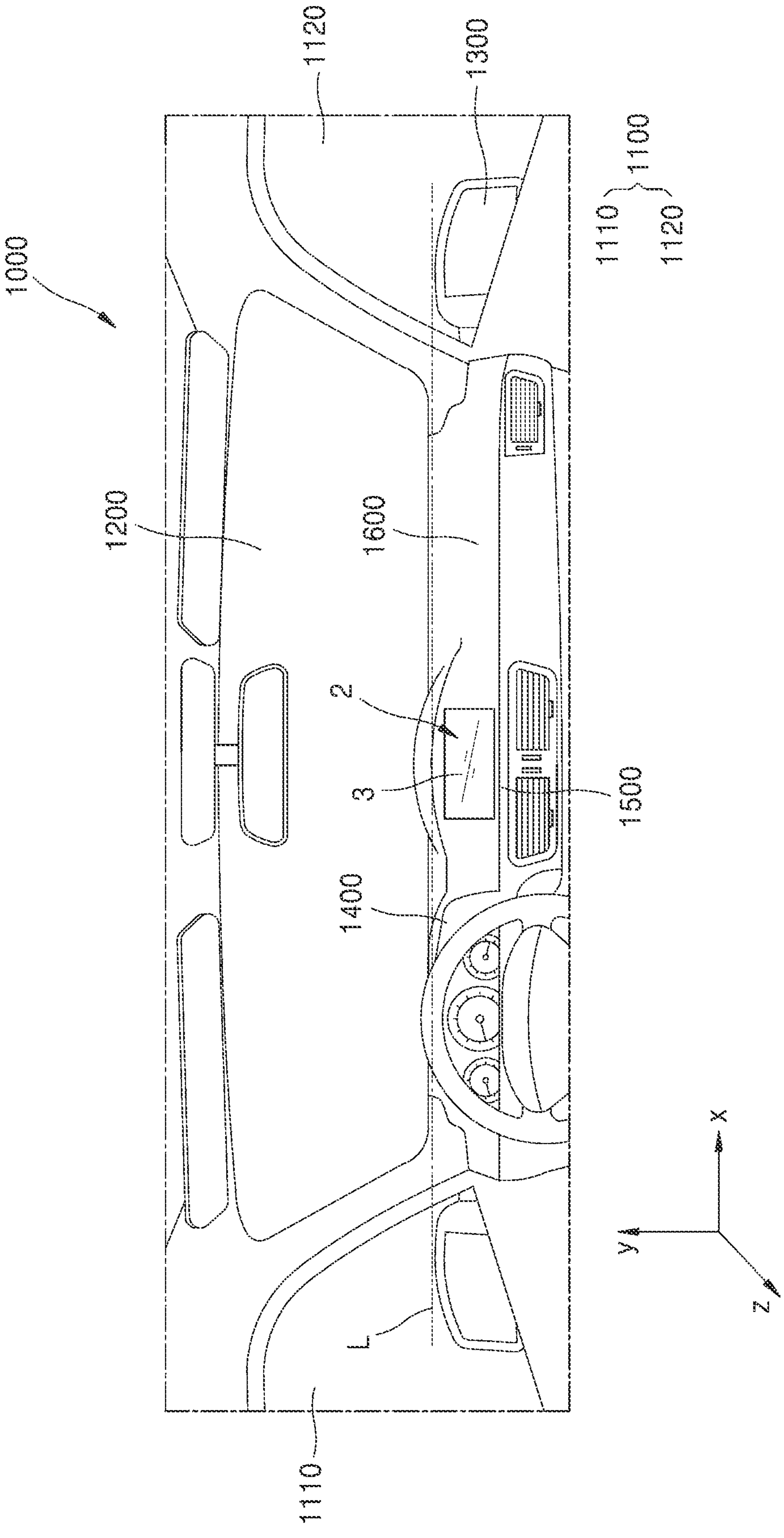
FIG. 6A is a schematic view of the interior of a vehicle that includes electronic equipment according to one or more embodiments of the present disclosure.
Figure 6B:
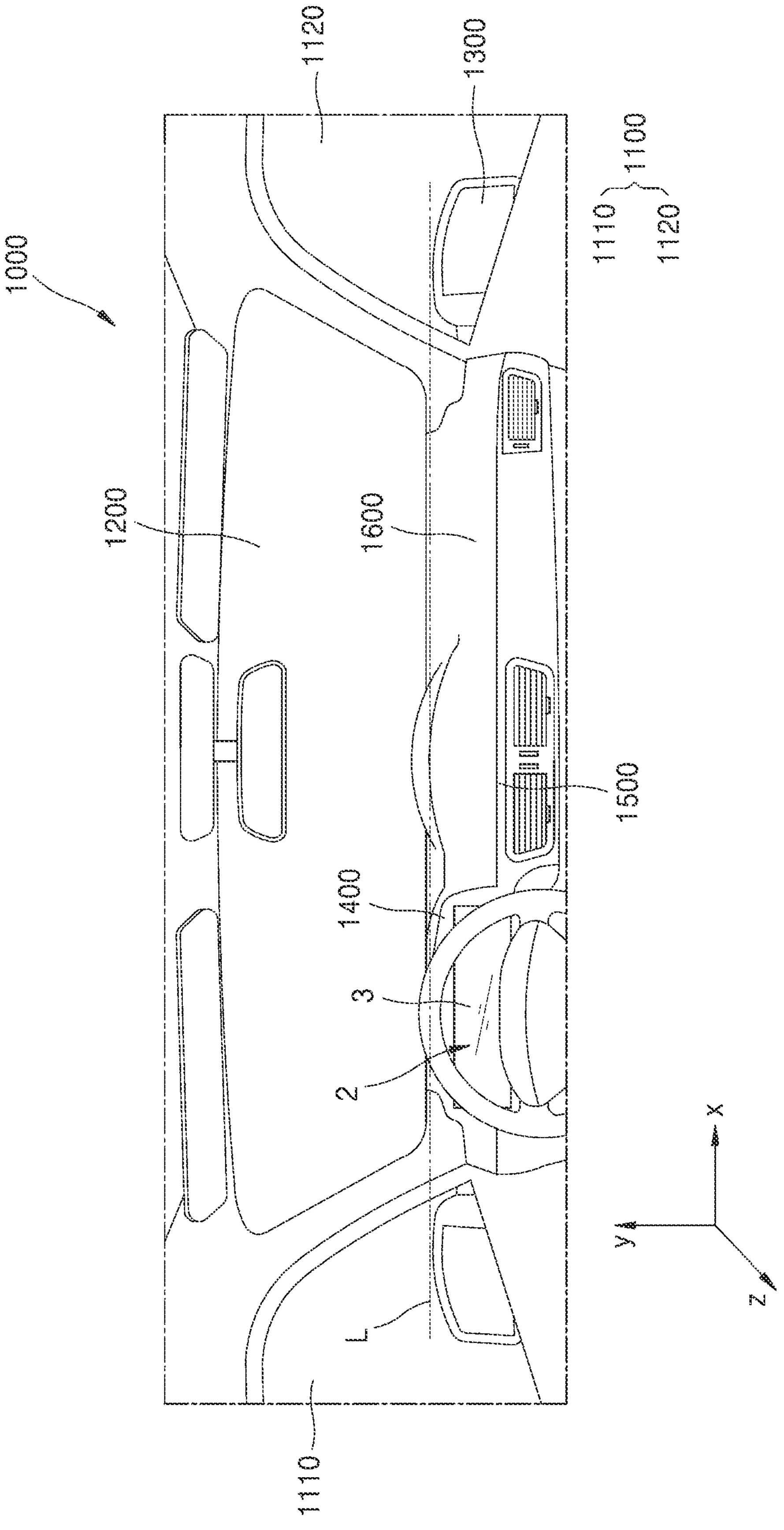
FIG. 6B is a schematic view of the interior of a vehicle that includes electronic equipment according to one or more embodiments of the present disclosure.
Figure 6C:
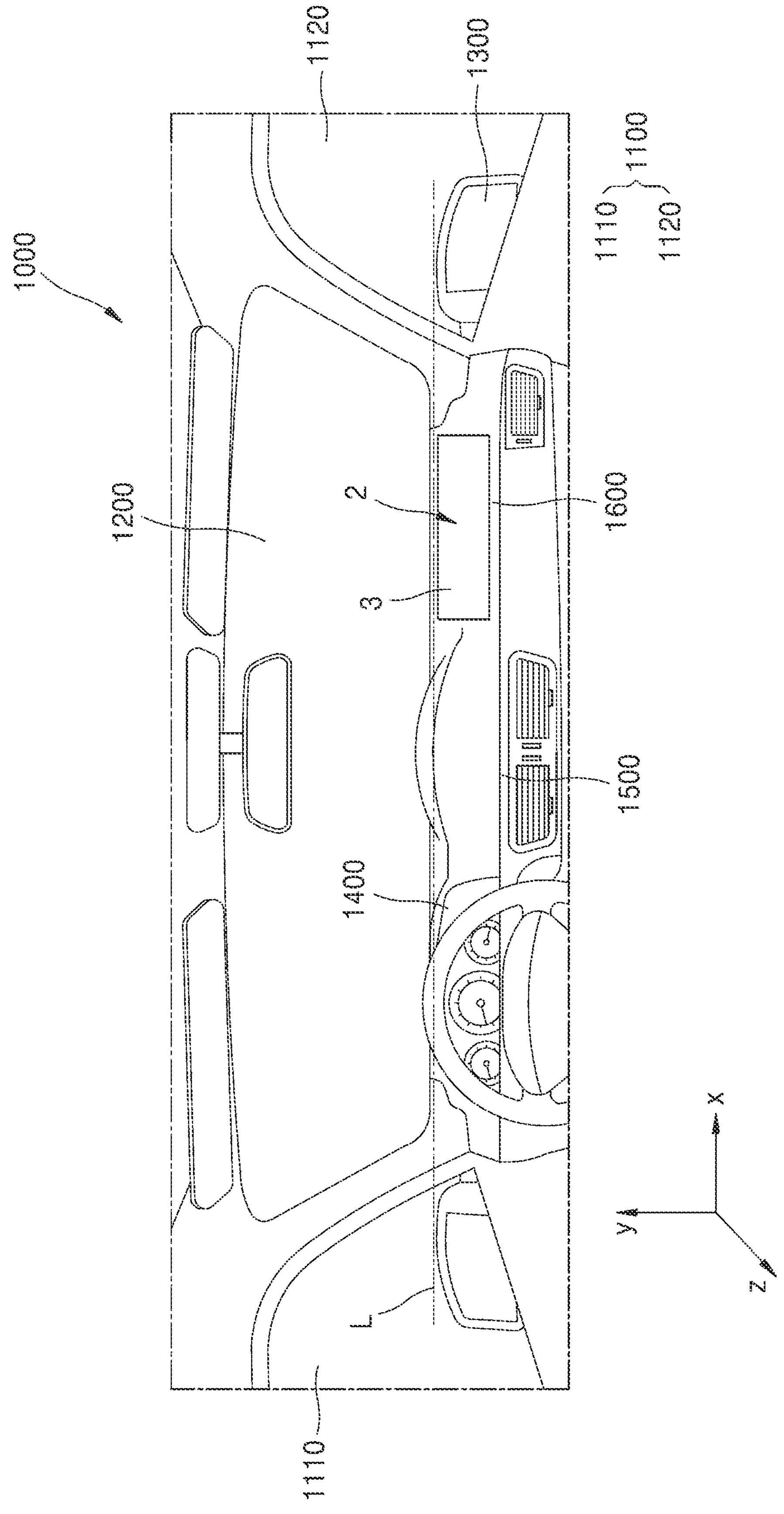
FIG. 6C is a schematic view of the interior of a vehicle that includes electronic equipment according to one or more embodiments of the present disclosure.

FIG. 5 is a schematic view of the exterior of a vehicle 1000 as electronic equipment including a light-emitting device according to one or more embodiments. FIGS. 6A to 6C are each a schematic view of the interior of the vehicle 1000 according to one or more embodiments.

Referring to FIGS. 5, 6A, 6B, and 6C, the vehicle 1000 may refer to one or more suitable apparatuses for moving a subject to be transported, such as a human, an object, or an animal, from a departure point to a destination point. The vehicle 1000 may include a vehicle (e.g., automobile) traveling on a road or track, a vessel moving over the sea or river, an airplane flying in the sky utilizing the action of air, and/or the like.

The vehicle 1000 may travel on a road or a track. The vehicle 1000 may move in a set or predetermined direction according to rotation of at least one wheel. For example, the vehicle 1000 may include a three-wheeled or four-wheeled vehicle, a construction machine, a two-wheeled vehicle, a prime mover device, a bicycle, and a train running on a track.

The vehicle 1000 may include a body having an interior and an exterior, and a chassis in which mechanical apparatuses necessary for driving are installed as other parts except for the body. The exterior of the vehicle body may include a front panel, a bonnet, a roof panel, a rear panel, a trunk, a pillar provided at a boundary between doors, and/or the like. The chassis of the vehicle 1000 may include a power generating device, a power transmitting device, a driving device, a steering device, a braking device, a suspension device, a transmission device, a fuel device, front and rear wheels, left and right wheels, and/or the like.

The vehicle 1000 may include a side window glass 1100, a front window glass 1200, a side mirror 1300, a cluster 1400, a center fascia 1500, a passenger seat dashboard 1600, and a display device 2.

The side window glass 1100 and the front window glass 1200 may be partitioned by a pillar arranged between the side window glass 1100 and the front window glass 1200.

The side window glass 1100 may be installed on the side of the vehicle 1000. In one or more embodiments, the side window glass 1100 may be installed on a door of the vehicle 1000. A plurality of side window glasses 1100 may be provided and may face each other. In one or more embodiments, the side window glass 1100 may include a first side window glass 1110 and a second side window glass 1120. In one or more embodiments, the first side window glass 1110 may be arranged adjacent to the cluster 1400. The second side window glass 1120 may be arranged adjacent to the passenger seat dashboard 1600.

In one or more embodiments, the side window glasses 1100 may be spaced apart from each other in the x-direction or the −x-direction. For example, the first side window glass 1110 and the second side window glass 1120 may be spaced apart from each other in the x-direction or the −x-direction. In other words, an imaginary straight line L connecting the side window glasses 1100 may extend in the x-direction or the −x-direction. For example, the imaginary straight line L connecting the first side window glass 1110 and the second side window glass 1120 to each other may extend in the x-direction or the −x-direction.

The front window glass 1200 may be installed in the front of the vehicle 1000. The front window glass 1200 may be arranged between the side window glasses 1100 facing each other.

The side mirror 1300 may provide a rear view of the vehicle 1000. The side mirror 1300 may be installed on the exterior of the vehicle body. In one or more embodiments, a plurality of side mirrors 1300 may be provided. Any one of the plurality of side mirrors 1300 may be arranged outside the first side window glass 1110. The other one of the plurality of side mirrors 1300 may be arranged outside the second side window glass 1120.

The cluster 1400 may be arranged in front of the steering wheel. The cluster 1400 may include a tachometer, a speedometer, a coolant thermometer, a fuel gauge turn indicator, a high beam indicator, a warning lamp, a seat belt warning lamp, an odometer, a hodometer, an automatic shift selector indicator lamp, a door open warning lamp, an engine oil warning lamp, and/or a low fuel warning light.

The center fascia 1500 may include a control panel on which a plurality of buttons for adjusting an audio device, an air conditioning device, and a heater of a seat are arranged. The center fascia 1500 may be arranged on one side of the cluster 1400.

The passenger seat dashboard 1600 may be spaced apart from the cluster 1400 with the center fascia 1500 arranged therebetween. In one or more embodiments, the cluster 1400 may be arranged to correspond to a driver seat, and the passenger seat dashboard 1600 may be arranged to correspond to a passenger seat. In one or more embodiments, the cluster 1400 may be adjacent to the first side window glass 1110, and the passenger seat dashboard 1600 may be adjacent to the second side window glass 1120.

In one or more embodiments, the display device 2 may include a display panel 3, and the display panel 3 may display an image. The display device 2 may be arranged inside the vehicle 1000. In one or more embodiments, the display device 2 may be arranged between the side window glasses 1100 facing each other. The display device 2 may be arranged on at least one of the cluster 1400, the center fascia 1500, and the passenger seat dashboard 1600.

The display device 2 may include an organic light-emitting display device, an inorganic light-emitting display device, a quantum dot display device, and/or the like. Hereinafter, as the display device 2 according to one or more embodiments of the disclosure, an organic light-emitting display device including the light-emitting device according to the disclosure will be described as an example, but one or more suitable types (kinds) of display devices as described above may be utilized in embodiments of the disclosure.

Referring to FIG. 6A, the display device 2 may be arranged on the center fascia 1500. In one or more embodiments, the display device 2 may display navigation information. In one or more embodiments, the display device 2 may display audio, video, or information regarding vehicle settings.

Referring to FIG. 6B, the display device 2 may be arranged on the cluster 1400. When the display device 2 is arranged on the cluster 1400, the cluster 1400 may display driving information and/or the like through the display device 2. For example, the cluster 1400 may be implemented digitally. The digital cluster 1400 may display vehicle information and driving information as images. For example, a needle and a gauge of a tachometer and one or more suitable warning light icons may be displayed by a digital signal.

Referring to FIG. 6C, the display device 2 may be arranged on the passenger seat dashboard 1600. The display device 2 may be embedded in the passenger seat dashboard 1600 or arranged on the passenger seat dashboard 1600. In one or more embodiments, the display device 2 arranged on the passenger seat dashboard 1600 may display an image related to information displayed on the cluster 1400 and/or information displayed on the center fascia 1500. In one or more embodiments, the display device 2 arranged on the passenger seat dashboard 1600 may display information different from information displayed on the cluster 1400 and/or information displayed on the center fascia 1500.

Manufacturing Method

The layers constituting the hole transport region, the emission layer, and the layers constituting the electron transport region may be formed in a certain region by utilizing one or more suitable methods such as vacuum deposition, spin coating, casting, Langmuir-Blodgett (LB) deposition, inkjet printing, laser-printing, laser-induced thermal imaging, and/or the like.

When the layers constituting the hole transport region, the emission layer, and the layers constituting the electron transport region are formed by vacuum deposition, the deposition may be performed at a deposition temperature in a range of about 100° C. to about 500° C., at a vacuum degree in a range of about 10-8 torr to about 10-3 torr, and at a deposition speed in a range of about 0.01 Å/see to about 100 Å/see, depending on a material to be included in a layer to be formed and the structure of a layer to be formed.

Definition of Terms

The term "$C_3$-$C_{60}$ carbocyclic group" as utilized herein refers to a cyclic group consisting of carbon only as a ring-forming atom and having 3 to 60 carbon atoms, and the term "$C_1$-$C_{60}$ heterocyclic group" as utilized herein refers to a cyclic group that has to 60 carbon atoms and further has, in addition to carbon, a heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other. For example, the number of ring-forming atoms of the $C_1$-$C_{60}$ heterocyclic group may be from 3 to 61.

The term "cyclic group" as utilized herein may include both (e.g., simultaneously) the $C_3$-$C_{60}$ carbocyclic group and the $C_1$-$C_{60}$ heterocyclic group.

The term "π electron-rich $C_3$-$C_{60}$ cyclic group" as utilized herein refers to a cyclic group that has 3 to 60 carbon atoms and does not include *—N═*' as a ring-forming moiety, and the term "π electron-deficient nitrogen-containing $C_1$-$C_{60}$ heterocyclic group" as utilized herein refers to a heterocyclic group that has 1 to 60 carbon atoms and includes *—N═*' as a ring-forming moiety.

For example, the $C_3$-$C_{60}$ carbocyclic group may be i) Group T1 or ii) a condensed cyclic group in which two or more of Group T1 are condensed with each other (e.g., a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) Group T2, ii) a condensed cyclic group in which two or more of Group T2 are condensed with each other, or iii) a condensed cyclic group in which at least one Group T2 and at least one Group T1 are condensed with each other (e.g., a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and/or the like), the π electron-rich $C_3$-$C_{60}$ cyclic group may be i) Group T1, ii) a condensed cyclic group in which two or more of Group T1 are condensed with each other, iii) Group T3, iv) a condensed cyclic group in which two or more of Group T3 are condensed with each other, or v) a condensed cyclic group in which at least one Group T3 and at least one Group T1 are condensed with each other (e.g., the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, and/or the like), the π electron-deficient nitrogen-containing $C_1$-$C_{60}$ heterocyclic group may be i) Group T4, ii) a condensed cyclic group in which two or more of Group T4 are condensed with each other, iii) a condensed cyclic group in which at least one Group T4 and at least one Group T1 are condensed with each other, iv) a condensed cyclic group in which at least one Group T4 and at least one Group T3 are condensed with each other, or v) a condensed cyclic group in which at least one Group T4, at least one Group T1, and at least one Group T3 are condensed with one another (e.g., a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and/or the like), Group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or bicyclo[2.2.1]heptane) group, a norbornene group, a bicyclo[1.1.1]pentane group, a bicyclo[2.1.1]hexane group, a bicyclo[2.2.2]octane group, or a benzene group, Group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, Group T3 may be a furan group, a thiophene group, a 1H-pyrrole group, a silole group, or a borole group, and Group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group, the $C_3$-$C_{60}$ carbocyclic group, the $C_1$-$C_{60}$ heterocyclic group, the π electron-rich $C_3$-$C_{60}$ cyclic group, or the π electron-deficient nitrogen-containing $C_1$-$C_{60}$ heterocyclic group" as utilized herein may refer to a group condensed to any cyclic group, a monovalent group, or a polyvalent group (e.g., a divalent group, a trivalent group, a tetravalent group, and/or the like) according to the structure of a formula for which the corresponding term is utilized. For example, the "benzene group" may be a benzo group, a phenyl group, a phenylene group, and/or the like, which may be easily understood by one of ordinary skill in the art according to the structure of a formula including the "benzene group."

Depending on context, a divalent group may refer or be a polyvalent group (e.g., trivalent, tetravalent, etc., and not just divalent) per, e.g., the structure of a formula in connection with which of the terms are utilized.

Examples of the monovalent $C_3$-$C_{60}$ carbocyclic group and the monovalent $C_1$-$C_{60}$ heterocyclic group are a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Examples of the divalent $C_3$-$C_{60}$ carbocyclic group and the monovalent $C_1$-$C_{60}$ heterocyclic group are a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as utilized herein refers to a linear or branched aliphatic hydrocarbon monovalent group that has 1 to 60 carbon atoms, and examples thereof are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, and/or the like. The term "$C_1$-$C_{60}$ alkylene group" as utilized herein refers to a divalent group having the same structure as the $C_1$-$C_{60}$ alkyl group.

The term "$C_2$-$C_{60}$ alkenyl group" as utilized herein refers to a monovalent hydrocarbon group having at least one carbon-carbon double bond in the middle or at the terminus of the $C_2$-$C_{60}$ alkyl group, and examples thereof are an ethenyl group, a propenyl group, a butenyl group, and/or the like. The term "$C_2$-$C_{60}$ alkenylene group" as utilized herein refers to a divalent group having the same structure as the $C_2$-$C_{60}$ alkenyl group.

The term "$C_2$-$C_{60}$ alkynyl group" as utilized herein refers to a monovalent hydrocarbon group having at least one carbon-carbon triple bond in the middle or at the terminus of the $C_2$-$C_{60}$ alkyl group, and examples thereof are an ethynyl group, a propynyl group, and/or the like. The term "$C_2$-$C_{60}$ alkynylene group" as utilized herein refers to a divalent group having the same structure as the $C_2$-$C_{60}$ alkynyl group.

The term "$C_1$-$C_{60}$ alkoxy group" as utilized herein refers to a monovalent group represented by $-OA_{101}$ (wherein $A_{101}$ is the $C_1$-$C_{60}$ alkyl group), and examples thereof are a methoxy group, an ethoxy group, an isopropyloxy group, and/or the like.

The term "$C_3$-$C_{10}$ cycloalkyl group" as utilized herein refers to a monovalent saturated hydrocarbon cyclic group having 3 to 10 carbon atoms, and examples thereof are a cyclopropyl group, a cyclobutyl group, a cyclopentyl group, a cyclohexyl group, a cycloheptyl group, a cyclooctyl group, an adamantanyl group, a norbornanyl group (or bicyclo [2.2.1]heptyl group), a bicyclo[1.1.1]pentyl group, a bicyclo [2.1.1]hexyl group, a bicyclo[2.2.2]octyl group, and/or the like. The term "$C_3$-$C_{10}$ cycloalkylene group" as utilized herein refers to a divalent group having the same structure as the $C_3$-$C_{10}$ cycloalkyl group.

The term "$C_1$-$C_{10}$ heterocycloalkyl group" as utilized herein refers to a monovalent cyclic group of 1 to 10 carbon atoms, further including, in addition to carbon atoms, at least one heteroatom, as ring-forming atoms, and examples thereof are a 1,2,3,4-oxatriazolidinyl group, a tetrahydrofuranyl group, a tetrahydrothiophenyl group, and/or the like. The term "$C_1$-$C_{10}$ heterocycloalkylene group" as utilized herein refers to a divalent group having the same structure as the $C_1$-$C_{10}$ heterocycloalkyl group.

The term "$C_3$-$C_{10}$ cycloalkenyl group" as utilized herein refers to a monovalent cyclic group that has 3 to 10 carbon atoms and at least one carbon-carbon double bond in the ring thereof and no aromaticity, and examples thereof are a cyclopentenyl group, a cyclohexenyl group, a cycloheptenyl group, and/or the like. The term "$C_3$-$C_{10}$ cycloalkenylene group" as utilized herein refers to a divalent group having the same structure as the $C_3$-$C_{10}$ cycloalkenyl group.

The term "$C_1$-$C_{10}$ heterocycloalkenyl group" as utilized herein refers to a monovalent cyclic group of 1 to 10 carbon atoms, further including, in addition to carbon atoms, at least one heteroatom, as ring-forming atoms, and having at least one carbon-carbon double bond in the cyclic structure thereof. Examples of the $C_1$-$C_{10}$ heterocycloalkenyl group are a 4,5-dihydro-1,2,3,4-oxatriazolyl group, a 2,3-dihydrofuranyl group, a 2,3-dihydrothiophenyl group, and/or the like. The term "$C_1$-$C_{10}$ heterocycloalkenylene group" as utilized herein refers to a divalent group having the same structure as the $C_1$-$C_{10}$ heterocycloalkenyl group.

The term "$C_6$-$C_{60}$ aryl group" as utilized herein refers to a monovalent group having a carbocyclic aromatic system of 6 to 60 carbon atoms, and the term "$C_6$-$C_{60}$ arylene group" as utilized herein refers to a divalent group having a carbocyclic aromatic system of 6 to 60 carbon atoms. Examples of the $C_6$-$C_{60}$ aryl group are a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, an ovalenyl group, and/or the like. When the $C_6$-$C_{60}$ aryl group and the $C_6$-$C_{60}$ arylene group each include two or more rings, the rings may be condensed with each other.

The term "$C_1$-$C_{60}$ heteroaryl group" as utilized herein refers to a monovalent group having a heterocyclic aromatic system of 1 to 60 carbon atoms, further including, in addition to carbon atoms, at least one heteroatom, as ring-forming atoms. The term "$C_1$-$C_{60}$ heteroarylene group" as utilized herein refers to a divalent group having a heterocyclic aromatic system of 1 to 60 carbon atoms, further including, in addition to carbon atoms, at least one heteroatom, as ring-forming atoms. Examples of the $C_1$-$C_{60}$ heteroaryl group are a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, a naphthyridinyl group, and/or the like. When the $C_1$-$C_{60}$ heteroaryl group and the $C_1$-$C_{60}$ heteroarylene group each include two or more rings, the rings may be condensed with each other.

The term "monovalent non-aromatic condensed polycyclic group" as utilized herein refers to a monovalent group (e.g., having 8 to 60 carbon atoms) having two or more rings condensed to each other, only carbon atoms as ring-forming atoms, and no aromaticity in its entire molecular structure. Examples of the monovalent non-aromatic condensed polycyclic group are an indenyl group, a fluorenyl group, a spiro-bifluorenyl group, a benzofluorenyl group, an indenophenanthrenyl group, an indeno anthracenyl group, and/or the like. The term "divalent non-aromatic condensed polycyclic group" as utilized herein refers to a divalent group having the same structure as the monovalent non-aromatic condensed polycyclic group.

The term "monovalent non-aromatic condensed heteropolycyclic group" as utilized herein refers to a monovalent group (e.g., having 1 to 60 carbon atoms) having two or more rings condensed to each other, further including, in addition to carbon atoms, at least one heteroatom, as ring-forming atoms, and having non-aromaticity in its entire molecular structure. Examples of the monovalent non-aromatic condensed heteropolycyclic group are a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, a benzothienodibenzothiophenyl group, and/or the like. The term "divalent non-aromatic condensed heteropolycyclic group" as utilized herein refers to a divalent group having the same structure as the monovalent non-aromatic condensed heteropolycyclic group.

The term "$C_6$-$C_{60}$ aryloxy group" as utilized herein refers to —$OA_{102}$ (wherein $A_{102}$ is the $C_6$-$C_{60}$ aryl group), and the term "$C_6$-$C_{60}$ arylthio group" as utilized herein refers to —$SA_{103}$ (wherein $A_{103}$ is the $C_6$-$C_{60}$ aryl group).

The term "$C_7$-$C_{60}$ arylalkyl group" as utilized herein refers to -$A_{104}A_{105}$ (wherein $A_{104}$ is a $C_1$-$C_{54}$ alkylene group, and $A_{105}$ is a $C_6$-$C_{59}$ aryl group), and the term "$C_2$-$C_{60}$ heteroarylalkyl group" as utilized herein refers to -$A_{106}A_{107}$ (wherein $A_{106}$ is a $C_1$-$C_{59}$ alkylene group, and $A_{107}$ is a $C_1$-$C_{59}$ heteroaryl group).

The term "$R_{10a}$" as utilized herein may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or Si($Q_{31}$) ($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

In the specification, $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_5$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ arylalkyl group; or a $C_2$-$C_{60}$ heteroarylalkyl group.

The term "heteroatom" as utilized herein refers to any atom other than a carbon atom. Examples of the heteroatom are O, S, N, P, Si, B, Ge, Se, and any combination thereof.

The term "third-row transition metal" as utilized herein includes Hf, Ta, W, Re, Os, Ir, Pt, Au, and/or the like.

"Ph" as utilized herein refers to a phenyl group, "Me" as utilized herein refers to a methyl group, "Et" as utilized herein refers to an ethyl group, "ter-Bu" or "But" as utilized herein refers to a tert-butyl group, and "OMe" as utilized herein refers to a methoxy group.

The term "biphenyl group" as utilized herein refers to "a phenyl group substituted with a phenyl group." In other words, the "biphenyl group" may be a substituted phenyl group having a $C_6$-$C_{60}$ aryl group as a substituent.

The term "terphenyl group" as utilized herein refers to "a phenyl group substituted with a biphenyl group." In other words, the "terphenyl group" may be a substituted phenyl group having, as a substituent, a $C_6$-$C_{60}$ aryl group substituted with a $C_6$-$C_{60}$ aryl group.

* and *' as utilized herein, unless defined otherwise, each refer to a binding site to a neighboring atom in a corresponding formula or moiety.

In the specification, the x-axis, y-axis, and z-axis are not limited to three axes in an orthogonal coordinate system, and may be interpreted in a broad sense including these axes. For example, the x-axis, y-axis, and z-axis may refer to those orthogonal to each other, or may refer to those in different directions that are not orthogonal to each other.

Terms such as "substantially," "about," and "approximately" are used as relative terms and not as terms of degree, and are intended to account for the inherent deviations in measured or calculated values that would be recognized by those of ordinary skill in the art. They may be inclusive of the stated value and an acceptable range of deviation as determined by one of ordinary skill in the art, considering the limitations and error associated with measurement of that quantity. For example, "about" may refer to one or more standard deviations, or +30%, 20%, 10%, 5% of the stated value.

Numerical ranges disclosed herein include and are intended to disclose all subsumed sub-ranges of the same numerical precision. For example, a range of "1.0 to 10.0" includes all subranges having a minimum value equal to or greater than 1.0 and a maximum value equal to or less than 10.0, such as, for example, 2.4 to 7.6. Applicant therefore reserves the right to amend this specification, including the claims, to expressly recite any sub-range subsumed within the ranges expressly recited herein.

The light emitting device and/or any other relevant devices or components according to embodiments of the present disclosure described herein may be implemented utilizing any suitable hardware, firmware (e.g., an application-specific integrated circuit), software, or a combination of software, firmware, and hardware. For example, the various components of the light emitting device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

In the present disclosure, when particles (e.g., nanoparticles or dots) are spherical, "diameter" indicates an average particle diameter, and when the particles are non-spherical, the "diameter" indicates a major axis length. The diameter (or size) of the particles may be measured by particle size analysis, dynamic light scattering, scanning electron microscopy, and/or transmission electron microscope photography. When the size of the particles is measured utilizing a particle size analyzer, the average particle diameter (or size) may be referred to as D50. The term "D50" as utilized herein refers to the average diameter (or size) of particles whose cumulative volume corresponds to 50 vol % in the particle size distribution (e.g., cumulative distribution), and refers to the value of the particle size corresponding to 50% from the smallest particle when the total number of particles is 100% in the distribution curve accumulated in the order of the smallest particle size to the largest particle size. Particle size analysis may be performed with a HORIBA LA-950 laser particle size analyzer.

Hereinafter, compounds according to embodiments and light-emitting devices according to embodiments will be described in more detail with reference to the following synthesis examples and examples. The wording "B was utilized instead of A" utilized in describing Synthesis Examples refers to that an identical molar equivalent of B was utilized in place of A.

EXAMPLES

Example 1: Synthesis of Metal Oxide Nanoparticle

To synthesize $Zn_xMg_ySn_xO$ nanoparticles, 65.2 millimole (mmol) of zinc acetate dihydrate, 14.8 mmol of magnesium acetate tetrahydrate, 4.0 mmol of tin(II) chloride pentahydrate, and 320 mL of dimethyl sulfoxide were injected into a reactor, followed by stirring for 120 minutes. Then, after the temperature of the reactor was lowered to 4° C., 80 mL of a mixed solution including 1M tetramethylammonium hydroxide pentahydrate (TMAH) and ethanol was injected thereinto for 20 minutes. After completion of the injection of the TMAH solution, the reaction was maintained for hour and 20 minutes, and then, the synthesized $Zn_xMg_ySn_zO$ nanoparticles were precipitated by utilizing acetone and hexane. The final precipitated nanoparticles were dispersed in ethanol.

Comparative Example 1

To synthesize $Zn_xMg_yO$ nanoparticles, 80 mmol of zinc acetate dihydrate, 14.8 mmol of magnesium acetate tetrahydrate, and 320 mL of dimethyl sulfoxide were injected into a reactor, followed by stirring for 120 minutes. Then, after the temperature of the reactor was lowered to 4° C., 80 mL of a mixed solution including 1M TMAH and ethanol was injected thereinto for 20 minutes. After completion of the injection of the TMAH solution, the reaction was maintained for 2 hours, and then, the synthesized $Zn_xMg_yO$ nanoparticles were precipitated by utilizing acetone and hexane. The final precipitated nanoparticles were dispersed in ethanol.

Evaluation Example 1

To measure the atomic ratio of each of the metal oxide nanoparticles prepared in Example 1 and Comparative Example 1, ICP-OES was performed by utilizing OPTIMA-4300DV from Perkin-Elmer Inc., and results thereof are shown in Table 2.

TABLE 2

| | ICP analysis result (%) | | |
|---|---|---|---|
| Metal oxide nanoparticle | Zn | Mg | Sn |
| Example 1 ($Zn_xMg_ySn_zO$) | 85.40 | 12.33 | 2.28 |
| Comparative Example 1 ($Zn_xMg_yO$) | 86.12 | 13.88 | — |

Example 2: Synthesis of Nanocomposite 0.15 mL of poly(ethylene glycol)methyletherthiol was injected into 40 mL of a mixed solution including $Zn_xMg_ySn_zO$ prepared in Example 1 and 5 wt % of ethanol. Then, the mixed solution was stirred at 30° C. for 1 hour to synthesize a nanocomposite. Thereafter, 200 mL of n-hexane was injected into the mixed solution, and a $Zn_xMg_ySn_zO$-ligand nanocomposite was precipitated and separated therefrom.

Comparative Example 2

A $Zn_xMg_yO$-ligand nanocomposite was synthesized and separated in substantially the same manner as in Example 2, except that $Zn_xMg_yO$ of Comparative Example 1 was utilized instead of $Zn_xMg_ySn_zO$ of Example 1.

Evaluation Example 2

The PLQY and maximum emission wavelength of each of the nanocomposites of Example 2 and Comparative Example 2 were measured by utilizing QE-2100 equipment from Otsuka Electronics Co., Ltd., and results thereof are shown in Table 3.

In some embodiments, the surface organic amount of each of the nanocomposites of Example 2 and Comparative Example 2 was measured by utilizing TGA 5500 equipment from TA Instruments Inc., and results thereof are shown in Table 3.

In some embodiments, particle size analysis according to DLS was performed for each of the nanocomposites of Example 2 and Comparative Example 2 by utilizing Nano-ZS90 from Malvern Panalytical Ltd. to measure the average particle size on day 0 and the average particle size on day 21, and results thereof are shown in Table 3.

TABLE 3

| | | UV absorption | Surface organic amount | Particle size (DLS_D(v) 50%, nm) | |
|---|---|---|---|---|---|
| Nanocomposite | PLQY (%) | peak (nm) | (wt %) | Day 0 | Day 21 |
| Example 2 | 2 | 300 | 18.8 | 13.2 | 12.8 |
| Comparative Example 2 | 58 | 311 | 16.8 | 13.3 | 300 |

According to Table 3, it was confirmed that the nanocomposite of Example 2 had decreased bonding-based PLQY due to reduced defects in crystals and had excellent or suitable surface organic content (e.g., amount) and particle stability, compared to the nanocomposite of Comparative Example 2.

Example 3: Preparation of Ink Composition

The nanocomposite prepared in Example 2 was dispersed in an amount of 5 wt % in a mixed solvent including diethylene glycol butyl methyl ether (DEGBME) and tripropylene glycol butyl ether (TPGBE) at a ratio of 7:3, thereby preparing an ink composition.

Comparative Example 3

An ink composition was prepared in substantially the same manner as in Example 3, except that the nanocomposite prepared in Comparative Example 2 was utilized instead of the nanocomposite of Example 2.

Evaluation Example 3

Green light-emitting InP quantum dots, which are light-emitting materials, were spin-coated to a thickness of 400 angstrom (Å), followed by heating at 140° C. for 10 minutes to dry the dispersing solvent, thereby forming a first layer. Then, the emission intensity ($I_1$) of the first layer was measured by utilizing FluoroMax Plus equipment from Horiba, Ltd.

Then, each of the ink compositions of Example 3 and Comparative Example 3 was spin-coated on the respective first layer to a thickness of 400 Å, followed by heating at 140° C. for 10 minutes to dry the dispersing solvent, thereby forming a second layer. Then, the emission intensity ($I_{1+2}$) of the first and second layers was measured by utilizing FluoroMax Plus equipment from Horiba, Ltd.

Then, for each of the ink compositions of Example 3 and Comparative Example 3, the reduction ratio (%; $\{(I_1-I_{1+2})/I_1\}\times100$) of the emission intensity ($I_{1+2}$) of the first and second layers to the emission intensity ($I_1$) of the first layer was calculated, and results thereof are shown in Table 4.

TABLE 4

| Ink composition | Emission intensity reduction ratio (relative value, %) |
|---|---|
| Example 3 | 10% |
| Comparative Example 3 | 30% |

According to Table 4, it was confirmed that the ink composition of Example 3 had a decreased emission intensity reduction ratio compared to the ink composition of Comparative Example 3.

Example 4: Manufacture of Light-Emitting Device

As an anode, a glass substrate with 15 ohm per square centimeter (Ω/cm$^2$) (1,200 Å) ITO patterned thereon (product of Corning Inc.) was cut to a size of 50 millimeter (mm)×50 mm×0.7 mm, sonicated utilizing isopropyl alcohol and pure water each for 5 minutes, and then cleaned by irradiation of ultraviolet rays and exposure of ozone thereto for 30 minutes. Then, the glass substrate was mounted on a vacuum deposition apparatus.

PEDOT:PSS (Clevios™ HIL8) was inkjet-printed on the glass substrate with a transparent electrode line attached thereon to form a film having a thickness of 60 nanometer (nm), followed by baking at 120° C. for 10 minutes, thereby forming a hole injection layer. Compound 101 was inkjet-printed on the hole injection layer to form a film having a thickness of 20 nm, followed by baking at 120° C. for 10 minutes, thereby forming a hole transport layer.

Compound 101

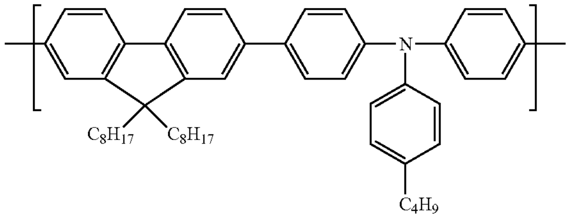

Green light-emitting InP quantum dots dispersed in n-octane were inkjet-printed on the hole transport layer to form a film having a thickness of 20 nm, followed by baking at 100° C. for 10 minutes, thereby forming an emission layer. The ink composition of Example 3 was inkjet-printed on the emission layer to form a film having a thickness of 30 nm, followed by baking at 120° C. for 10 minutes, thereby forming an electron transport layer. After the glass substrate was mounted on a substrate holder of a vacuum deposition apparatus, Ag/Mg was deposited on the electron transport layer to form an anode having a thickness of 100 nm, thereby completing the manufacture of a quantum dot light-emitting device. The equipment utilized for the inkjet printing and deposition included DMP-2850 from Fujifilm Dimatix Inc. and Suicel plus 200 evaporator from Sunic System Co., Ltd.

Comparative Example 4

A light-emitting device was manufactured in substantially the same manner as in Example 4, except that the ink composition according to Comparative Example 3 was utilized instead of the ink composition according to Example 3 in forming the electron transport layer.

Evaluation Example 4

The efficiency (candela per ampere (cd/A)) and device lifespan (h) of the light-emitting devices manufactured in Example 4 and Comparative Example 4 at a luminance of 1,280 candela per square meter (cd/m$^2$) were measured by utilizing Keithley SMU 236 and luminance meter PR650, and results thereof are shown in Table 5. In Table 5, the device lifespan ($T_{90}$) is a measure of the time (h) taken until the luminance declines to 90% of the initial luminance.

TABLE 5

| Light-emitting device | Efficiency (cd/A) | Device lifespan ($T_{90}$, h) |
|---|---|---|
| Example 4 | 81.9 | 132 |
| Comparative Example 4 | 62.2 | 14 |

According to Table 5, it was confirmed that the light-emitting device of Example 4 had increased efficiency and device lifespan compared to the light-emitting device of Comparative Example 4.

According to the one or more embodiments, by utilizing a metal oxide nanoparticle, exciton quenching of nanoparticles may be suppressed or reduced and charge balance may be improved. Accordingly, by utilizing the metal oxide nanoparticle, a light-emitting device having increased luminescence efficiency and lifespan and a high-quality electronic apparatus including the light-emitting device may be manufactured.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the drawings, it will be understood by those of ordinary skill in the art that one or more suitable changes in form and details may be made therein without departing from the spirit and scope as defined by the following claims and equivalents thereof.

What is claimed is:

1. A metal oxide nanoparticle represented by Formula 1:

$$(Zn)_x(M_1)_y(M_2)_zO \qquad \text{Formula 1}$$

wherein, in Formula 1, $M_1$ is Li, Be, Na, Mg, Al, K, Ca, Ti, V, Cr, Mn, Fe, Co, Ni, Cu, Ga, Ge, Rb, Sr, Zr, Nb, Mo, Ru, Rh, Pd, Ag, In, Sn, Sb, Ba, W, Y, or a combination thereof, $M_2$ is at least one selected from among metal elements of which an $M_2$-O oxide has p-type characteristics and in which a bond dissociation energy value of $M_2$-O is at least 250 KJ/mol, $M_1$ and $M_2$ are different from each other, the sum of x, y, and z is 1, x, y, and z are each not 0, and x is greater than or equal to z.

2. The metal oxide nanoparticle of claim 1, wherein $M_1$ is Mg, Ca, Zr, W, Li, Ti, Y, or Al.

3. The metal oxide nanoparticle of claim 1, wherein $M_2$ is Sn, Cu, or Ni.

4. The metal oxide nanoparticle of claim 1, wherein at least one of Conditions 1 to 3 is satisfied:

$$0.75 \leq x \leq 0.85 \quad \text{Condition 1}$$

$$0.10 \leq y \leq 0.20 \quad \text{Condition 2}$$

$$0.00 < z \leq 0.10. \quad \text{Condition 3}$$

5. The metal oxide nanoparticle of claim 1, wherein the metal oxide nanoparticle does not comprise a core-shell structure.

6. A nanocomposite comprising:

the metal oxide nanoparticle of claim 1; and at least one ligand bonded to a surface of the metal oxide nanoparticle.

7. The nanocomposite of claim 6, wherein the at least one ligand is poly(ethylene glycol)methyletherthiol, poly(ethylene glycol)2-mercaptoethylether acetic acid, thiol-PEG2-acid, or a combination thereof.

8. The nanocomposite of claim 6, wherein a photoluminescence quantum yield (PLQY) value of the nanocomposite is at most 10%.

9. The nanocomposite of claim 6, wherein a surface organic amount of the nanocomposite is about 16.9 wt % to about 30 wt %.

10. An ink composition comprising:

the nanocomposite of claim 6; and at least one ink solvent.

11. A method of preparing the ink composition of claim 10, the method comprising:

synthesizing the metal oxide nanoparticle with sol-gel processing;

precipitating and separating the metal oxide nanoparticle;

mixing the metal oxide nanoparticle with a first solvent comprising at least one ligand;

synthesizing the nanocomposite by reacting the metal oxide nanoparticle with the at least one ligand;

precipitating and separating the nanocomposite by mixing a solution comprising the nanocomposite with a second solvent that is a non-polar solvent; and preparing the ink composition by mixing the nanocomposite with the at least one ink solvent.

12. A light-emitting device comprising:

a first electrode;

a second electrode facing the first electrode; and an interlayer arranged between the first electrode and the second electrode and comprising an emission layer, wherein the interlayer further comprises an electron transport region arranged between the emission layer and the second electrode, and the electron transport region comprises the nanocomposite of claim 6.

13. The light-emitting device of claim 12, wherein the first electrode is an anode, the second electrode is a cathode, the interlayer further comprises a hole transport region arranged between the first electrode and the emission layer, the hole transport region comprises a hole injection layer, a hole transport layer, an emission auxiliary layer, an electron blocking layer, or a combination thereof, and the electron transport region comprises a hole blocking layer, an electron transport layer, an electron injection layer, an electron suppression layer, or a combination thereof.

14. The light-emitting device of claim 12, wherein the emission layer comprises quantum dots.

15. A method of manufacturing the light-emitting device of claim 12, the method comprising:

preparing an ink composition comprising the nanocomposite and at least one ink solvent; and forming the electron transport region comprising the nanocomposite by inkjet printing the ink composition.

16. An electronic apparatus comprising the light-emitting device of claim 12.

17. The electronic apparatus of claim 16, further comprising a thin-film transistor, wherein the thin-film transistor comprises a source electrode and a drain electrode, and the first electrode of the light-emitting device is electrically connected to the source electrode of the thin-film transistor or to the drain electrode of the thin-film transistor.

18. The electronic apparatus of claim 17, further comprising a color filter, a color conversion layer, a touch screen layer, a polarizing layer, or a combination thereof.

19. Electronic equipment comprising the light-emitting device of claim 12.

20. The electronic equipment of claim 19, wherein the electronic equipment is at least one selected from among a flat panel display, a curved display, a computer monitor, a medical monitor, a television, a billboard, an indoor or outdoor light and/or light for signal, a head-up display, a fully or partially transparent display, a flexible display, a rollable display, a foldable display, a stretchable display, a laser printer, a telephone, a portable phone, a tablet personal computer, a phablet, a personal digital assistant (PDA), a wearable device, a laptop computer, a digital camera, a camcorder, a viewfinder, a micro display, a three-dimensional (3D) display, a virtual reality or augmented reality display, a vehicle, a video wall with multiple displays tiled together, a theater or stadium screen, a phototherapy device, a signboard, and combinations thereof.

* * * * *